United States Patent
Kang et al.

(10) Patent No.: US 12,033,707 B2
(45) Date of Patent: Jul. 9, 2024

(54) NONVOLATILE MEMORY DEVICE AND OPERATION METHOD THEREOF

(71) Applicant: SAMSUNG ELECTRONICS CO., LTD., Suwon-si (KR)

(72) Inventors: Kyung-Min Kang, Suwon-si (KR); Dongku Kang, Suwon-si (KR); Su Chang Jeon, Suwon-si (KR); Won-Taeck Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/301,377

(22) Filed: Apr. 17, 2023

(65) Prior Publication Data

US 2023/0253059 A1  Aug. 10, 2023

Related U.S. Application Data

(63) Continuation of application No. 16/941,956, filed on Jul. 29, 2020, now Pat. No. 11,651,829, which is a continuation-in-part of application No. 16/692,161, filed on Nov. 22, 2019, now Pat. No. 11,625,302.

(30) Foreign Application Priority Data

Jun. 17, 2019   (KR) .................. 10-2019-0071718

(51) Int. Cl.
*G11C 16/06* (2006.01)
*G11C 16/08* (2006.01)
(Continued)

(52) U.S. Cl.
CPC .......... *G11C 16/3481* (2013.01); *G11C 16/08* (2013.01); *G11C 16/10* (2013.01); *G11C 16/28* (2013.01); *G11C 16/30* (2013.01)

(58) Field of Classification Search
CPC ............... G06F 12/0882; G06F 11/141; G06F 11/1068; G06F 11/3037; G06F 12/0873;
(Continued)

(56) References Cited

U.S. PATENT DOCUMENTS 7,349,260 B2   3/2008   Guterman
8,228,728 B1   7/2012   Yang et al.
(Continued)

FOREIGN PATENT DOCUMENTS

KR   10-2017-0061739   6/2017
KR   10-2019-0029056   3/2019

OTHER PUBLICATIONS

Office Action dated May 12, 2022 in corresponding U.S. Appl. No. 16/692,161.

*Primary Examiner* — Uyen Smet
(74) *Attorney, Agent, or Firm* — F. Chau & Associates, LLC

(57) ABSTRACT

A nonvolatile memory device includes a peripheral circuit region and a memory cell region vertically connected with the peripheral circuit region, the peripheral circuit region including at least one first metal pad, and the memory cell region including at least one second metal pad directly connected with the at least one first metal pad. A method of programming the nonvolatile memory device incudes: receiving a programming command, data for a plurality of pages, and an address corresponding to a selected word-line; programming the data for one of the pages to an unselected word-line; reading data of a previously programmed page from the selected word-line; and programming the data for the remaining pages and the data of the previously programmed page to the selected word-line.

20 Claims, 34 Drawing Sheets

(51) Int. Cl.
  *G11C 16/10*   (2006.01)
  *G11C 16/28*   (2006.01)
  *G11C 16/30*   (2006.01)
  *G11C 16/34*   (2006.01)

(58) Field of Classification Search
  CPC ............. G06F 11/1048; G06F 11/3058; G11C 11/4074; G11C 11/4085; G11C 11/409; G11C 11/5628; G11C 16/32; G11C 2211/5642; G11C 11/5642; G11C 16/08; G11C 16/10; G11C 16/26; G11C 16/0483; G11C 16/14
  See application file for complete search history.

(56) References Cited

U.S. PATENT DOCUMENTS

| | | | |
|---|---|---|---|
| 8,307,241 B2 | 11/2012 | Avila et al. | |
| 8,499,210 B2 | 7/2013 | Kim et al. | |
| 8,503,233 B2 | 8/2013 | Huang et al. | |
| 8,503,243 B2 | 8/2013 | Kim | |
| 8,861,269 B2 | 10/2014 | Chen et al. | |
| 8,867,273 B2 | 10/2014 | Izumi | |
| 9,223,692 B2 | 12/2015 | Kwak | |
| 9,460,799 B1* | 10/2016 | Costa | G11C 29/52 |
| 10,255,971 B2 | 4/2019 | Hara et al. | |
| 10,366,023 B2 | 7/2019 | Kim et al. | |
| 10,658,040 B2 | 5/2020 | Lim et al. | |
| 2004/0213031 A1* | 10/2004 | Hosono | G11C 16/28 365/145 |
| 2013/0097364 A1 | 4/2013 | Cho et al. | |
| 2014/0047163 A1 | 2/2014 | Kwak | |
| 2014/0254262 A1* | 9/2014 | Chen | G11C 16/3427 365/185.12 |
| 2018/0240515 A1* | 8/2018 | Shibata | G11C 16/3459 |
| 2019/0088312 A1* | 3/2019 | Shiino | G11C 11/5642 |
| 2020/0251443 A1 | 8/2020 | Kanakamedala et al. | |
| 2020/0359090 A1 | 12/2020 | Kang et al. | |

\* cited by examiner

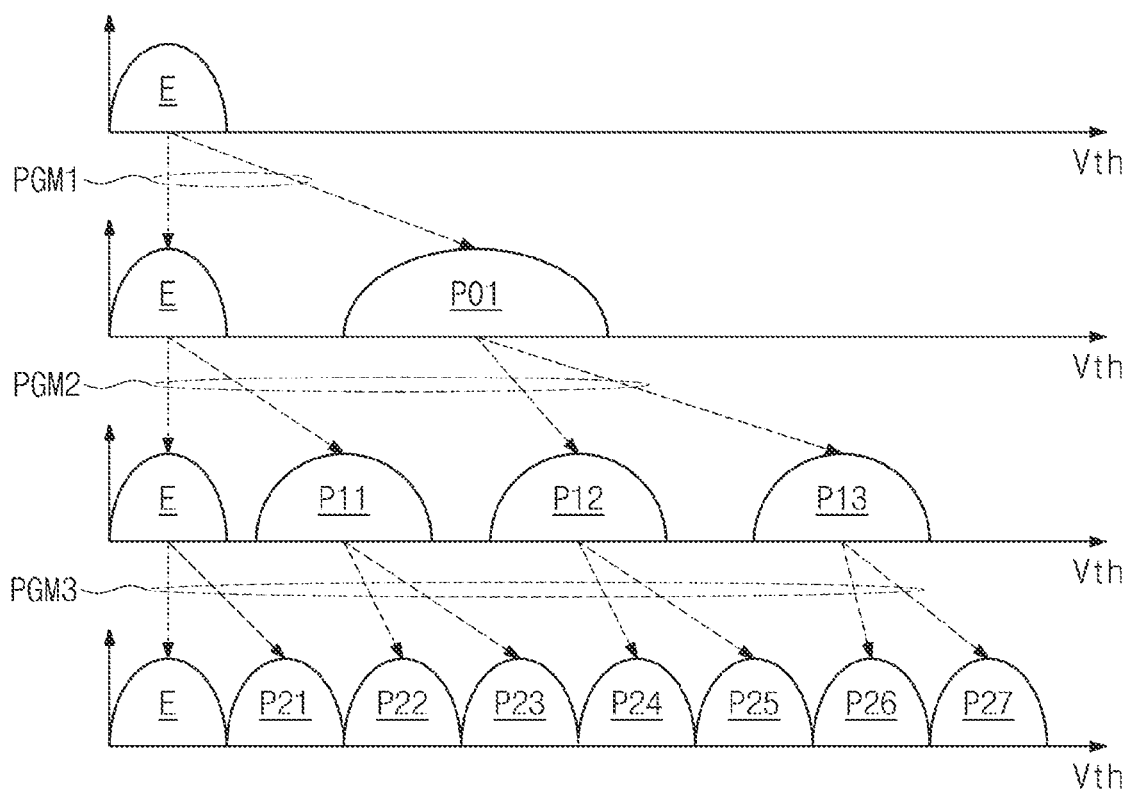

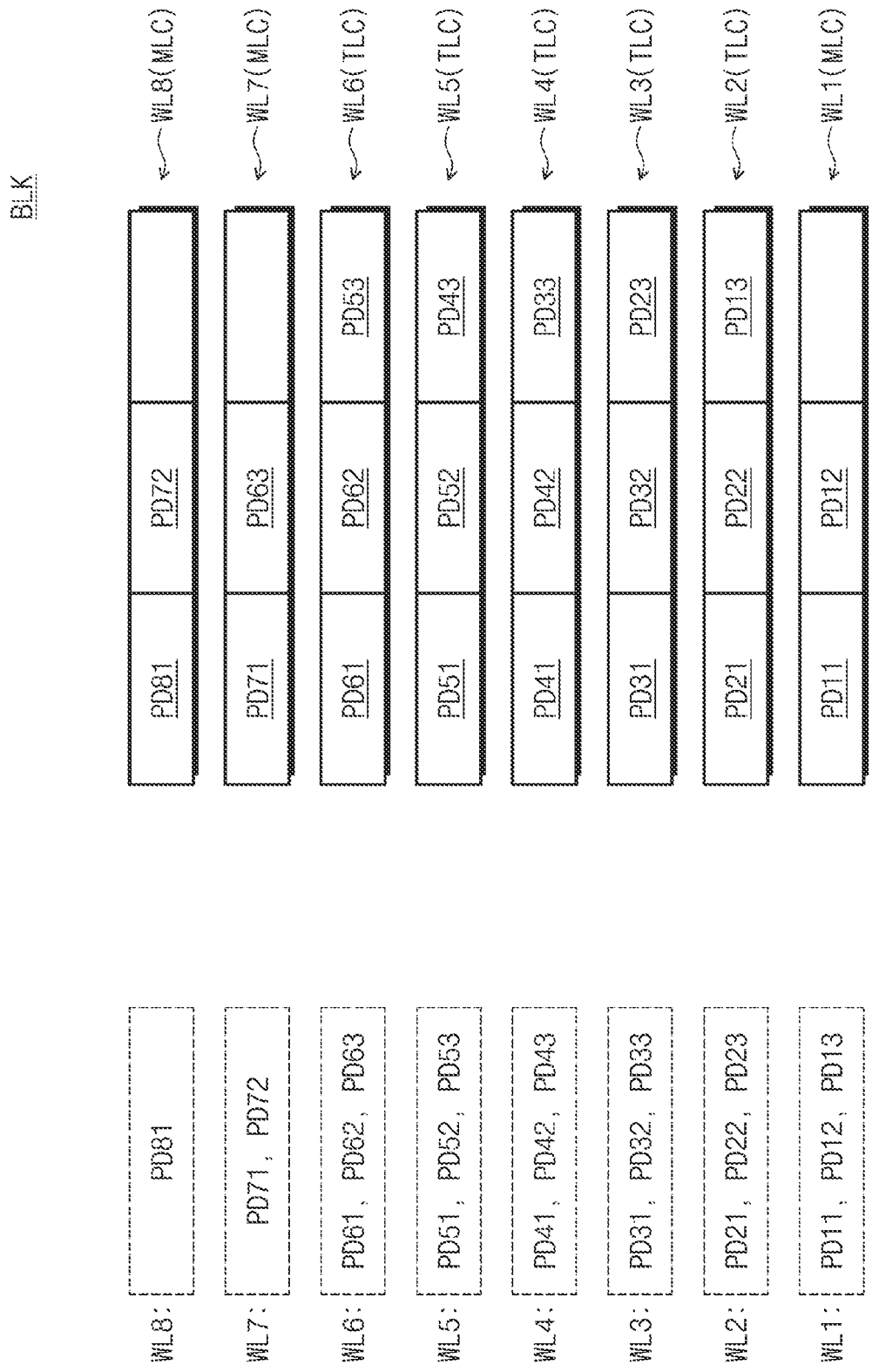

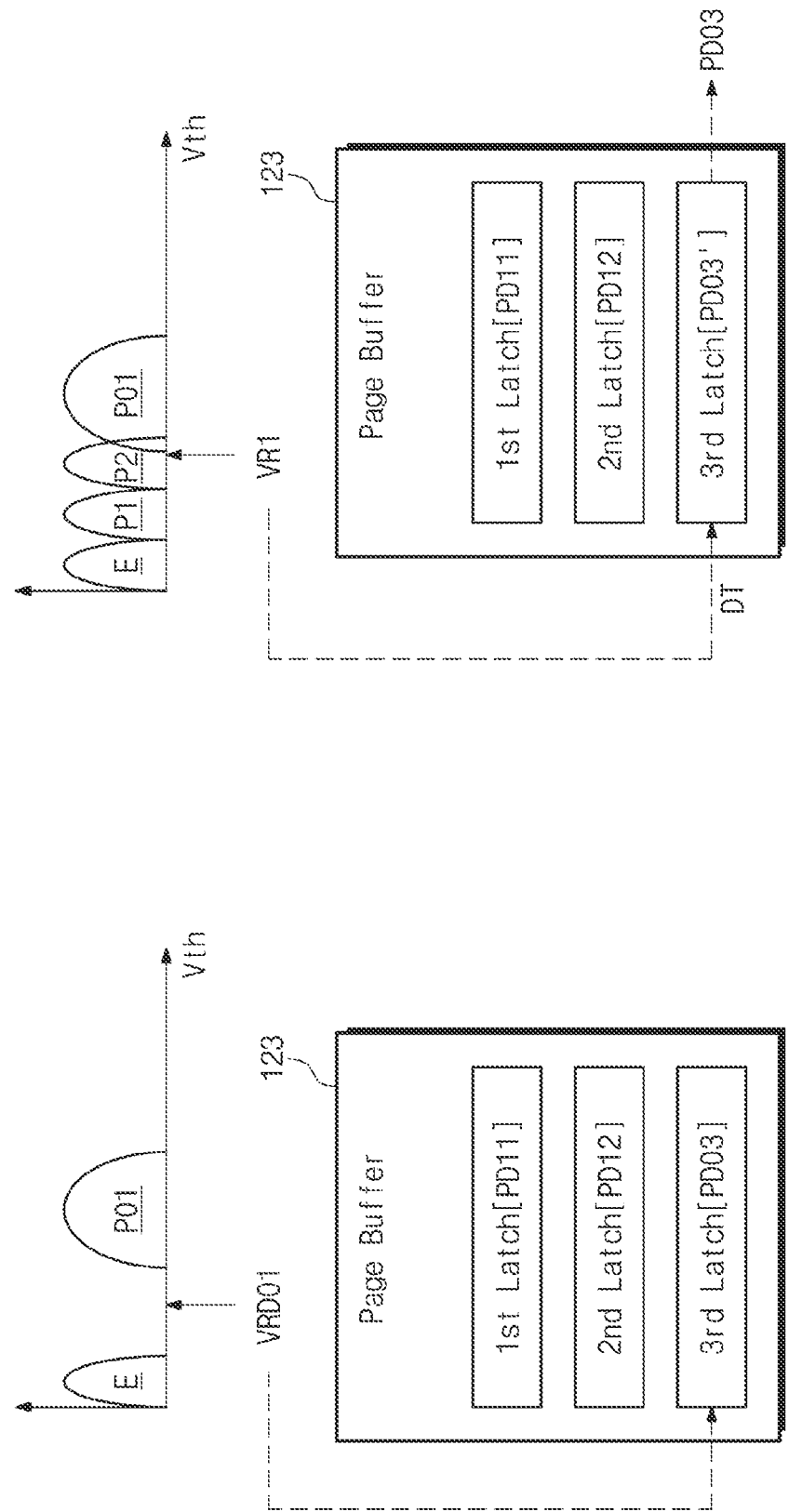

NONVOLATILE MEMORY DEVICE AND OPERATION METHOD THEREOF

CROSS-REFERENCE TO RELATED APPLICATION

This U.S. application is a continuation application of U.S. patent application Ser. No. 16/941,956 filed Jul. 29, 2020, which is a continuation-in-part (CIP) of U.S. patent application Ser. No. 16/692,161 filed on Nov. 22, 2019, which claims the benefit of and priority under 35 U.S.C. § 119 to Korean Patent Application No. 10-2019-0071718, filed on Jun. 17, 2019, in the Korean Intellectual Property Office, the disclosure of which is incorporated by reference in its entirety herein.

BACKGROUND

1. Technical Field

Embodiments of the inventive concept disclosed herein relate to a semiconductor memory, and more particularly, relate to a nonvolatile memory device and an operation method thereof.

2. Discussion of Related Art

A semiconductor memory device may be classified as a volatile memory device or a nonvolatile memory. A volatile memory requires power to maintain data stored therein. Examples of a volatile memory include as a static random access memory (SRAM) and a dynamic random access memory (DRAM). A nonvolatile memory device retains data stored therein even when a power is turned off. Examples of a nonvolatile memory device include a flash memory device, a phase-change RAM (PRAM), a magnetic RAM (MRAM), a resistive RAM (RRAM), and a ferroelectric RAM (FRAM).

The flash memory device performs a program operation for each page or for each wordline. In general, because a program voltage is a high voltage, when a program operation is performed on a selected wordline, a degradation due to capacitive coupling between wordlines) occurs in memory cells of a wordline adjacent to the selected wordline. The degradation of memory cells causes a decrease in the reliability of the flash memory device.

SUMMARY

At least one embodiments of the inventive concept provides a nonvolatile memory device having improving reliability and improved performance and an operation method of the nonvolatile memory device.

According to an exemplary embodiment of the inventive concept, a method of programming a nonvolatile memory device is provided. The memory device includes a peripheral circuit region and a memory cell region vertically connected with the peripheral circuit region. the peripheral circuit includes at least one first metal pad, and the memory cell region includes at least one second metal pad directly connected with the at least one first metal pad. The method includes: receiving a programming command, data for a plurality of pages, and an address corresponding to a selected word-line among a plurality of word-lines included in the memory cell region; programming the data for one of the plurality of pages to an unselected word-line among the plurality of word lines different from the selected word line reading data of a previously programmed page from the selected word-line; and programming, the data for remaining pages of the plurality of pages and the data of the previously programmed page to the selected word-line.

According to an exemplary embodiment of the inventive concept, a method of reading data from a nonvolatile memory device is provided. The memory device includes a peripheral circuit region and a memory cell region vertically connected with the peripheral circuit region. The peripheral circuit region includes at least one first metal pad, and the memory cell region includes at least one second metal pad directly connected with the at least one first metal pad. The method includes: receiving a read command and an address of a given page; determining whether the address of the given page corresponds to a certain page; performing a first read operation on a selected word-line associated with the address, among a plurality of word-lines in the memory cell region, when the address corresponds to the certain page; and perforating a second read operation on an un selected word-line different from the selected word-line, when the address does not correspond to the certain page.

According to an exemplary embodiment of the inventive concept, a memory system is provided. The memory system includes a nonvolatile memory device comprising a peripheral circuit region and a memory cell region vertically connected with the peripheral circuit, and memory controller configured to provide a programming command, data for a plurality of pages, and a write address to the nonvolatile memory device. The peripheral circuit region comprises a control circuit and at least one first metal pad, and the memory cell region comprises a memory cell array including a plurality of word lines, and at least one second metal pad directly connected with the at least one first metal pad. The control circuit is configured to receive the programming command and the write address from the memory controller. The control circuit is for programming the data for one of the pages to an unselected word-line among the plurality, of word lines different from a selected word line corresponding to the write address, reading data of a previously programmed page from the selected word-line, and programming the data for the remaining pages and the data of the previously programmed page to the selected word-line, in response to the programming command and the write address.

BRIEF DESCRIPTION OF THE FIGURES

The inventive concept will become apparent by describing in detail exemplary embodiments thereof with reference to the accompanying drawings.

FIGS. 5A to 5C are diagrams for describing a program operation of a nonvolatile memory device according to an exemplary embodiment of the inventive concept.

FIGS. 9A to 9C are diagrams for describing a program operation of a nonvolatile memory device of FIG. 1 according to an exemplary embodiment of the inventive concept.

FIGS. 13A and 13B are diagrams for describing operation S140 of FIG. 6 in detail according to an exemplary embodiment of the inventive concept.

DETAILED DESCRIPTION

Figure 1:
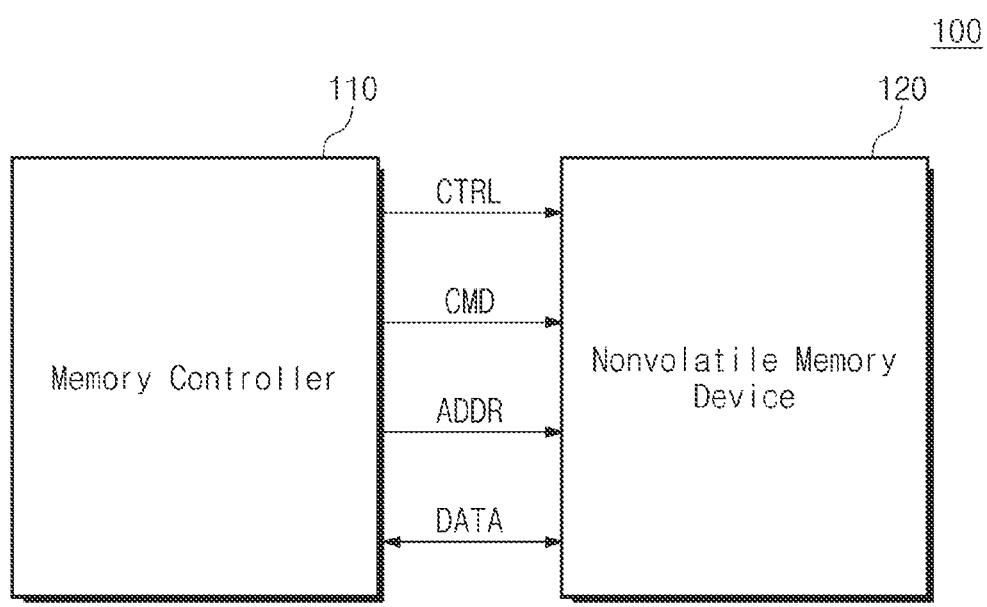
FIG. 1 is a block diagram illustrating a storage device according to an exemplary embodiment of the inventive concept.

Hereinafter, exemplary embodiments of the inventive concept described in conjunction with accompanying drawings will be described. Below, details, such as detailed configurations and structures are provided to aid a reader in understanding embodiments of the inventive concept. Therefore, embodiments described herein may be variously changed or modified without departing from embodiments of the inventive concept. The same reference numeral indicates the same part through the accompanying drawings.

FIG. 1 is a block diagram illustrating a storage device according to an exemplary embodiment of the inventive concept. Referring to FIG. 1, a storage device 100 includes a memory controller 110 and a nonvolatile memory device 120. The storage device 100 may be a high-capacity storage device included in electronic devices such as a personal computer (PC), a server, a workstation, a smartphone, a tablet PC, and a wearable device.

The memory controller 110 may store data "DATA" in the nonvolatile memory device 120 or may read the data "DATA" stored in the nonvolatile memory device 120. For example, the memory controller 110 may provide the nonvolatile memory device 120 with various signals (e.g., a control signal CTRL, a command CMD, and an address ADDR) for controlling the nonvolatile memory device 120.

The nonvolatile memory device 120 may operate in response to various signals received from the memory controller 110. For example, under control of the memory controller 110, the nonvolatile memory device 120 may store the data "DATA" provided from the memory controller 110 or may provide the data "DATA" stored therein to the memory controller 110.

In an exemplary embodiment, the nonvolatile memory device 120 may include a NAND flash memory. However, the inventive concept is not limited thereto. For example, the nonvolatile memory device 120 may be implemented with various nonvolatile memory devices such as a PRAM, an MRAM, an RRAM, and an FRAM.

The nonvolatile memory device 120 according to an embodiment of the inventive concept may support a high-speed program operation. For example, the nonvolatile memory device 120 may receive a plurality of pages corresponding to one selected wordline from the memory controller 110 and may perform the high-speed program operation on the plurality of pages. The high-speed program operation may indicate a series of operations that are performed through one program sequence. In an exemplary embodiment, the term "one program sequence" may be used to mean that a series of operations are performed without explicit control or interference from the memory controller 110. In an exemplary embodiment, a busy signal of the nonvolatile memory device 120 maintains a busy state during one program sequence.

In an exemplary embodiment, the plurality of pages may indicate data corresponding to one wordline and may be received from the memory controller 110 through one command sequence. The term "one command sequence" may be used to mean that a series of signals are provided through signal lines for the purpose of controlling an operation of the nonvolatile memory device 120 or exchanging certain information.

In an exemplary embodiment of the inventive concept, the nonvolatile memory device 120 programs a plurality of pages of data that are intended to be programmed to pages of memory connected to a selected wordline by programming some of the pages of data to the selected wordline and the rest of the pages of data to a wordline different from the selected wordline (e.g., an unselected wordline). The above-described program operation of the nonvolatile memory device 120 may reduce degradation of memory cells. A configuration and an operation method of the nonvolatile memory device 120 according to an exemplary embodiment of the inventive concept will be described with reference to accompanying drawings.

Figure 2:
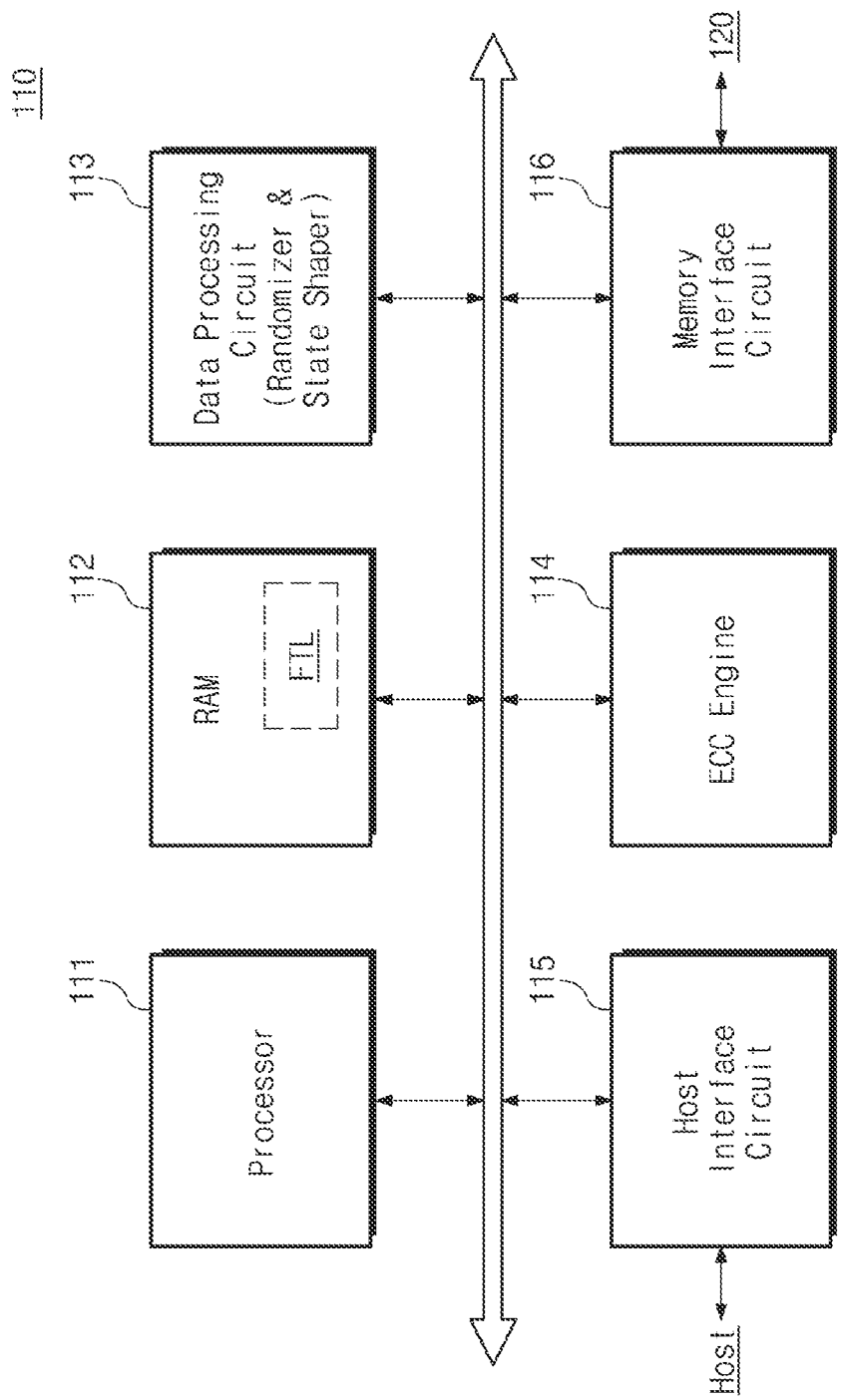
FIG. 2 is a block diagram illustrating a memory controller of FIG. 1.

FIG. 2 is a block diagram illustrating a memory controller of FIG. 1 according to an exemplary embodiment of the inventive concept. Referring to FIGS. 1 and 2, the memory controller 110 includes a processor 111, a RAM 112, a data processing circuit 113 (e.g., a randomizer and state shaper), an error correction code engine 114, a host interface circuit 115, and a memory interface circuit 116.

The processor 111 may control overall operations of the memory controller 110. The RAM 112 may be used as a working memory, a buffer memory, or a cache memory of the memory controller 110. Various information, data, or instructions that are stored in the RAM 112 may be executed or managed by the processor 111.

In an exemplary embodiment, the RAM 112 may include a flash translation layer FTL. The flash translation layer FTL may perform an interface role between a host and the nonvolatile memory device 120. For example, the flash translation layer FTL may translate a logical address managed by the host into a physical address identifiable by the nonvolatile memory device 120 (i.e., may perform an address translation operation). That is, a physical storage space of the nonvolatile memory device 120 may be managed by the flash translation layer FTL. In an exemplary embodiment, the flash translation layer FTL may be stored in the RAM 112, and the flash translation layer FTL stored in the RAM 112 may be executed by the processor 111.

The data processing circuit 113 may be configured to process the data "DATA" to be stored in the nonvolatile memory device 120 or the data "DATA" read from the nonvolatile memory device 120. For example, the data processing circuit 113 may be configured to perform a randomizing operation or a state shaping operation. The randomizing operation may indicate an operation of processing data such that data to be stored in the nonvolatile memory device 120 forms a uniform distribution at a selected wordline of the nonvolatile memory device 120. The state shaping operation may indicate an operation of processing data to be stored in the nonvolatile memory device 120 to decrease the number of memory cells forming a certain program state (e.g., the uppermost program state) among a plurality of program states formed with regard to the selected wordline of the nonvolatile memory device 120.

In an exemplary embodiment, the data processing circuit 113 may perform one of the randomizing operation and the state shaping operation. Alternatively, the data processing circuit 113 may perform the state shaping operation after performing the randomizing operation or may perform the randomizing operation after performing the state shaping operation.

The error correction code (ECC) engine 114 may detect an error of the data "DATA" read from the nonvolatile memory device 120 and may correct the detected error. For example, the ECC engine 114 may generate a first error correction code of first data to be stored in the nonvolatile memory device 120, and the first error correction code may be stored in the nonvolatile memory device 120 together with the first data. When the first data are read from the nonvolatile memory device 120, the ECC engine 114 may detect and correct an error of the first data read from the nonvolatile memory device 120 by using the first error correction code associated with the first data.

The host interface circuit 115 may support communication between the memory controller 110 and the host. In an exemplary embodiment, the host interface circuit 115 may support at least one of various interfaces such as a universal serial bus (USB) interface, a small computer system interface (SCSI), a peripheral component interconnection (PCI) express (PCIe) interface, an advanced technology attachment (ATA) interface, a parallel ATA (PATA) interface, a serial ATA (SATA) interface, a serial attached SCSI (SAS) interface, an universal flash storage (UFS) interface, and a nonvolatile memory express (NVMe) interface.

The memory interface circuit 116 may support communication between the memory controller 110 and the nonvolatile memory device 120. In an exemplary embodiment, the memory interface circuit 116 may support a NAND interface.

Figure 3:
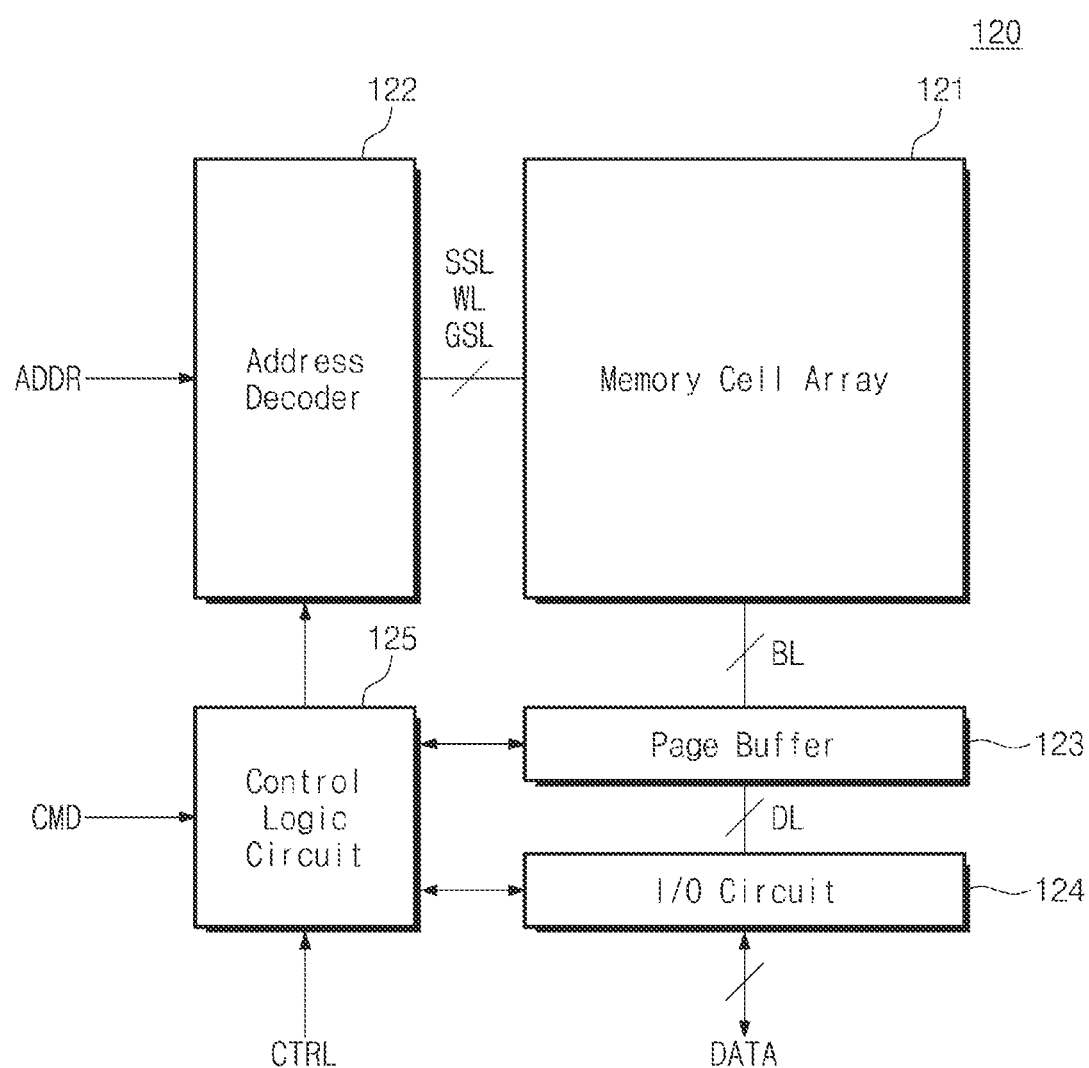
FIG. 3 is a block diagram illustrating a nonvolatile memory device of FIG. 1.

FIG. 3 is a block diagram illustrating a nonvolatile memory device of FIG. 1 according to an exemplary embodiment of the inventive concept. Below, for convenience of description, it is assumed that the nonvolatile memory device 120 is a NAND flash memory device. However, the inventive concept is not limited thereto.

In an exemplary embodiment, the nonvolatile memory device 120 includes a three-dimensional (3) memory array. The 3D memory array may be monolithically formed in one or more physical level(s) of a memory cell array having an active area arranged on a circuit related on a silicon substrate and an operation of memory cells. The circuit related to an operation of memory cells may be located in a substrate or on a substrate. The term "monolithic" means that layers of each level of the array are directly deposited on the layers of each underlying level of the array. In an exemplary embodiment, the 3-dimensional memory array has a vertical-directional characteristic, and may include vertical NAND strings in which at least one memory cell is located on another memory cell. The at least one memory cell may comprise a charge trap layer. Each vertical NAND string may include at least one select transistor located over memory cells. The at least one select transistor having the same structure with the memory cells and being formed monolithically together with the memory cells.

Referring to FIGS. 1 and 3, the nonvolatile memory device 120 includes a memory cell array 121, an address decoder 122 (e.g., a decoder circuit), a page buffer 123, an input/output circuit 124, and a control logic circuit 125. The memory cell array 121 may include a plurality of memory blocks. Each of the plurality of memory blocks will be more fully described with reference to FIG. 4.

The address decoder 122 may be connected with the memory cell array 121 through string selection lines SSL, wordlines WL, and ground selection lines GSL. The address decoder 122 may receive the address ADDR from the memory controller 110. The address decoder 122 may decode the address ADDR and may control voltages of the string selection lines SSL, the wordlines WL, and the ground selection lines GSL based on a result of the decoding.

The page buffer 123 may be connected with the memory cell array 121 through bitlines BL. The page buffer 123 may be configured to temporarily hold data to be stored in the memory cell array 121 or data read from the memory cell array 121.

The input/output circuit 124 may provide the data "DATA" received from the memory controller 110 to the page buffer 123 through data lines DL or may provide the data "DATA" received from the page buffer 123 through the data lines DL to the memory controller 110. In an exemplary embodiment, the input/output circuit 124 may exchange the data "DATA" with the memory controller 110 in synchronization with a data strobe signal (DQS) (not illustrated). In an exemplary embodiment, information such as the command CMD or the address ADDR illustrated in FIG. 3 may be received through the input/output circuit 124 and may be provided to circuits respectively corresponding to the pieces of information thus received.

The control logic circuit 125 may control overall operations of the nonvolatile memory device 120. For example, the control logic circuit 125 may control the respective components of the nonvolatile memory device 120 based on the command CMD or the control signal CTRL from the memory controller 110 such that the nonvolatile memory device 120 performs various operations (e.g., a program operation, a read operation, and an erase operation).

Figure 4:
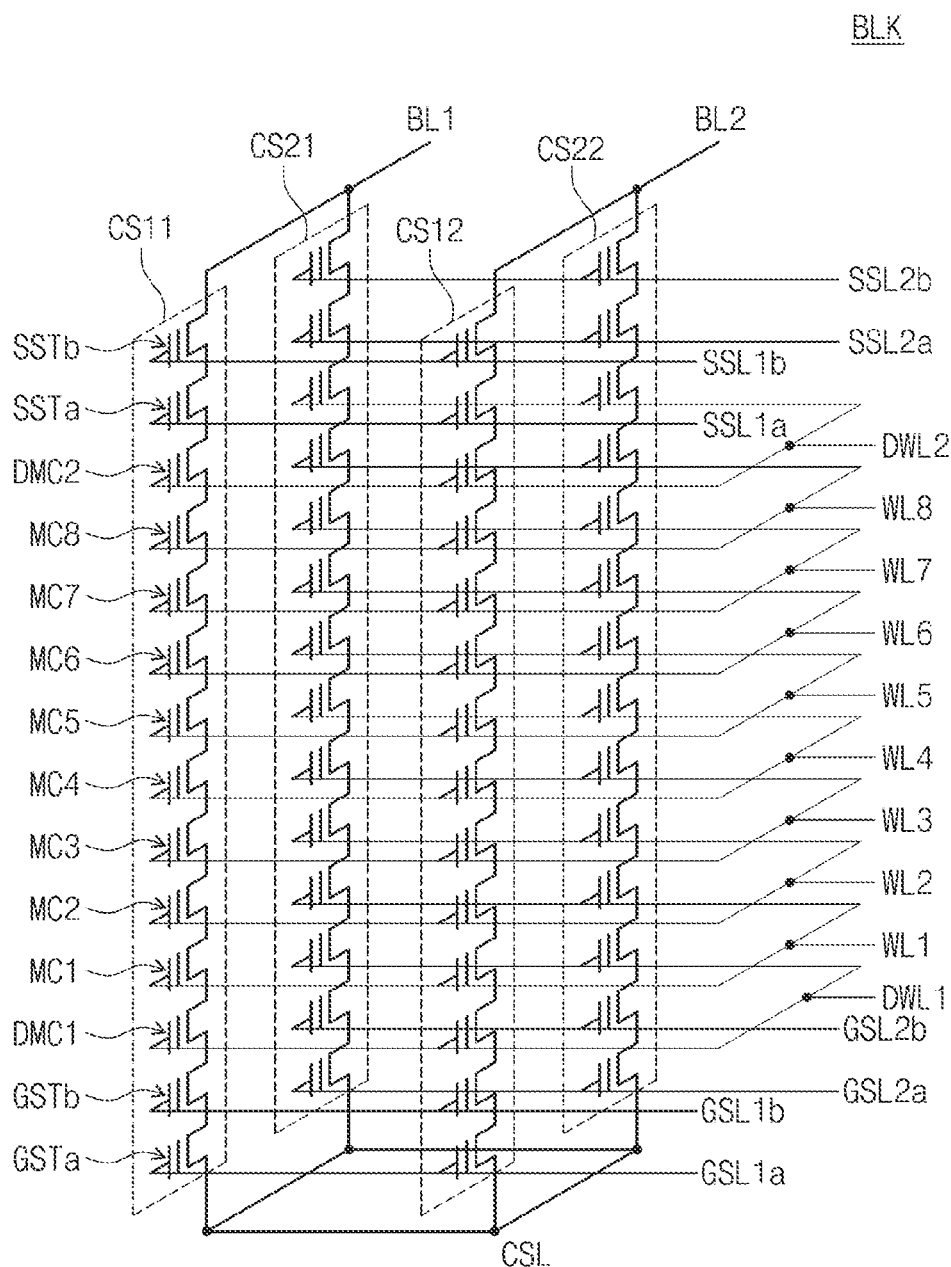
FIG. 4 is a circuit diagram illustrating one memory block of a plurality of memory blocks included in a memory cell array of FIG. 3.

FIG. 4 is a circuit diagram illustrating one memory block of a plurality of memory blocks included in a memory cell array of FIG. 3 according to an exemplary embodiment of the inventive concept. One memory block BLK will be described with reference to FIG. 4, but the inventive concept is not limited thereto. A plurality of memory blocks included in the memory cell array 121 may have a structure that is the same as or similar to the structure of the memory block BLK illustrated in FIG. 4.

Referring to FIGS. 3 and 4, the memory block BLK may include a plurality of cell strings CS11, CS12, CS21, and CS22. The plurality of cell strings CS11, CS12, CS21, and CS22 may be arranged in a row direction and a column direction.

Cell strings positioned at the same column from among the plurality of cell strings CS11, CS12, CS21, and CS22 may be connected with the same bitline. For example, the cell strings CS11 and CS21 may be connected with a first bitline BL1, and the cell strings CS12 and CS22 may be connected with a second bitline BL2.

Each of the plurality of cell strings CS11, CS12, CS21, and CS22 may include a plurality of cell transistors. Each of the plurality of cell transistors may include a charge trap flash (CTF) memory cell. The plurality of cell transistors may be stacked in a height direction that is perpendicular to a plane (e.g., a semiconductor substrate (not illustrated)) defined by the row direction and the column direction.

The plurality of cell transistors may be connected in series between a relevant bitline (e.g., BL1 or BL2) and a common source line CSL. For example, the plurality of cell transistors may include string selection transistors SSTa and SSTb, dummy memory cells DMC1 and DMC2, memory cells MC1 to MC8, and ground selection transistors GSTa and GSTb. The serially-connected string selection transistors SSTa and SSTb may be provided between the serially-connected memory cells MC1 to MC8 and the relevant bitline (e.g., BL1 and BL2). The serially-connected ground selection transistors GSTa and GSTb may be provided between the serially-connected memory cells MC1 to MC8 and the common source line CSL.

In an exemplary embodiment, the second dummy memory cell DMC2 may be provided between the serially-connected string selection transistors SSTa and SSTb and the serially-connected memory cells MC1 to MC8, and the first dummy memory cell DMC1 may be provided between the serially-connected memory cells MC1 to MC8 and the serially-connected ground selection transistors GSTa and GSTb.

In the plurality of cell strings CS11, CS12, CS21, and CS22, memory cells positioned at the same height from among the memory cells MC1 to MC8 may share the same wordline. For example, the first memory cells MC1 of the plurality of cell strings CS11, CS12, CS21, and CS22 may be positioned at the same height from the substrate (not illustrated) and may share a first wordline WL1. The second memory cells MC2 of the plurality of cell strings CS11, CS12, CS21, and CS22 may be positioned at the same height from the substrate (not illustrated) and may share a second wordline WL2. As in the above description, i-th memory cells MCi (i being one of 3 to 8) of the plurality of cell strings CS11, CS12, CS21, and CS22 may be positioned at the same height from the substrate (not illustrated) and may share an i-th wordline WLi.

In the plurality of cell strings CS11, CS12, CS21, and CS22, the dummy memory cells DMC1 or DMC2 positioned at the same height may share the same dummy wordline. For example, the first dummy memory cells DMC1 of the plurality of cell strings CS11, CS12, CS21, and CS22 may share a first dummy wordline DWL1, and the second dummy memory cells DMC2 of the plurality of cell strings CS11, CS12, CS21, and CS22 may share a second dummy wordline DWL2.

In the plurality of cell strings CS11, CS12, CS21, and CS22, string selection transistors positioned at the same height and the same row from among the string selection transistors SSTa and SSTb may be connected with the same string selection line. For example, the string selection transistors SSTb of the cell strings CS11 and CS12 may be connected with a string selection line SSL1b, and the string selection transistors SSTa of the cell strings CS11 and CS12 may be connected with a string selection line SSL1a. The string selection transistors SSTb of the cell strings CS21 and CS22 may be connected with a string selection line SSL2b, and the string selection transistors SSTa of the cell strings CS21 and CS22 may be connected with a string selection line SSL2a.

Although not illustrated in the drawings, string selection transistors positioned at the same row from among the string selection transistors SSTa and SSTb of the plurality of cell strings CS11, CS12, CS21, and CS22 may share the same string selection line. For example, the string selection transistors SSTa and SSTb of the cell strings CS11 and CS12 may share a first string selection line, and the string selection transistors SSTa and SSTb of the cell strings CS21 and CS22 may share a second string selection line different from the first string selection line.

Ground selection transistors positioned at the same height and the same row from among the ground selection transistors GSTa and GSTb of the plurality of cell strings CS11, CS12, CS21, and CS22 may be connected with the same ground selection line. For example, the ground selection transistors GSTb of the cell strings CS11 and CS12 may be connected with a ground selection line GSL1b, and the ground selection transistors GSTa of the cell strings CS11 and CS12 may be connected with a ground selection line GSL1a. The ground selection transistors GSTb of the cell strings CS21 and CS22 may be connected with a ground selection line GSL2b, and the ground selection transistors GSTa of the cell strings CS21 and CS22 may be connected with a ground selection line GSL2a.

Although not illustrated in the drawings, the ground selection transistors GSTa and GSTb of the plurality of cell strings CS11, CS12, CS21, and CS22 may share the same ground selection line. Alternatively, in the plurality of cell strings CS11, CS12, CS21, and CS22, ground selection transistors positioned at the same height from among the ground selection transistors GSTa and GSTb may share the same ground selection line. Alternatively, ground selection transistors positioned at the same row from among the ground selection transistors GSTa and GSTb of the plurality of cell strings CS11, CS12, CS21, and CS22 may share the same ground selection line.

In an exemplary embodiment, although not illustrated in the drawings, each of the plurality of cell strings CS11, CS12, CS21, and CS22 of the memory block BLK may further include an erase control transistor (ECT). The erase control transistors of the plurality of cell strings CS11, CS12, CS21, and CS22 may be positioned at the same height from the substrate and may be connected with the same erase control line (ECL). For example, in each of the plurality of cell strings CS11, CS12, CS21, and CS22, the erase control transistor may be interposed between the ground selection transistor GSTa and the common source line CSL. Alternatively, in each of the plurality of cell strings CS11, CS12, CS21, and CS22, the erase control transistor may be interposed between the relevant bitline BL1 or BL2 and the string selection transistor SSTb. However, the inventive concept is not limited thereto.

The inventive concept is not limited to the memory block BLK illustrated in FIG. 4. For example, the number of cell strings may be increased or decreased, and the number of rows of cell strings and the number of columns of cell strings may be increased or decreased depending on the change in the number of cell strings. Also, in the memory block BLK, the number of cell transistors (e.g., GST, MC, DMC, and SST) may be increased or decreased, and the height of the memory block BLK may be increased or decreased depending on the number of cell transistors (e.g., GST, MC, DMC, and SST). In addition, as the number of cell transistors increases or decreases, the number of lines (e.g., GSL, WL, DWL, and SSL) connected with the cell transistors may increase or decrease.

Below, for convenience of description, it is assumed that each of a plurality of memory cells included in the nonvolatile memory device 120 is a triple level cell (TLC) that stores 3-bit data. That is, memory cells connected with one wordline may store three pages. In this case, a page may indicate data of a certain unit. Three pages that are stored in memory cells connected with one wordline may include a least significant bit (LSB) page, a center significant bit (CSB) page, and a most significant bit (MSB) page.

Below, for convenience of description, an operation of programming memory cells connected with a wordline is referred to as a "program operation for (or associated with) a wordline". Also, an operation of reading data or a page from memory cells connected with a wordline is referred to as a "read operation for (or associated with) a wordline".

That is, the nonvolatile memory device 120 may store three pages in memory cells connected with one wordline by performing one "program operation for a wordline" based on three pages (e.g., three pages of data). Alternatively, the nonvolatile memory device 120 may read at least one of a plurality of pages stored in memory cells connected with one wordline by performing a read operation on one wordline.

Below, for convenience of description, a wordline corresponding to an address received from the memory controller 110 is referred to as a "selected wordline". In other words, the "selected wordline" may indicate a wordline that corresponds to an address received from the memory controller 110.

Figure 5A:
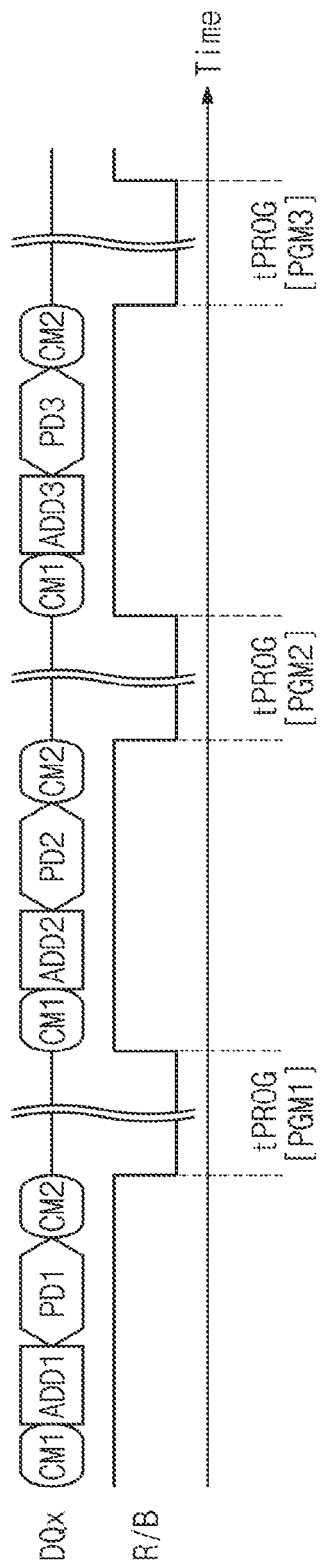

FIGS. 5A to 5C are diagrams for describing a program operation of a nonvolatile memory device. A shadow program operation of a nonvolatile memory device will be described with reference to FIGS. 5A to 5C. Referring to FIGS. 5A to 5C, the nonvolatile memory device receives a command, an address, and one page (e.g., one page of data) from a memory controller and programs the page at a wordline corresponding to the address in response to the command. In the specification, below, the expression "the programming (or storing) of pages at a wordline" may mean the expression "the programming (or storing) of pages in memory cells of a wordline", and the expressions may be interchangeably used. Also, the expression "the reading of pages from a wordline" may mean the expression "the reading of pages from memory cells of a wordline", and the expressions may be interchangeably used.

For example, the nonvolatile memory device may receive a first command CM1, a first address ADD1, a first page PD1, and a second command CM2 from the memory controller. The first and second commands CM1 and CM2 may be a command set for the shadow program operation. For example, if the control logic circuit 125 receives the first command CM1 at a first time and then receives the command CM2 at a second time certain period afterwards, the control logic circuit 125 can conclude that a shadow program operation is to be performed. Alternatively, the control logic circuit 125 may conclude that a shadow operation is to be performed when it receives the first command at the first time, the second command at the second time, and an address and data between the first and second times. The first address ADD1 may indicate a physical address for the first page PD1, that is, a selected wordline. The first page PD1 may indicate one page. In an exemplary embodiment, as described above, three pages may be stored at one wordline. That is, one page may indicate one of three pages (e.g., an LSB page, a CSB page, and an MSB page) stored at one wordline. In an embodiment, the first address ADDR or one of the commands CM1 and CM2 indicate which of the three pages.

After the first command CM1, the first address ADD1, the first page PD1, and the second command CM2 are received, during a program time tPROG, the nonvolatile memory device performs a first program operation PGM1 on the selected wordline. For example, as illustrated in FIG. 5B, the first program operation PGM1 may indicate a program operation that is performed based on the first page PD1 such that each of memory cells having an erase state "E" from among memory cells of the selected wordline have one of the erase state "E" and a program state P01.

Afterwards, the nonvolatile memory device may receive the first command CM1, a second address ADD2, a second page PD2, and the second command CM2. The nonvolatile memory device may perform a second program operation PGM2 during the program time tPROG in response to the received signals. As illustrated in FIG. 5B, the second program operation PGM2 may indicate a program operation that is performed based on the first and second pages PD1 and PD2 such that each of memory cells having the erase state "E" from among the memory cells of the selected wordline has one of the erase state "E" and a program state P11 and each of memory cells of the program state P01 has one of program states P12 and P13. That is, after the second program operation PGM2 is completed, the memory cells of the selected wordline may store the first and second pages PD1 and PD2.

Afterwards, the nonvolatile memory device may receive the first command CM1, a third address ADDS, a third page PD3, and the second command CM2. The nonvolatile memory device may perform a third program operation PGM3 during the program time tPROG in response to the received signals. As illustrated in FIG. 5B, the third program operation PGM3 may indicate a program operation that is performed based on the first, second, and third pages PD1, PD2, and PD3 such that each of memory cells having the erase state "E" has one of the erase state "E" and a program state P21, each of memory cells having the program state P11 has one of a program state P22 and a program state P23, each of memory cells having the program state P12 has one of a program state P24 and a program state P25, and each of memory cells having the program state P13 has one of a program state P26 and a program state P27.

In an exemplary embodiment, when a program operation is performed on the selected wordline, memory cells connected with wordline(s) adjacent to the selected wordline may degrade due to a capacitive coupling that is generated when a program voltage of a high voltage is applied to the selected wordline. To prevent the degradation of memory cells, the nonvolatile memory device may perform program operations on a plurality of wordlines in a program scheme (or order) illustrated in FIG. 5C. For example, the nonvolatile memory device may perform the first program operation PGM1 on the first wordline WL1. Afterwards, the nonvolatile memory device may sequentially perform program operations in the following order: the first program operation PGM1 for the second wordline WL2, the second program operation PGM2 for the first wordline WL1, the first program operation PGM1 for a third wordline WL3, the second program operation PGM2 for the second wordline WL2, and the third program operation PGM3 for the first wordline WL1. When the third program operation PGM3 for the first wordline WL1 is completed, each of memory cells connected with the first wordline WL1 may store 3-bit data.

As described above, the degradation of memory cells may decrease by controlling the order of performing program operations associated with a plurality of wordlines. In an exemplary embodiment, a program order of a plurality of wordlines may be designated by an address (e.g., ADD1, ADD2, and ADDS) provided from the memory controller. That is, the memory controller may provide the nonvolatile memory device with an address corresponding to a wordline targeted for a program operation, based on the program order described above.

As described above, the nonvolatile memory device may receive one page and an address and may program the page at a wordline (i.e., a selected wordline) corresponding to the address; afterwards, the nonvolatile memory device may receive a different page and a different address and may program the different page at a wordline (i.e., a different selected wordline) corresponding to the different address.

In other words, the nonvolatile memory device performs a page receiving and program operation (e.g., PGM1, PGM2, or PGM3), in the unit of page. In detail, as illustrated in FIG. 5C, at least six program sequences may be required to completely store three pages at the first wordline WL1. That is, in the shadow program scheme, because a page receiving and program operation is repeated in the unit of page, the performance of the nonvolatile memory device may decrease.

Figure 6:
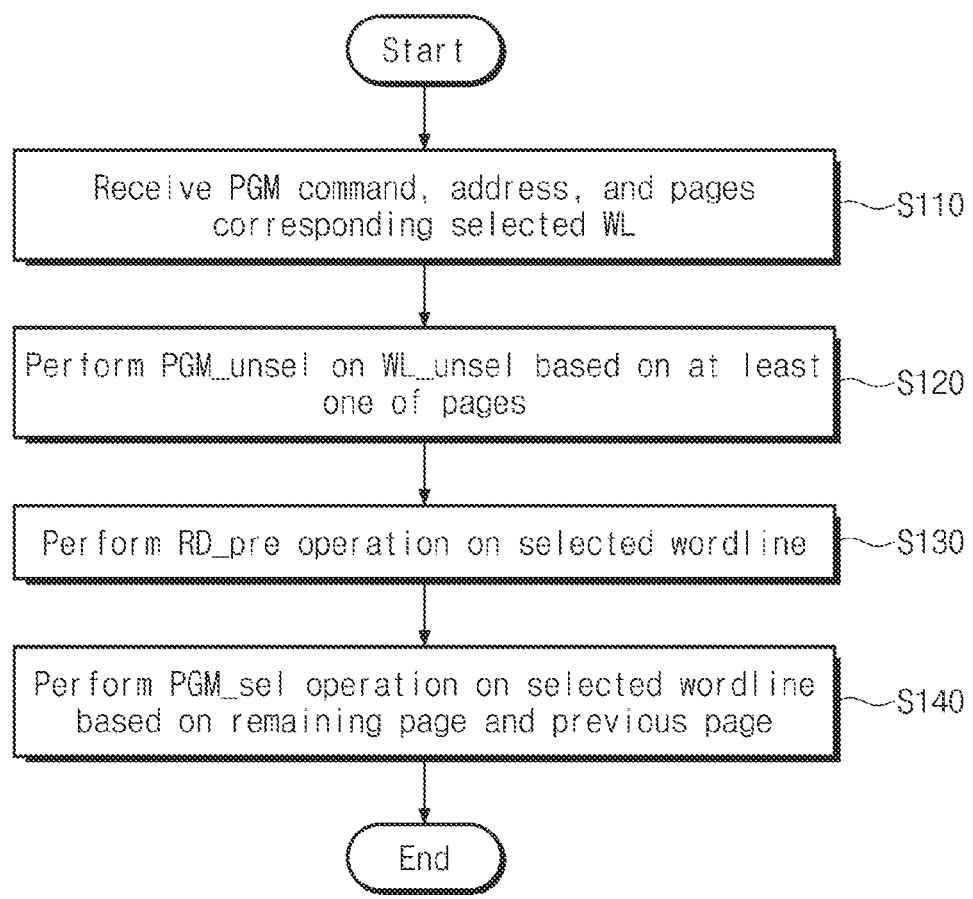
FIG. 6 is a flowchart illustrating an operation of a nonvolatile memory device of FIG. 1 according to an exemplary embodiment of the inventive concept.

FIG. 6 is a flowchart illustrating an operation of a nonvolatile memory device of FIG. 1. Referring to FIGS. 1 and 6, in operation S110, the nonvolatile memory device 120 receives a program command, an address, and a plurality of pages corresponding to a selected wordline. In an exemplary embodiment, the nonvolatile memory device 120 may receive three pages. The plurality of pages thus received may be data corresponding to the selected wordline (or one wordline). That is, the addresses that are received through the same command sequence with regard to the plurality of pages may correspond to the selected wordline (or one wordline).

In an exemplary embodiment, operation S110 is performed through one command sequence. One command sequence may indicate a set of signals that are received from the memory controller 110 for the nonvolatile memory device 120 to perform a certain operation. That is, the nonvolatile memory device 120 may perform a relevant operation (e.g., a program operation, a read operation, or an erase operation) based on information received through one command sequence. Operation S110 will be more fully described with reference to FIG. 7A.

In operation S120, the nonvolatile memory device 120 performs a program operation for an unselected wordline based on at least one page of the plurality of pages. The program operation for an unselected wordline is referred to as an "unselection program operation PGM_unsel". For example, the nonvolatile memory device 120 may receive three pages corresponding to a selected wordline. The nonvolatile memory device 120 programs at least one of the three pages to an unselected wordline different from the selected wordline.

In an exemplary embodiment, the unselected wordline is a wordline that does not correspond to the address received in operation S110. The unselected wordline may be an upper wordline or a lower wordline, which is adjacent to the selected wordline. Alternatively, the unselected wordline may be a wordline that is physically spaced from the selected wordline. In an embodiment, the address decoder 122 determines the address of the unselected wordline by determining whether the address received in operation S110 corresponds to an address of a last wordline of a memory block associated with the received address. For example, if the received address does not correspond to the last address, the address decoder 122 may generate the address of the unselected wordline by adding a predetermined value (e.g., 1, 2, etc.) to the received address or by subtracting the predetermined value from the received address, and otherwise the address decoder 122 may generate the address of the unselected wordline by setting it to the address of the last wordline.

In operation S130, the nonvolatile memory device 120 performs a read operation on the selected wordline, i.e., a previous page read operation RD_pre. For example, in the nonvolatile memory device 120, a selected wordline associated with a current program operation may be an unselected wordline associated with a previous program operation. That is, in the previous program operation of the nonvolatile memory device 120, at least one page may be programmed at a wordline that is selected for a current program operation.

In other words, a selected wordline associated with a current program operation may be in a state where at least one page is stored. In this case, the at least one page stored at the selected wordline may be data corresponding to a selected wordline associated with a previous program operation. The nonvolatile memory device 120 may perform the previous page read operation RD_pre on the selected wordline to read the at least one page being stored at the selected wordline. Below, for convenience of description, a page that is read through the previous page read operation RD_pre associated with the currently selected wordline is referred to as a "previous page".

In operation S140, the nonvolatile memory device 120 performs a program operation (i.e., a selection program operation PGM_sel) on the selected wordline based on the remaining page(s) of the plurality of pages and the previous page. For example, when three pages corresponding to one selected wordline are received from the memory controller 110 and the selection program operation PGM_sel is completed, three pages (i.e., a part of the three pages received and a page read through the previous page read operation RD_pre) may be stored at the selected wordline. However, a part of the three pages corresponding to the selected wordline is stored at an unselected wordline. In an exemplary embodiment, the selection program operation PGM_sel is performed without an erase operation on the selected wordline or a memory block having the selected wordline. For example, if first and second pages of the selected wordline have an erase state, and a third page of the selected wordline has a different state since it was previously written with data having a size of a page, without first erasing the third page or the first through third pages of the selected wordline, two of the received pages are written to the first and second pages of the selected wordline respectively and the data read from the third page of the selected wordline during operation S130 is written to the third page of the selected wordline.

In an exemplary embodiment, operations of the flowchart of FIG. 6 may be performed through one program sequence. That is, as the operations of the flowchart illustrated in FIG. 6 are performed, one program sequence may be completed. In other words, one program sequence may include an operation of receiving a plurality of pages corresponding to one selected wordline; the unselection program operation PGM_unsel associated with an unselected wordline; the previous page read operation RD_pre associated with the selected wordline; and the selection program operation PGM_sel associated with the selected wordline. One program sequence that is an atomic operation may be performed without separate control of the memory controller 110. During one program sequence, a busy signal of the nonvolatile memory device 120 may maintain a busy state. For example, upon receiving the plurality of pages corresponding to the selected wordline and determining that a shadow operation is to be performed, the memory device 120 may output a busy signal having the busy state so that the memory controller 110 can hold off sending another command to the nonvolatile memory device until the busy signal has a ready state. For example, the memory device 120 may set the busy signal to the ready state after operation S140.

Figure 7A:
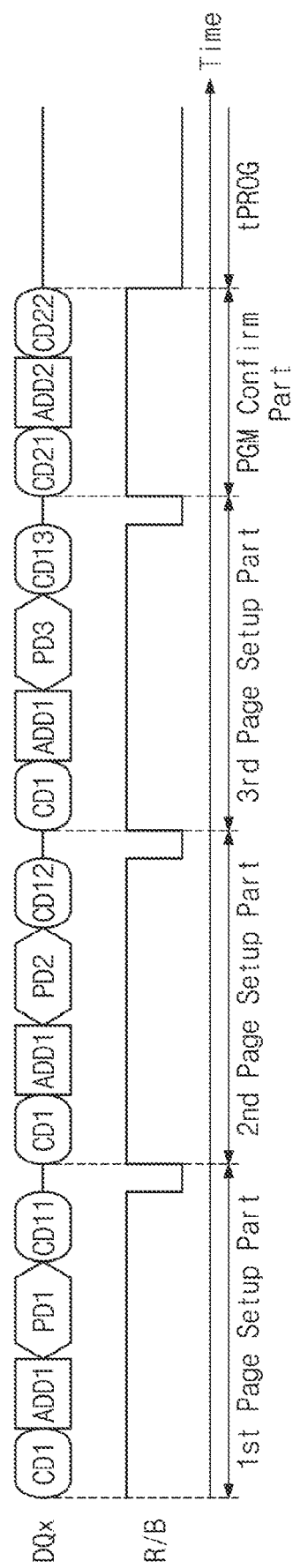
FIGS. 7A and 7B are timing diagrams for describing an operation according to a flowchart of FIG. 6 according to an exemplary embodiment of the inventive concept.
Figure 7B:
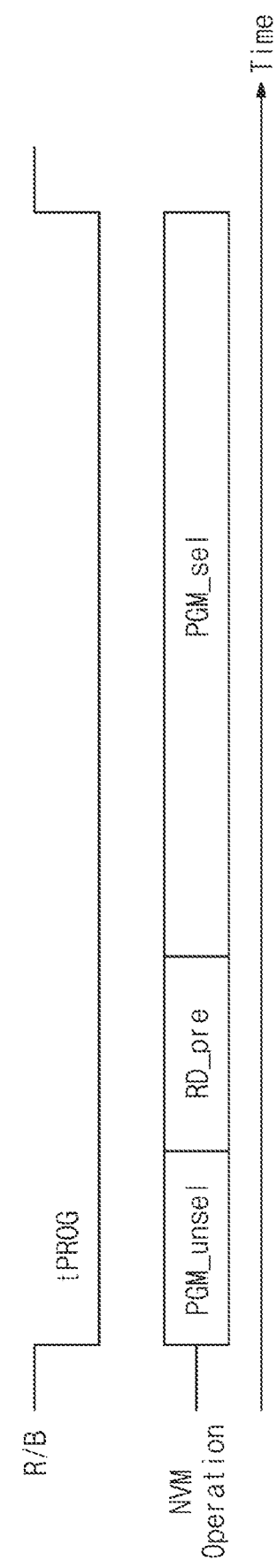

FIGS. 7A and 7B are timing diagrams for describing an operation according to a flowchart of FIG. 6. For brevity of illustration and for convenience of description, the timing diagrams of FIGS. 7A and 7B are schematically illustrated, and the inventive concept is not limited thereto. In an exemplary embodiment, operation S110 (i.e., a page receiving operation) of FIG. 6 will be described with reference to FIG. 7A, and the unselection program operation PGM_unsel, the previous page read operation RD_pre, and the selection program operation PGM_sel will be described with reference to FIG. 7B.

Referring to FIGS. 1, 6, 7A, and 7B, the nonvolatile memory device 120 receives the first page PD1, the second page PD2, and the third page PD3 from the memory controller 110. For example, during a first page setup part, the nonvolatile memory device 120 receives a command CD1, the first address ADD1, the first page PD1, and a command CD11 through data lines DQx. The commands CD1 and CD11 may be a command set for setting up the first page PD1. The first address ADD1 is an address corresponding to a selected wordline. The nonvolatile memory device 120 may dump (e.g., transfer) the first page PD1 received through the data lines DQx in response to the command CD11. A busy signal R/B may be in a busy state while the first page PD1 is dumped. For example, the nonvolatile memory device 120 may transfer the first page PD1 to a first part of the page buffer 123 in response to command CD11, output a busy signal set to busy (B) during the transfer, and output the busy signal set to ready (R) when the transfer has completed.

Afterwards, during a second page setup part, the nonvolatile memory device 120 may receive the command CD1, the first address ADD1, the second page PD2, and a command CD12. The commands CD1 and CD12 may be a command set for setting up the second page PD2. The first address ADD1 is an address corresponding to the selected wordline. The nonvolatile memory device 120 may dump the second page PD2 received through the data lines DQx in response to the command CD12. The busy signal R/B may be in a busy state while the second page PD2 is dumped. For example, the nonvolatile memory device 120 may transfer the second page PD2 to a second part of the page buffer 123 in response to command CD12, output a busy signal set to a busy state (B) during the transfer, and output the busy signal set to a ready state (R) when the transfer has completed.

Afterwards, during a third page setup part, the nonvolatile memory device 120 may receive the command CD1, the first address ADD1, the third page PD3, and a command CD13. The commands CD1 and CD13 may be a command set for setting up the third page PD3. The first address ADD1 is an address corresponding to the selected wordline. The nonvolatile memory device 120 may dump the third page PD3 received through the data lines DQx in response to the command CD13, and the busy signal R/B may be in a busy state while the third page PD3 is dumped. For example, the nonvolatile memory device 120 may transfer the third page PD3 to a third part of the page buffer 123 in response to command CD13, output a busy signal set to the busy state (B) during the transfer, and output the busy signal set to the ready state (R) when the transfer has completed.

Afterwards, during a program confirm part, the nonvolatile memory device 120 may receive a command CD21, the second address ADD2, and a command CD22. The commands CD21 and CD22 may be a command set for initiating a program operation. In an exemplary embodiment, the second address ADD2 may include information about a program order. For example, the second address ADD2 could indicate the order in which the received pages are to be written and to which page a given one of the received pages is to be written (e.g., LSB page, CSB page, MSB page).

During the program time tPROG, the nonvolatile memory device 120 programs the first, second, and third pages PD1, PD2, and PD3 in response to the command CD22. During the program time tPROG, the busy signal R/B may be in a busy state (i.e., in a low state). For example, during the program time tPROG, the nonvolatile memory device 120 may copy some data of the page buffer 123 to some of its memory cells associated with the received addresses.

As described above, the nonvolatile memory device 120 may continuously or sequentially receive a plurality of pages corresponding to one selected wordline and may perform a program operation after the plurality of pages are completely received.

In an exemplary embodiment, because addresses respectively corresponding to the first, second, and third pages PD1, PD2, and PD3 are the same address as the first address ADD1, the first, second, and third pages PD1, PD2, and PD3 are programmed at the selected wordline corresponding to the first address ADD1. However, the nonvolatile memory device 120 according to an embodiment of the inventive concept programs one page of the first, second, and third pages PD1, PD2, and PD3 at an unselected wordline different from the selected wordline.

For example, as illustrated in FIG. 7B, the nonvolatile memory device 120 according to an exemplary embodiment of the inventive concept performs the unselection program operation PGM_unsel, the previous page read operation RD_pre, and the selection program operation PGM_sel during the program time tPROG. That is, during the program time tPROG, the nonvolatile memory device 120 may program one page (e.g., PD3) of the first, second, and third pages PD1, PD2, and PD3 at an unselected wordline different from the selected wordline (i.e., may perform the unselection program operation PGM_unsel), reads a previous page currently stored at the selected wordline (i.e., may perform the previous page read operation RD_pre), and performs a program operation on the selected wordline based on the previous page and the remaining pages (e.g., PD1 and PD2) of the first, second, and third pages PD1, PD2, and PD3 (i.e., the selection program operation PGM_sel).

When the selection program operation PGM_sel has completed, three pages (e.g., PD1, PD2, and the previous page) are stored at the selected wordline, and one page (e.g., PD3) is stored at the unselected wordline different from the selected wordline.

In an exemplary embodiment, in a high-speed program scheme where all the three pages (e.g., PD1, PD2, and PD3) are programmed at the same selected wordline, memory cells of a different wordline(s) adjacent to the selected wordline may degrade due to a high voltage that is applied to the selected wordline. In contrast, as described above, because the nonvolatile memory device 120 according to an exemplary embodiment of the inventive concept performs the selection program operation PGM_sel on the selected wordline in a state where at least one page (e.g., at least one of PD1, PD2, and the previous page) is programmed at the selected wordline, the degradation of memory cells may decrease. Accordingly, the performance of the nonvolatile memory device 120 may be improved.

In an exemplary embodiment, in the case of a reprogram scheme where three pages are repeatedly programmed at the same selected wordline, after a page receiving operation and a program operation are repeatedly performed as much as the given number of times (e.g., three times) for the purpose of storing three pages, it is possible to read the three pages. As the page receiving operation and the program operation are repeatedly performed to store three pages, a program speed of a nonvolatile memory device may decrease. In contrast, because the nonvolatile memory device 120 according to an exemplary embodiment of the inventive concept performs an operation of receiving three pages and an operation of programming the three pages at an unselected wordline or a selected wordline only once, the performance of the nonvolatile memory device 120 may be prevented from decreasing due to the iteration of the data receiving and program operation. Accordingly, the performance of the nonvolatile memory device 120 may be improved.

Figure 8A:
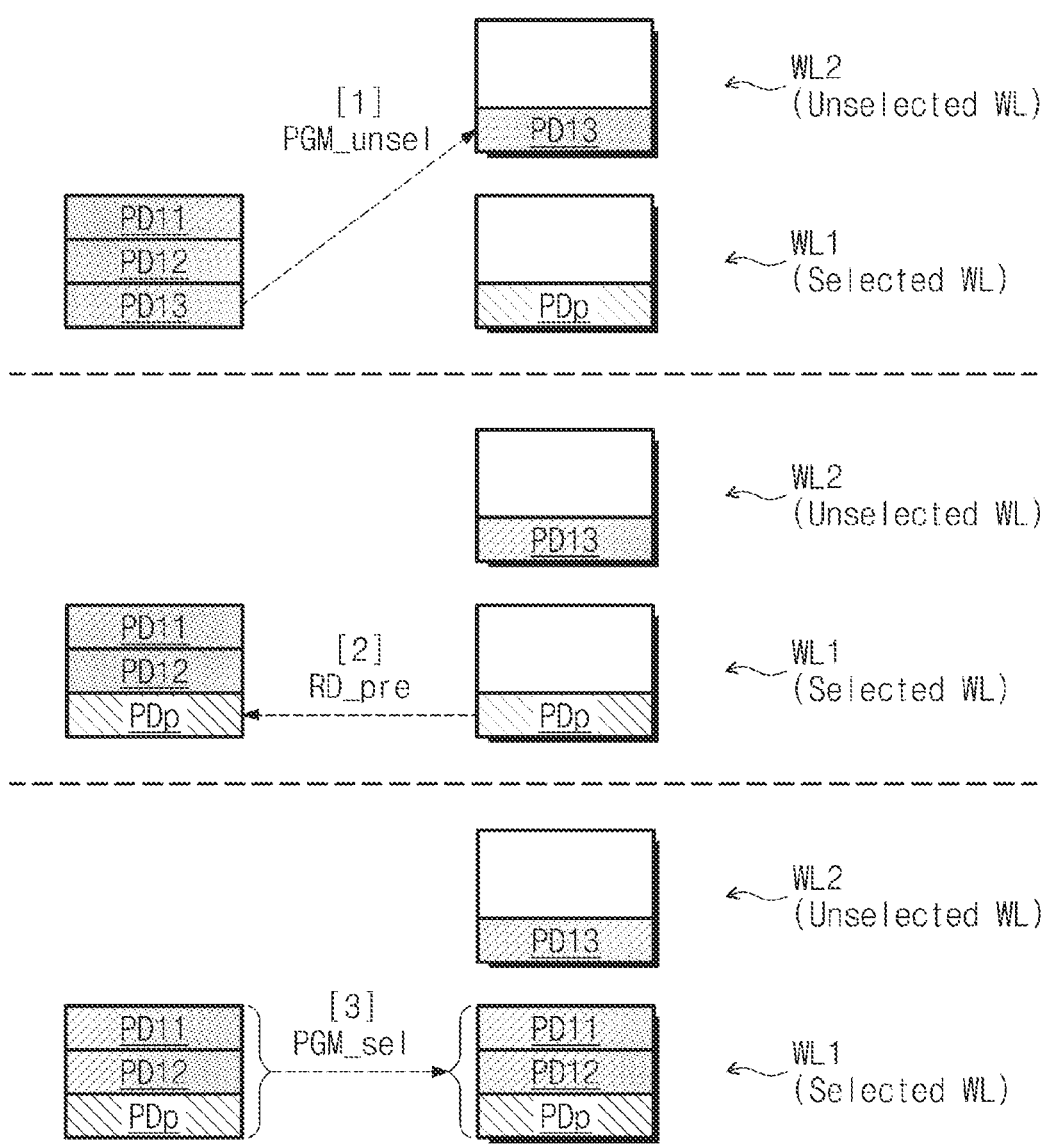
FIGS. 8A and 8B are diagrams for describing operation S120, operation S130, and operation S140 of FIG. 6 according to an exemplary embodiment of the inventive concept.
Figure 8B:
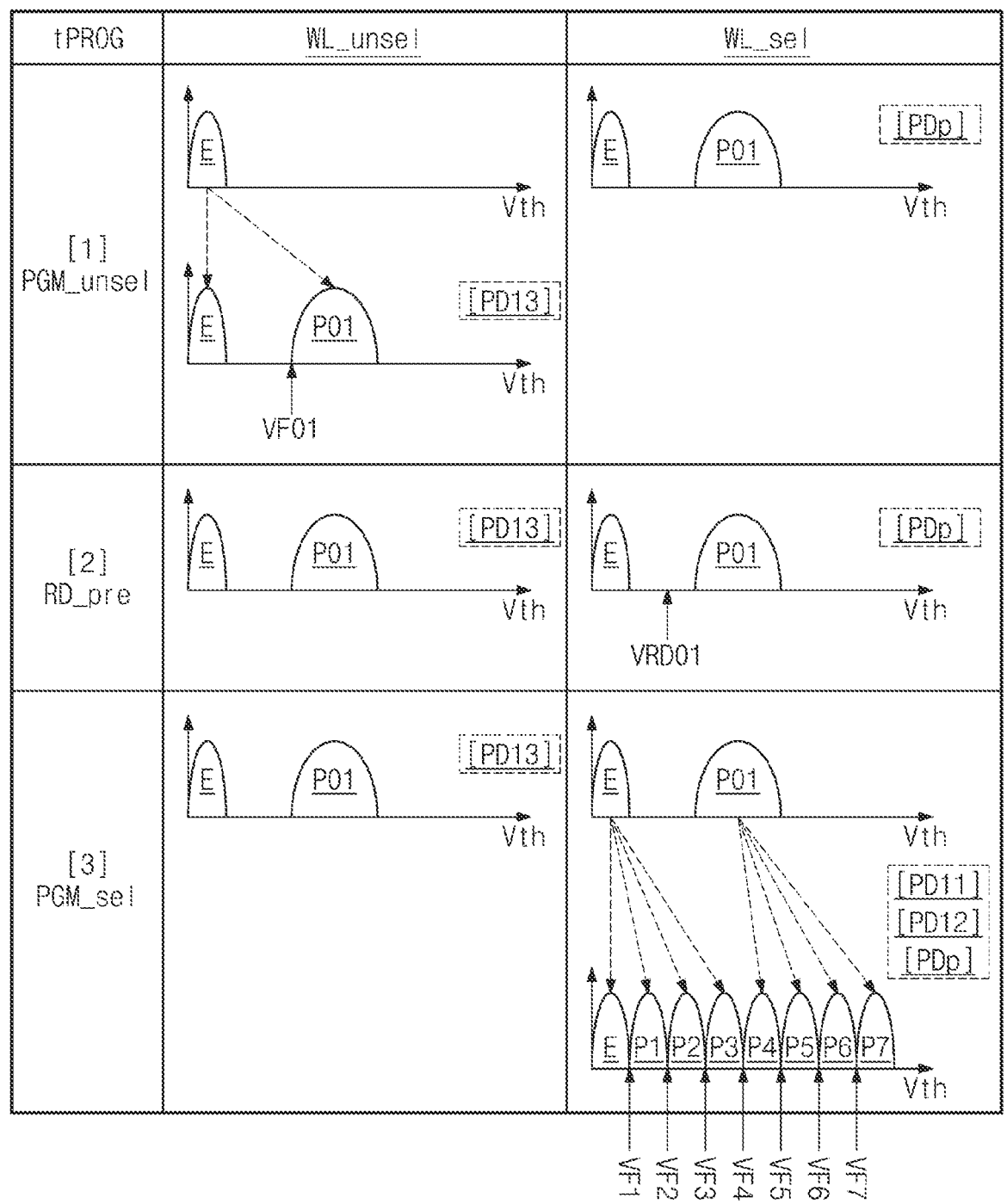

FIGS. 8A and 8B are diagrams for describing operation S120, operation S130, and operation S140 of FIG. 6. The description will be given with reference to FIG. 8A in the page view, and the description will be given with reference to FIG. 8B in the cell distribution view. In distributions of FIG. 8B, a horizontal axis represents a threshold voltage of a memory cell, and a vertical axis represents the number of memory cells.

For convenience of description, a current program operation will be described under the assumption that a selected wordline is the first wordline WL1 and an unselected wordline is the second wordline WL2. Reference numerals are used to distinguish wordlines and do not mean physical locations of wordlines.

For convenience of description, it is assumed that a previous page PDp is previously stored at the first wordline WL1. For example, before a program operation associated with the first wordline WL1, a program operation may be performed on a 0-th wordline (WL0) (not illustrated). In the program operation associated with the 0-th wordline (WL0) (not illustrated), the 0-th wordline (WL0) (not illustrated) is a selected wordline, and the first wordline WL1 is an unselected wordline. As described above, at least one page (e.g., PDp) of a plurality of pages corresponding to the 0-th wordline WL0 (not illustrated) may be stored at the first wordline WL1 through the unselection program operation PGM_unsel. That is, at a time when the program operation associated with the first wordline WL1 is initiated, the first wordline WL1 may be in a state where the previous page PDp programmed in the previous unselection program operation PGM_unsel is stored.

Referring to FIGS. 1, 3, 6, 8A, and 8B, the nonvolatile memory device 120 receives a first page PD11, a second page PD12, and a third page PD13 corresponding to the first wordline WL1. The operation of receiving the first, second, and third pages PD11, PD12, and PD13 is described with reference to FIGS. 7A and 7B, and thus, additional description will be omitted to avoid redundancy. In an exemplary embodiment, the first, second, and third pages PD11, PD12, and PD13 thus received are stored in the page buffer 123 of the nonvolatile memory device 120.

In an exemplary embodiment, the nonvolatile memory device 120 programs one page (e.g., PD13) of the first, second, and third pages PD11, PD12, and PD13 corresponding to the first wordline WL1 at the second wordline WL2 being the unselected wordline (i.e., may perform the unselection program operation PGM_unsel).

For example, as illustrated in FIG. 8B, the nonvolatile memory device 120 may perform the unselection program operation PGM_unsel on the second wordline WL2 such that each of memory cells connected with the second wordline WL2 has one of the erase state "E" and an unselected program state P01. In an exemplary embodiment, in the unselection program operation PGM_unsel, an unselected verification voltage VF01 may be used to verify the unselected program state P01. When the unselection program operation PGM_unsel associated with the second wordline WL2 has completed, the second wordline WL2 may be in a state where the third page PD13 corresponding to the first wordline WL1 is stored, and the first wordline WL1 may be in a state where the previous page PDp is stored.

In an exemplary embodiment, when the number of pages corresponding to a selected wordline is "n" (n being a positive integer) and the unselection program operation PGM_unsel associated with an unselected wordline has completed, memory cells connected with the unselected wordline may form threshold voltage distributions, the number of which is less than $2^n$.

Afterwards, the nonvolatile memory device 120 performs the previous page read operation RD_pre on the first wordline WL1 to read the previous page PDp. For example, as illustrated in FIG. 8B, each of memory cells of the first wordline WL1 where the previous page PDp is stored may have one of the erase state "E" and the unselected program state P01. The nonvolatile memory device 120 may read the previous page PDp by performing the previous page read operation RD_pre by using a read voltage VRD01.

In an exemplary embodiment, the previous page PDp read by the previous page read operation RD_pre may be stored in a certain data latch of the page buffer 123 (refer to FIG. 3). The certain data latch may indicate a data latch where the page (i.e., PD13) programmed at the unselected wordline is stored. That is, after the previous page read operation RD_pre is performed, the page buffer 123 of the nonvolatile memory device 120 may store the first and second pages PD1 and PD2 corresponding to the first wordline WL1 and the previous page PDp corresponding to a wordline different from the first wordline WL1.

Afterwards, the nonvolatile memory device 120 performs the selection program operation PGM_sel on the first wordline WL1 based on the first and second pages PD11 and PD12 and the previous page PDp. For example, as described above, after the previous page read operation RD_pre is performed, the page buffer 123 of the nonvolatile memory device 120 store s the first and second pages PD1 and PD2 and the previous page PDp at the first wordline WL1. The nonvolatile memory device 120 may perform the selection program operation PGM_sel on the first wordline WL1 based on the first and second pages PD1 and PD2 and the previous page PDp stored in the page buffer 123.

As the selection program operation PGM_sel is performed, each of memory cells having the erase state "E" from among the memory cells of the first wordline WL1 may have one of the erase state "E" and first to third program states P1 to P3, and the memory cells having the unselected program state P01 may have one of fourth to seventh program states P4 to P7. In the selection program operation PGM_sel, first to seventh verification voltages VF1 to VF7 may be used to verify the first to seventh program states P1 to P7.

When the selection program operation PGM_sel associated with the first wordline WL1 has completed, the first wordline WL1 may be in a state where the first and second pages PD11 and PD12 corresponding to the first wordline WL1 and the previous page PDp are stored, and the second wordline WL2 may be in a state where the third page PD3 corresponding to the first wordline WL1 is stored.

Figure 9A:
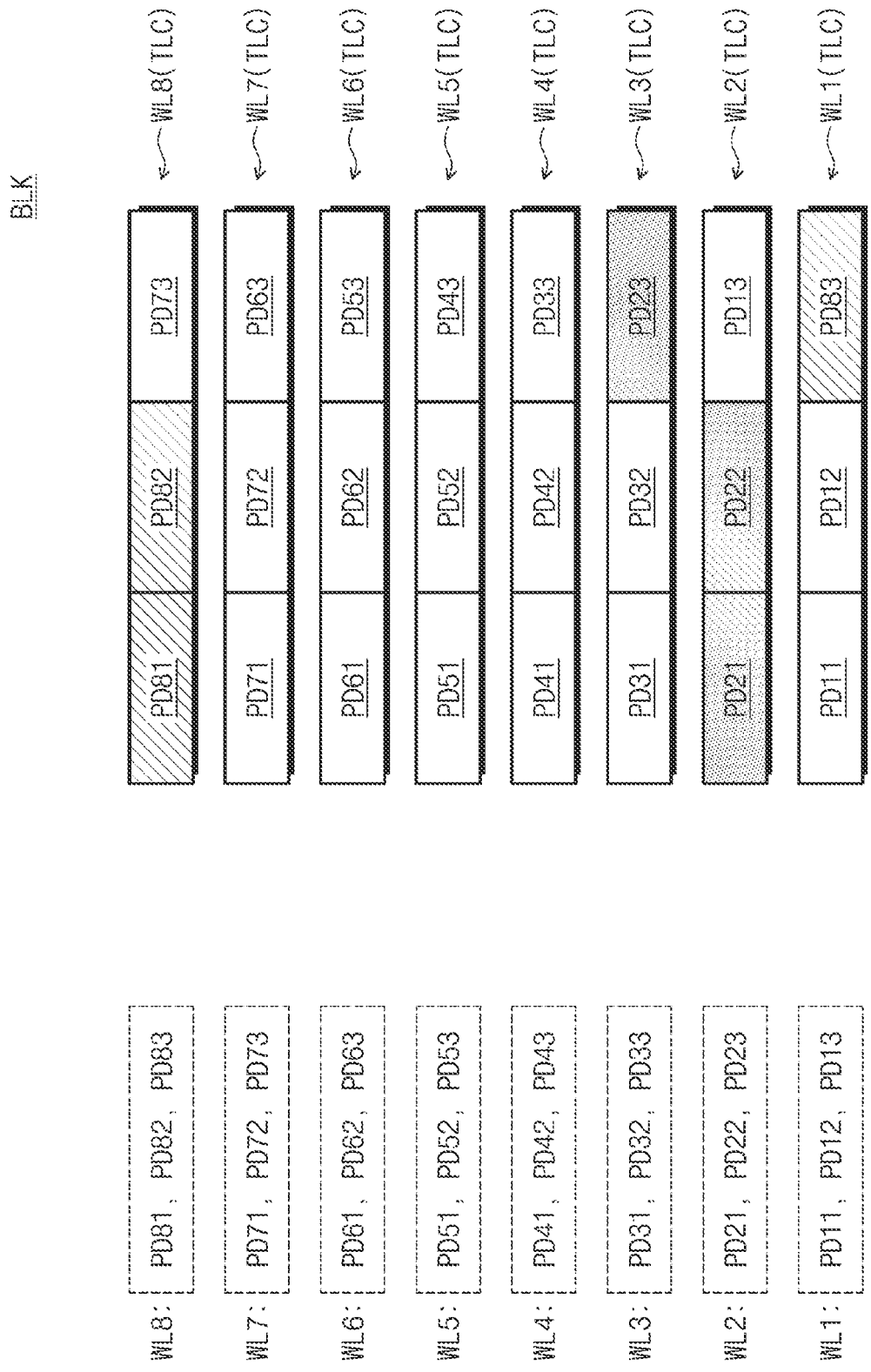
Figure 9B:
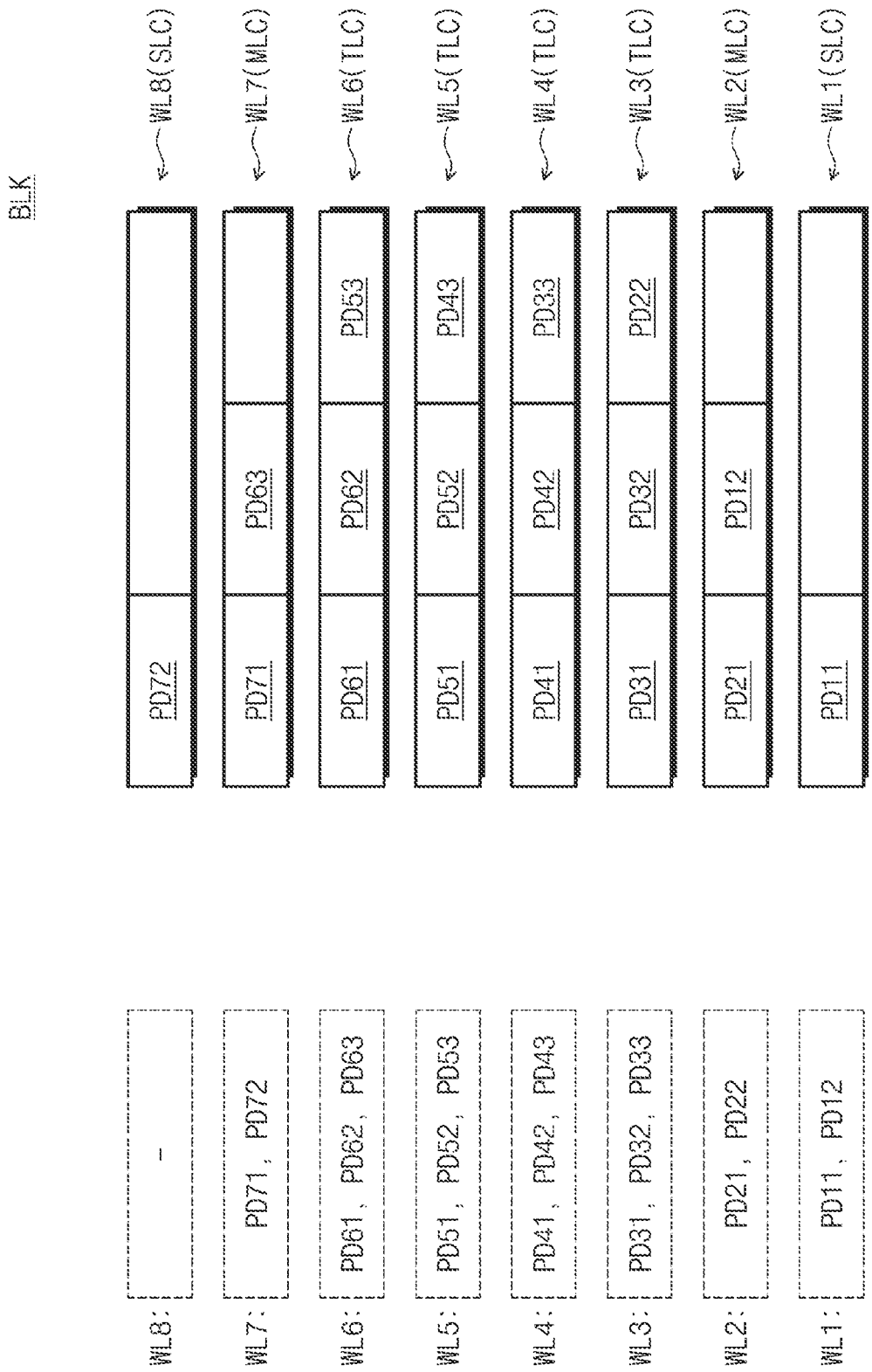

FIGS. 9A to 9C are diagrams for describing a program operation of a nonvolatile memory device of FIG. 1. For brevity of illustration and for convenience of description, embodiments of FIGS. 9A to 9C will be described with reference to one memory block BLK, and a structure of the memory block BLK may be similar to the structure described with reference to FIG. 4.

Referring to FIGS. 1, 9A, 9B, and 9C, the nonvolatile memory device 120 includes the memory block BLK. The memory block BLK may include first to eighth wordlines WL1 to WL8. The first to eighth wordlines WL1 to WL8 may be located in an edge area (or the uppermost area or the lowermost area) of the memory block BLK. Program operations may be sequentially performed from the first wordline WL1 to the eighth wordline WL8. A program order of wordlines may be managed or controlled by the memory controller 110. However, the inventive concept is not limited thereto.

As illustrated in FIG. 9A, the nonvolatile memory device 120 receives three pages PD11, PD12, and PD13 corresponding to the first wordline WL1 from the memory controller 110. In an exemplary embodiment, the first wordline WL1 is a start wordline of the memory block BLK. The start wordline may indicate a wordline of the memory block BLK, at which a program operation is first performed. Alternatively, the start wordline may indicate a wordline that corresponds to an address corresponding to pages that are first received from the memory controller 110.

In this case, the nonvolatile memory device 120 programs one page (e.g., PD13) of the three pages PD11, PD12, and PD13 corresponding to the first wordline WL1 at the second wordline WL2 (i.e., an unselected wordline) (i.e., may perform the unselection program operation PGM_unsel). Afterwards, the nonvolatile memory device 120 performs the selection program operation PGM_sel on the first wordline WL1 based on the remaining pages PD11 and PD12.

Afterwards, the nonvolatile memory device 120 receives three pages PD21, PD22, and PD23 corresponding to the second wordline WL2. According to the above-described program method, the nonvolatile memory device 120 programs one page (e.g., PD23) of the three pages PD21, PD22, and PD23 at the third wordline WL3, performs the previous page read operation RD_pre on the second wordline WL2 to read the previous page PD13, and performs the selection program operation PGM_sel on the second wordline WL2 based on the previous page PD13 and the remaining pages PD21 and PD22.

Afterwards the nonvolatile memory device 120 receives a plurality of pages PD31 to PD73 corresponding to the third to seventh wordlines WL3 to WL7 and programs the plurality of pages PD31 to PD73 in a scheme that is similar to the above-described program scheme.

The nonvolatile memory device 120 receives three pages PD81, PD82, and PD83 corresponding to the eighth wordline WL8. In an exemplary embodiment, the eighth wordline WL8 is the last wordline of the memory block BLK. In an exemplary embodiment, the last wordline indicates a wordline of the memory block BLK, at which a program operation is lastly performed. Alternatively, the last wordline may indicate a wordline corresponding to a page that is lastly received from the memory controller 110 with regard to the memory block BLK.

In this case, the nonvolatile memory device 120 programs one page (e.g., PD83) of the three pages PD81, PD82, and PD83 at the first wordline WL1 being the start wordline of the memory block BLK. To this end, the nonvolatile memory device 120 reads the pages PD11 and PD12 previously stored at the first wordline WL1 and performs a program operation on the first wordline WL1 based on the read pages PD11 and PD12 and the received page PD83. In an exemplary embodiment, the program operation on the first wordline WL1 based on the read pages PD11, PD12, and the received page PD83 is performed without first performing an erase operation on the memory cells connected to the first wordline WL1 that are to be programmed with pages P11, PD12, and PD83. The nonvolatile memory device 120 performs a program operation on the eighth wordline WL8 based on the remaining pages PD81 and PD82 and a page PD73 previously stored at the eighth wordline WL8. The program operation on the eight wordline WL8 may include reading page PD73 as a previous page and then together programming pages PD81, PD82, and the previous page at the eight wordline WL8.

After the program operations associated with the start wordline and the last wordline of the memory block BLK are performed as described above, three pages may be stored at each of the first to eighth wordlines WL1 to WL8 of the memory block BLK, and programming may be completed with regard to the whole memory block BLK. In the embodiment of FIG. 9A, when programming has completed with regard to the whole memory block BLK, a certain wordline may store a page corresponding to the certain wordline and a page corresponding to a wordline different from the certain wordline. For example, even though three pages are received along with an address associated with the certain wordline, rather than the certain wordline storing all of these pages, the certain wordline only stores some of these pages and the wordline different from the certain wordline stores the remaining pages.

Referring to FIGS. 1 and 9B, the nonvolatile memory device 120 receives two pages PD11 and PD12 corresponding to the first wordline WL1. The first wordline WL1 may be a start wordline of the memory block BLK. In this case, the nonvolatile memory device 120 programs a part (i.e., PD12) of the two pages PD11 and PD12 at the second wordline WL2 and programs the remaining page PD11 at the first wordline WL1.

The nonvolatile memory device 120 receives two pages PD21 and PD22 corresponding to the second wordline WL2. The second wordline WL2 may be a wordline (i.e., the second wordline) that is next to the start wordline of the memory block BLK. In this case, the nonvolatile memory device 120 programs a part (i.e., PD22) of the two pages PD21 and PD22 at the third wordline WL3 and performs a program operation on the second wordline WL2 based on the remaining page PD21 and the page PD12 previously stored at the second wordline WL2. For example, the program operation on the second wordline WL2 based on pages PD21 and PD12 may include reading page PD12 from the second wordline WL2, and then programming page PD12 and the read page together at the second wordline WL2 without first performing an erase operation on memory cells connected to the second wordline WL2.

Afterwards the nonvolatile memory device 120 receives a plurality of pages PD31 to PD63 corresponding to the third to sixth wordlines WL3 to WL6 and programs the plurality of pages PD31 to PD63 in the above-described program scheme.

Afterwards, the nonvolatile memory device 120 receive two pages PD71 and PD72 corresponding to the seventh wordline WL7. In this case, the nonvolatile memory device 120 programs a part (i.e., PD72) of the two pages PD71 and PD72 at the eighth wordline WL8 and performs a program operation on the seventh wordline WL7 based on the remaining page PD71 and the page PD63 previously stored at the seventh wordline WL7.

In the embodiment of FIG. 9B, pages corresponding to the eighth wordline WL8 being the last wordline of the memory block BLK are not received. In the embodiment of FIG. 9B, when programming has completed with regard to the whole memory block BLK, each of the first and eighth wordlines WL1 and WL8 may store one page, each of the second and seventh wordlines WL2 and WL7 may store two pages, and each of the third to sixth wordlines WL3 to WL6 may store three pages.

Referring to FIGS. 1 and 9C, the nonvolatile memory device 120 receives three pages PD11, PD12, and PD13 corresponding to the first wordline WL1. The first wordline WL1 may be a start wordline of the memory block BLK. In this case, the nonvolatile memory device 120 programs one page PD13 of the three pages PD11, PD12, and PD13 at the second wordline WL2 and programs the remaining pages PD11 and PD12 at the first wordline WL1.

Afterwards, the nonvolatile memory device 120 receives a plurality of pages PD21 to PD63 corresponding to the second to sixth wordlines WL2 to WL6 and programs the plurality of pages PD21 to PD63 in the above-described program scheme.

Afterwards, the nonvolatile memory device 120 receive two pages PD71 and PD72 corresponding to the seventh wordline WL7. The nonvolatile memory device 120 programs a part PD72 of the two pages PD71 and PD72 at the eighth wordline WL8. The nonvolatile memory device 120 performs a program operation on the seventh wordline WL7 based on the remaining page PD71 and the page PD63 previously stored at the seventh wordline WL7.

Afterwards, the nonvolatile memory device 120 receives one page PD81 corresponding to the eighth wordline WL8 and performs a program operation on the eighth wordline WL8 based on the received page PD81 and the page PD72 previously stored at the eighth wordline WL8. Thus, in response to receipt of page PD81, only the selected wordline WL8 is programmed and not an additional unselected wordline.

In the embodiment of FIG. 9C, when programming has completed with regard to the whole memory block BLK, each of the first, seventh, and eighth wordlines WL1, WL7, and WL8 may store two pages, and each of the second to sixth wordlines WL2 to WL6 may store three pages.

The number of pages corresponding to a wordline, a program order, or a program scheme, which is described above, is exemplary, and the inventive concept is not limited thereto.

Figure 10:
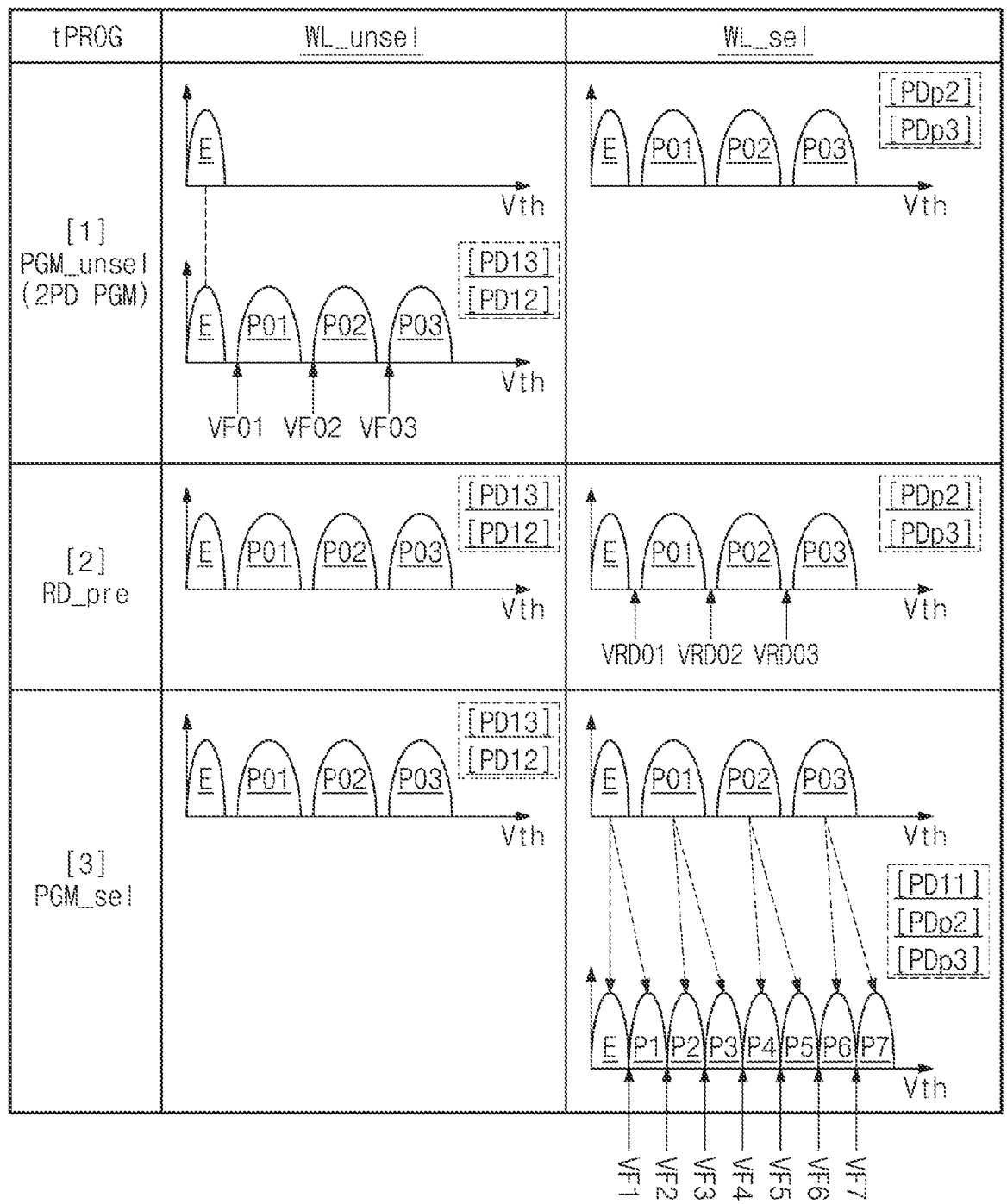
FIG. 10 is a diagram for describing an operation of a nonvolatile memory device of FIG. 1 according to an exemplary embodiment of the inventive concept.

FIG. 10 is a diagram for describing an operation of a nonvolatile memory device of FIG. 1. Embodiments are described above as one page of three pages being programmed at an unselected wordline when three pages correspond to one wordline. However, the inventive concept is not limited thereto. For example, the number of pages necessary for the unselection program operation PGM_unsel may be variously changed.

Referring to FIGS. 1 and 10, the nonvolatile memory device 120 receives three pages PD11, PD12, and PD13 corresponding to a selected wordline. Afterwards, the nonvolatile memory device 120 performs the unselection program operation PGM_unsel on the unselected wordline based on two pages PD12 and PD13 of the three pages PD11, PD12, and PD13. For example, the nonvolatile memory device 120 may perform the unselection program operation PGM_unsel based on the two pages PD12 and PD13 of the three pages PD11, PD12, and PD13 such that each of memory cells connected with the unselected wordline has one of the erase state "E" and a plurality of unselected program states P01, P02, P03, and P04. In an exemplary embodiment, in the unselection program operation PGM_sel, verification voltages VF01, VF02, and VF03 may be used to verify the unselected program states P01, P02, and P03.

Afterwards, the nonvolatile memory device 120 performs the previous page read operation RD_pre on the selected wordline. As in the above description, for example, memory cells of the selected wordline may store two previous pages PDp2 and PDp3. The nonvolatile memory device 120 may read the two previous pages PDp2 and PDp3 by performing the previous page read operation RD_pre on the selected wordline by using read voltages VRD01, VRD02, and VRD03.

Afterwards, the nonvolatile memory device 120 performs the selection program operation PGM_sel on the selected wordline based on the remaining page (i.e., PD11) and the two previous pages PDp2 and PDp3. For example, the nonvolatile memory device 120 may perform a program operation based on the remaining page (i.e., PD11) and the two previous pages PDp2 and PDp3 such that a memory cell having the erase state "E" from among memory cells connected with the selected wordline has one of the erase state "E" and a first program state P 1, a memory cell having the unselected program state P01 has one of second and third program states P2 and P3, a memory cell having the unselected program state P02 has one of fourth and fifth program states P4 and P5, and a memory cell having the unselected program state P03 has one of sixth and seventh program states P6 and P7.

The number of pages used in the unselection program operation PGM_unsel may be variously changed without limitation according to embodiments disclosed in the detailed description.

In an exemplary embodiment, at a time when a program sequence for a selected wordline starts, the selected wordline may be in a state where a previously programmed page (i.e., a previous page) is stored. The previous page is programmed at the selected wordline through a previous program sequence. That is, when the previous program sequence has completed (or passes), the memory controller 110 may recognize that a page (i.e., the previous page) corresponding to a previous program operation is normally programmed in the nonvolatile memory device 120.

However, when a program failure occurs in the selection program operation PGM_sel associated with the selected wordline of a current program operation, the previous page stored at the selected wordline may be lost, and the previous page may fail to be recovered. The nonvolatile memory device 120 according to an embodiment of the inventive concept provides a method or a device capable of recovering a previous page stored at a selected wordline even though a program failure occurs in the selection program operation PGM_sel. The above operation of the nonvolatile memory device 120 according to an embodiment of the inventive concept will be more fully described with reference to the following drawings.

Figure 11A:
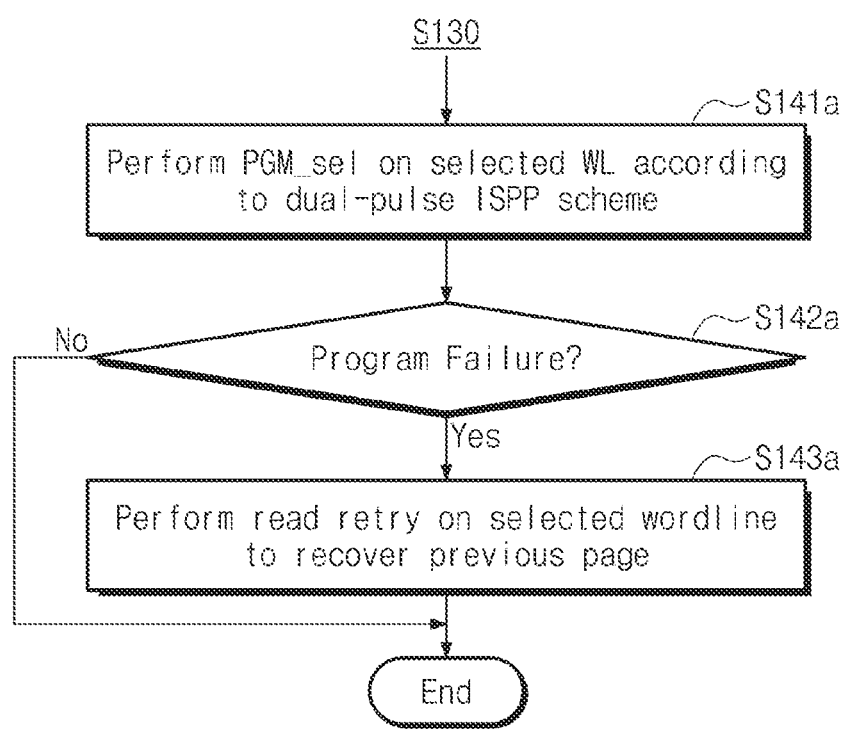
FIGS. 11A and 11B are diagrams for describing operation S140 of FIG. 6 in detail according to an exemplary embodiment of the inventive concept.
Figure 11B:
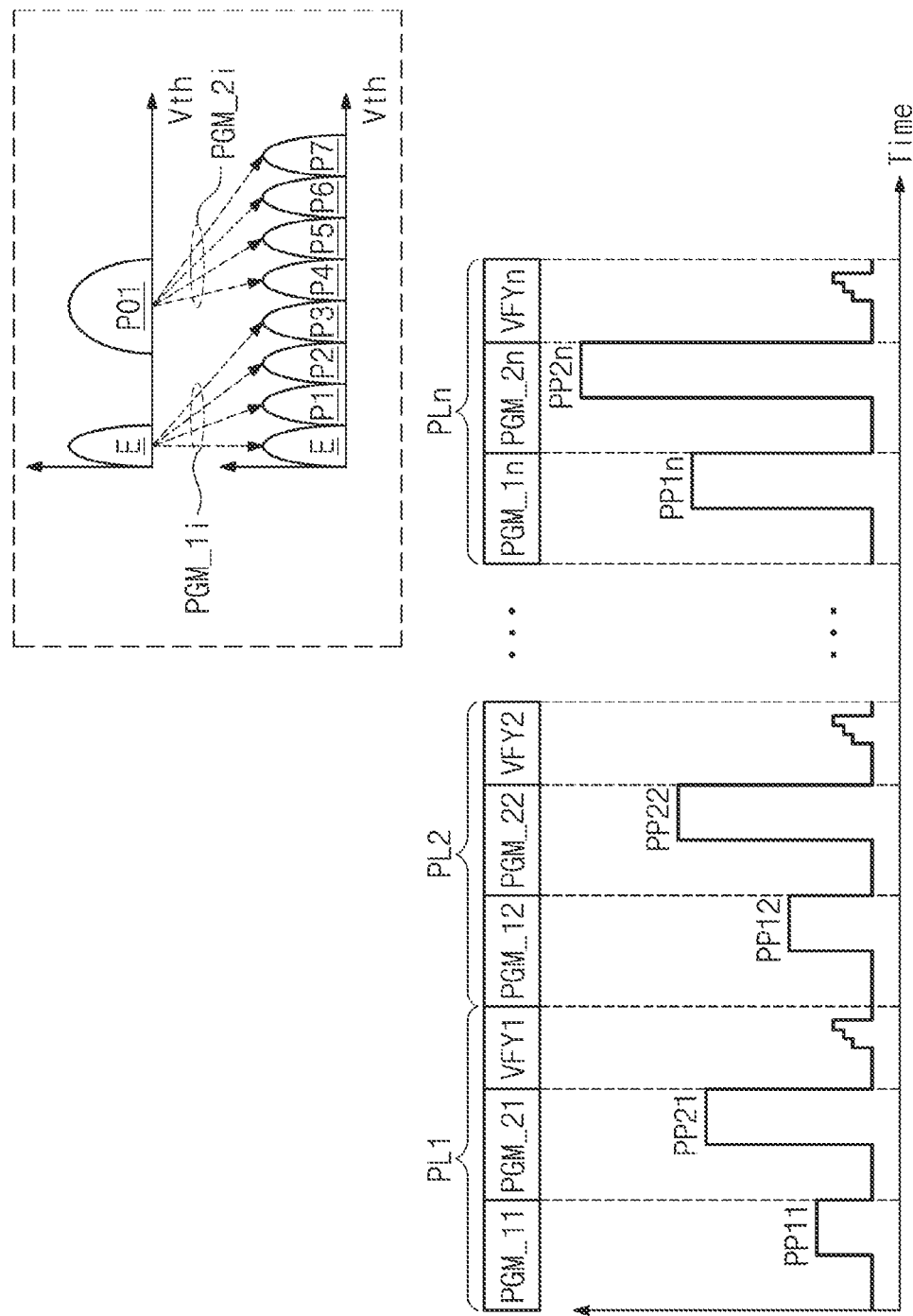

FIGS. 11A and 11B are diagrams for describing operation S140 of FIG. 6 in detail. The selection program operation PGM_sel of the nonvolatile memory device 120 according to an embodiment of the inventive concept will be described with reference to FIGS. 11A and 11B.

Referring to FIGS. 1, 6, 11A, and 11B, after operation S130, the nonvolatile memory device 120 may perform operations S141a to S143a. Operations S141a to S143a may be included in operation S140 of FIG. 6.

In operation S141a, the nonvolatile memory device 120 performs the selection program operation PGM_sel on a selected wordline in compliance with a dual-pulse incremental step pulse programming (ISPP) scheme. For example, as illustrated in FIG. 11B, the nonvolatile memory device 120 performs the selection program operation PGM_sel on the selected wordline by performing a plurality of program loops PL1 to PLn. Each of the plurality of program loops PL1 to PLn includes two program phases and one verification phase. That is, the plurality of program loops PL1 to PLn may be performed in compliance with the dual-pulse ISPP scheme.

For example, the first program loop PL1 includes a "PGM_11" program phase, a "PGM_21" program phase, and a "VFY1" verification phase. A program voltage of "PP11" is applied to the selected wordline in the "PGM_11" program phase, and the program voltage of "PP21" is applied to the selected wordline in the "PGM_21" program phase. In an exemplary embodiment, a magnitude of "PP21" is greater than a magnitude of "PP11". Afterwards, in the "VFY1" verification phase, as at least one verification voltage is applied to the selected wordline, thereby enabling program states of memory cells to be verified.

The second program loop PL2 that is performed after the first program loop PL1 includes a "PGM_12" program phase, a "PGM_22" program phase, and a "VFY2" verification phase. The program voltage of "PP12" is applied to the selected wordline in the "PGM_12" program phase, and the program voltage of "PP22" is applied to the selected wordline in the "PGM_22" program phase. In an exemplary embodiment, a magnitude of "PP22" is greater than the magnitude of "PP12" and is greater than the magnitude of "PP21". In an exemplary embodiment, a magnitude of "PP12" is greater than the magnitude of "PP11". Afterwards, in the "VFY2" verification phase, as at least one verification voltage is applied to the selected wordline, thereby enabling program states of memory cells to be verified.

As in the above description, the nonvolatile memory device 120 may sequentially perform the plurality of program loops PL1 to PLn. In an exemplary embodiment, through the first program phases (e.g., PGM_11, PGM_12 . . . PGM_1n) of the plurality of program loops PL1 to PLn, each of memory cells (for convenience of description, referred to as "first memory cells") having the erase state "E" from among memory cells of the selected wordline may be programmed to have one of the erase state "E" and the first to third program states P1 to P3. Through the second program phases (e.g., PGM_21, PGM_22 . . . PGM_2n) of the plurality of program loops PL1 to PLn, each of memory cells (for convenience of description, referred to as "second memory cells") having the program state P01 from among the memory cells of the selected wordline may be programmed to have one of the fourth to seventh program states P4 to P7. For example, if a remaining page and a previous page are to be programmed at a selected wordline, the programming of the remaining page may occur during program phase PGM11 and the programming of the previous page may occur during program phase PGM21.

In other words, the first memory cells connected with the selected wordline may be programmed by the first program phase of each of the plurality of program loops PL1 to PLn, and the second memory cells connected with the selected wordline may be programmed by the second program phase of each of the plurality of program loops PL1 to PLn.

To this end, in the first and second program phases of each of the plurality of program loops PL1 to PLn, a bitline setup operation may be performed such that relevant memory cells are programmed. For example, in the "PGM_11" program phase, before a pulse of "PP11" is applied, bitlines corresponding to the second memory cells may be set such that the second memory cells are program inhibited. In the "PGM_21" program phase, before a pulse of "PP21" is applied, bitlines corresponding to the first memory cells may be set such that the first memory cells are program inhibited. In an embodiment, when a program memory cell is program inhibited, even though its wordline is selected, the program memory cell cannot be programmed. For example, a first memory cell and a second memory cell may be connected to a given wordline, and if only the first memory cell is to be programmed, the second memory cell can be program inhibited while the first memory cell is programmed.

The above-described order of the first and second program phases is exemplary, and the inventive concept is not limited thereto. For example, in one program loop, the second program phase may be first performed, and then the first program phase may be performed.

In operation S142a, the nonvolatile memory device 120 may determine whether a program failure occurs. For example, after all the program loops PL1 to PLn are completed, when memory cells not programmed exist or the number of memory cells not programmed is a reference value or more, the nonvolatile memory device 120 may determine that the program failure occurs. Alternatively, the program failure may occur while the plurality of program loops PL1 to PLn are performed.

In the case where the program failure occurs, because remaining pages of three pages corresponding to the selected wordline are present in the memory controller 110, the remaining pages may be recovered. In contrast, because a previous page that is stored at the selected wordline and does not correspond to the selected wordline is absent from the memory controller 110, a separate recovery scheme is required.

When a program failure occurs in the selection program operation PGM_sel associated with the selected wordline, in operation S143a, the nonvolatile memory device 120 may perform a read retry operation on the selected wordline to recover the previous page.

For example, as described with reference to FIG. 11B, the nonvolatile memory device 120 may perform the selection program operation PGM_sel in compliance with the dual-pulse ISPP scheme. In this case, because the first memory cells and the second memory cells are programmed together in each program loop, the probability that a threshold voltage distribution of the first memory cells and a threshold voltage distribution of the second memory cells overlap each other decreases.

In this case, a previous page may be recovered because the first memory cells and the second memory cells are distinguished. In an exemplary embodiment, a page to be stored in the nonvolatile memory device 120 may be data that is randomized by the data processing circuit 113 (refer to FIG. 2). Accordingly, a cell-counting operation may be performed on memory cells connected with a selected wordline by using a certain voltage level, and a previous page may be recovered based on a result of the cell-counting operation. In an exemplary embodiment, the certain voltage level may be determined such that the number of "ON" cells of the memory cells connected with the selected wordline is the same as the number of "OFF" cells thereof or such that a difference between the number of "ON" cells and the number of "OFF" cells is a reference value or less. In an exemplary embodiment, the nonvolatile memory device 120 may perform a plurality of cell-counting operations (i.e., read retry operations) for the purpose of determining the certain voltage level.

Figure 12A:
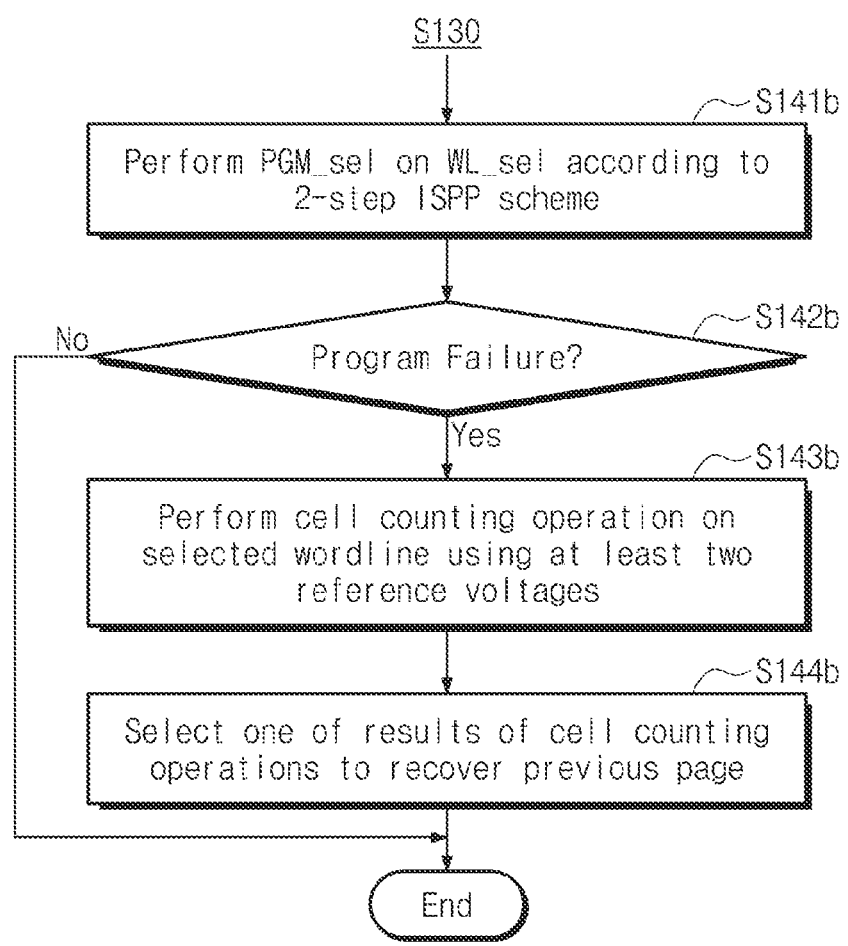
FIGS. 12A and 12B are diagrams for describing operation S140 of FIG. 6 in detail according to an exemplary embodiment of the inventive concept.
Figure 12B:
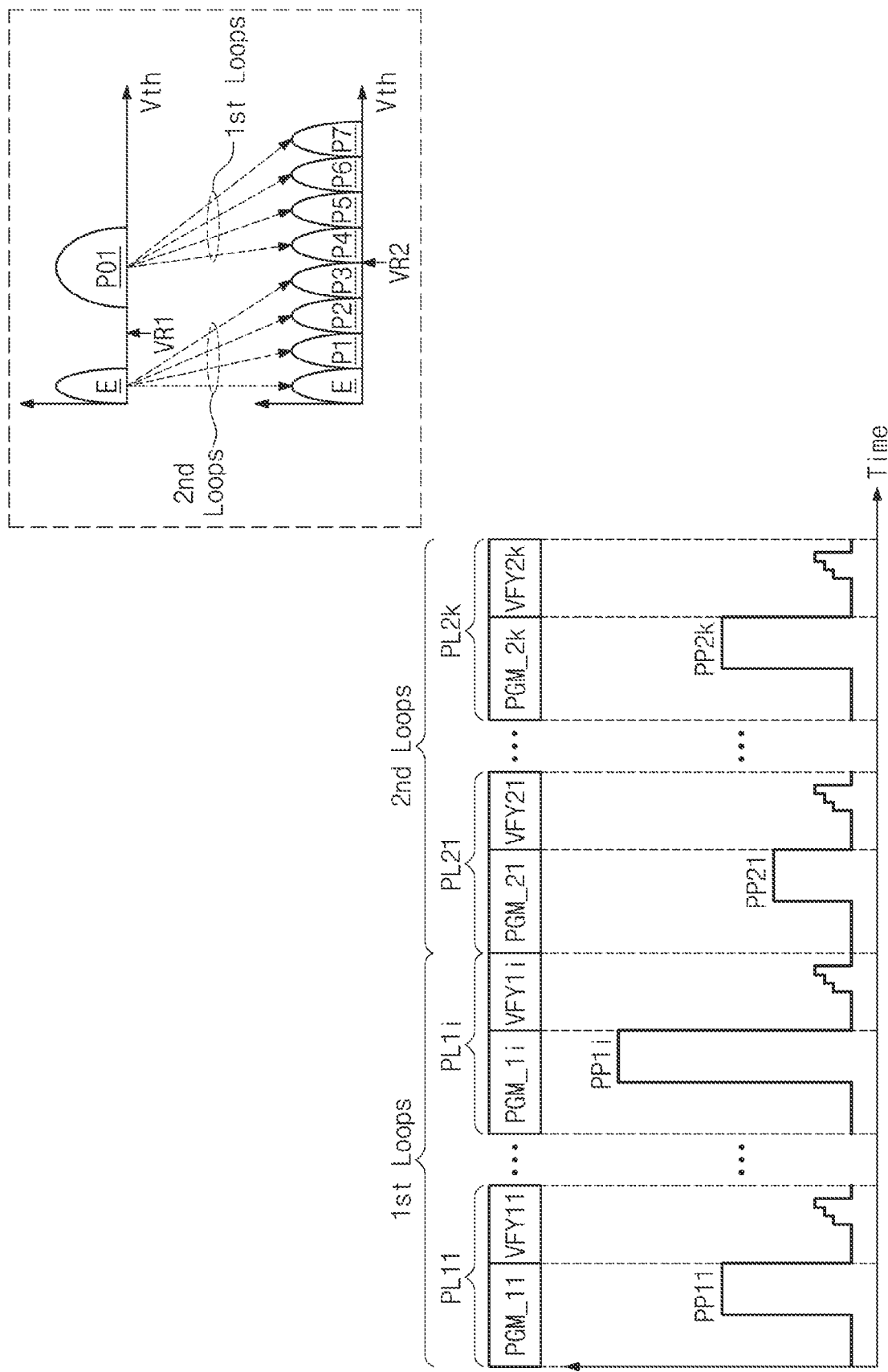

FIGS. 12A and 12B are diagrams for describing operation S140 of FIG. 6 in detail. The selection program operation PGM_sel of the nonvolatile memory device 120 according to an embodiment of the inventive concept will be described with reference to FIGS. 12A and 12B.

Referring to FIGS. 1, 6, 12A, and 12B, after operation S130, the nonvolatile memory device 120 may perform operations S141b to S144b. Operations S141b to S144b may be included in operation S140 of FIG. 6.

In operation S141b, the nonvolatile memory device 120 performs the selection program operation PGM_sel on a selected wordline in compliance with a 2-step incremental step pulse programming (ISPP) scheme.

For example, as illustrated in FIG. 12B, the nonvolatile memory device 120 performs the selection program operation PGM_sel on the selected wordline by performing a plurality of program loops PL11 to PL1i and PL21 to PL2k. The plurality of program loops PL11 to PL1i and PL21 to PL2k include program phases PGM_11 to PGM_1i and PGM_21 to PGM_2k and verification phases VFY11 to VFY1i and VFY21 to VFY2k. In the program phases PGM_11 to PGM_1i and PGM_21 to PGM_2k, relevant program voltages PP11 to PP1i and PP21 to PP2k may be individually applied to the selected wordline; in the verification phases VFY11 to VFY1i and VFY21 to VFY2k, relevant verification voltages VFY11 to VFY1i and VFY21 to VFY2k may be individually applied to the selected wordline.

The plurality of program loops PL11 to PL1i and PL21 to PL2k may be divided into first program loops PL11 to PL1i and second program loops PL21 to PL2k. The first program loops PL11 to PL1i may be program loops for programming the second memory cells connected with the selected wordline, and the second program loops PL21 to PL2k may be program loops for programming the first memory cells connected with the selected wordline. That is, at least one or all of the program pulses PP11 to PP1i respectively applied in the first program loops PL11 to PL1i may be greater than at least one or all of the program pulses PP21 to PP2k respectively applied in the second program loops PL21 to PL2k. A verification voltage that is applied in each of the first program loops PL11 to PL1i may include at least one of verification voltages for verifying the fourth to seventh program states P4 to P7, and a verification voltage that is applied in each of the second program loops PL21 to PL2k may include at least one of verification voltages for verifying the first to third program states P1 to P3.

In an exemplary embodiment, the first program loops PL11 to PL1i are performed before the second program loops PL21 to PL2k. That is, the second memory cells of the selected wordline may be first programmed through the first program loops PL11 to PL1i, and then the first memory cells of the selected wordline may be programmed through the second program loops PL21 to PL2k. In this case, while the selection program operation PGM_sel is performed, the probability that a threshold voltage distribution of the first memory cells of the selected wordline and a threshold voltage distribution of the second memory cells of the selected wordline overlap each other may be very low.

The nonvolatile memory device 120 may perform operation S142b to determine whether a program failure has occurred. Operation S142b is similar to operation S142a, and thus, additional description will be omitted to avoid redundancy.

When the program failure occurs during the selection program operation PGM_sel associated with the selected wordline, in operation S143b, the nonvolatile memory device 120 performs a cell-counting operation on the selected wordline by using at least two reference different voltages.

In operation S144b, the nonvolatile memory device 120 selects one of cell-counting results of the cell counting operations to recover a page (i.e., a previous page) corresponding to a result of the previous page read operation RD_pre.

For example, as described above, when a program failure occurs while the first program loops PL11 to PL1i are performed, the first memory cells connected with the selected wordline may have the erase state "E". Accordingly, a previous page may be recovered through the cell-counting operation that is performed based on a first reference voltage VR1. Also, when a program failure occurs while the second program loops PL21 to PL2k are performed or after all program loops are performed, the second memory cells connected with the selected wordline may be in a state where programming is normally made to have one of the fourth to seventh program states P4 to P7. Accordingly, a previous page may be recovered through the cell-counting operation that is performed based on a second reference voltage VR2.

That is, when a program failure occurs while the nonvolatile memory device 120 performs the selection program operation PGM_sel in compliance with the 2-step ISPP scheme, a previous page may be recovered through at least two cell-counting operations. In an exemplary embodiment, the nonvolatile memory device 120 may select one of the first and second reference voltages VR1 and VR2 based on the number of times that a program loop is performed and may perform a cell-counting operation based on the selected reference voltage to recover a previous page.

Figure 13A:
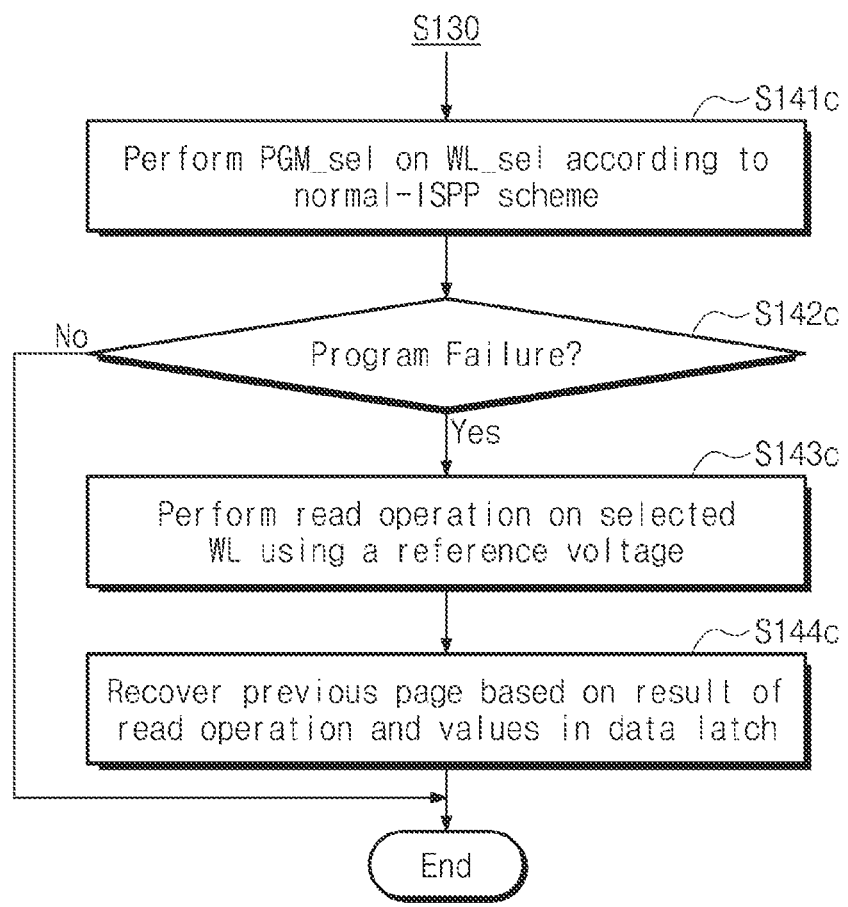

FIGS. 13A and 13B are diagrams for describing operation S140 of FIG. 6 in detail according to an exemplary embodiment of the inventive concept. The selection program operation PGM_sel of the nonvolatile memory device 120 according to an embodiment of the inventive concept will be described with reference to FIGS. 13A and 13B.

Referring to FIGS. 1, 6, 13A, and 13B, after operation S130, the nonvolatile memory device 120 may perform operations S141c to S144c. Operations S141c to S144c may be included in operation S140 of FIG. 6.

In operation S141c, the nonvolatile memory device 120 performs the selection program operation PGM_sel on a selected wordline in compliance with a normal incremental step pulse programming (ISPP) scheme.

In operation S142c, the nonvolatile memory device 120 determines whether a program failure occurs.

When the program failure occurs, in operation S143c, the nonvolatile memory device 120 performs a read operation on the selected wordline by using a reference voltage. In operation S144c, the nonvolatile memory device 120 recovers a previous page based on a value of a certain data latch and a result of the read operation.

For example, as illustrated in FIG. 13B, the nonvolatile memory device 120 may perform the previous page read operation RD_pre on the selected wordline by using a first reference voltage VRD01 and may read a previous page stored from the selected wordline. The previous page may be stored in the certain data latch (e.g., a 3rd latch) of the page buffer 123. Afterwards, the nonvolatile memory device 120 may perform the selection program operation PGM_sel on the selected wordline based on the first and second pages PD11 and PD12 and the previous page PDp stored in data latches of the page buffer 123.

The selection program operation PGM_sel may include a plurality of program loops, and a value of the previous page PDp may be changed depending on verification results of the plurality of program loops. In this case, when a program failure occurs, the nonvolatile memory device 120 may generate intermediate data DT by performing a read operation on the selected wordline by using a certain reference value VR1. The previous page PDp may be recovered by combining the generated intermediate data DT and information of a previous page PDp' changed depending on a verification result of a program loop.

Figure 14:
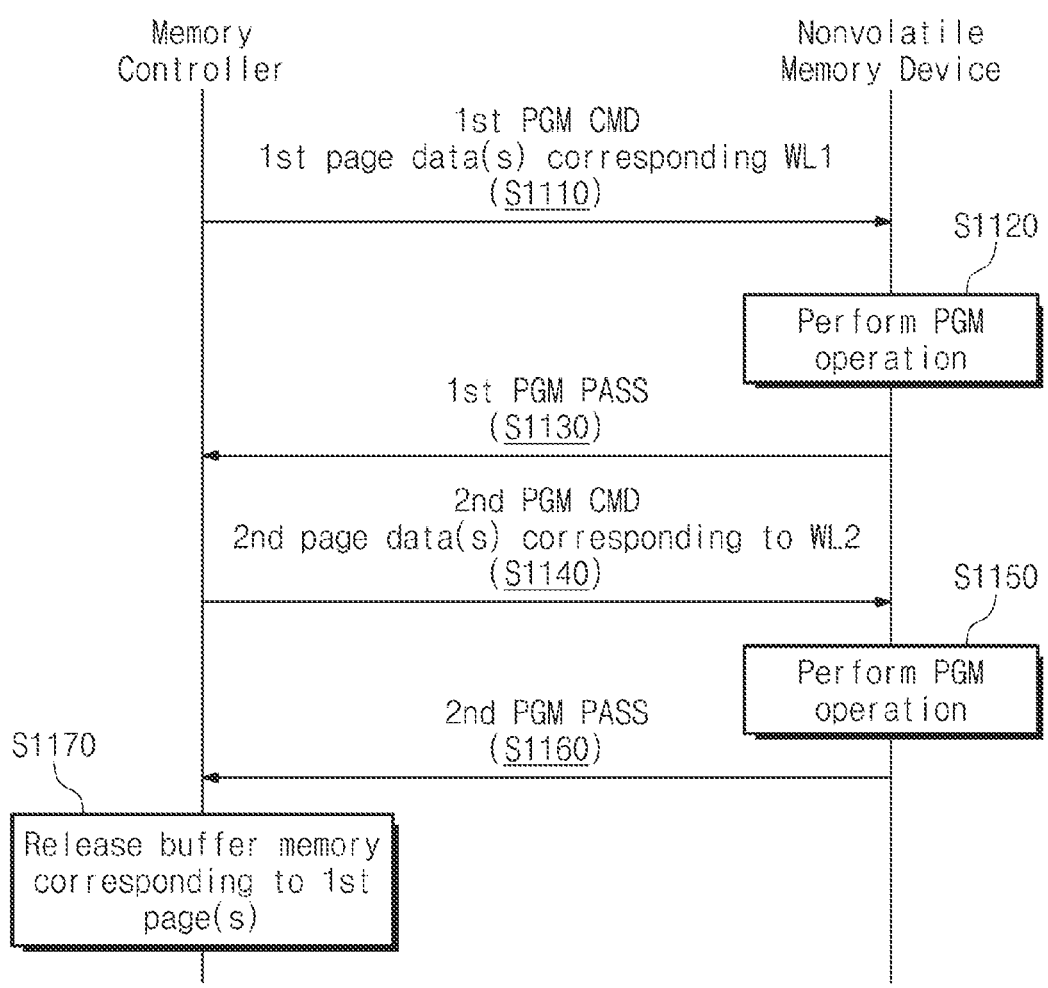
FIG. 14 is a flowchart illustrating an operation method of a storage device of FIG. 1 according to an exemplary embodiment of the inventive concept.

FIG. 14 is a flowchart illustrating an operation method of a storage device of FIG. 1 according to an exemplary embodiment of the inventive concept. As described above, when a program sequence associated with a selected wordline passes, the memory controller 110 may release a page corresponding to the selected wordline from a buffer memory. In this case, when a program failure occurs in a program sequence associated with a next wordline, a certain page may be lost. To prevent this issue, the memory controller 110 may maintain a page corresponding to a currently selected wordline in the buffer memory until the program sequence associated with the next wordline passes.

For example, referring to FIGS. 1 and 14, in operation S1110, the memory controller 110 transmits a first program command and a plurality of first pages corresponding to the first wordline WL1 to the nonvolatile memory device 120.

In operation S1120, the nonvolatile memory device 120 programs the plurality of first pages in compliance with the above-described program scheme. For example, the nonvolatile memory device 120 may perform the unselection program operation PGM_unsel on the second wordline WL2 (i.e., an unselected wordline in a current program operation) based on a part of the plurality of first pages and may perform the selection program operation PGM_sel on the first wordline WL1 (i.e., a selected wordline in the current program operation) based on the remaining page(s) (and a previous page). For convenience of description, it is assumed that all operations (i.e., the unselection program operation PGM_unsel and the selection program operation PGM_sel) corresponding to the first program command pass.

In operation S1130, the nonvolatile memory device 120 transmits information (e.g., status information), which indicates that the program sequence corresponding to the first program command passes, to the memory controller 110.

In operation S1140, the memory controller 110 transmits a second program command and a plurality of second pages corresponding to the second wordline WL2 to the nonvolatile memory device 120.

In operation S1150, the memory controller 110 programs the plurality of second pages in compliance with the above-described program scheme, and thus, additional description will be omitted to avoid redundancy. For convenience of description, it is assumed that all operations (i.e., the unselection program operation PGM_unsel and the selection program operation PGM_sel) corresponding to the second program command pass.

In operation S1160, the nonvolatile memory device 120 transmits information (e.g., status information), which indicates that the program sequence corresponding to the second program command passes, to the memory controller 110.

In operation S1170, the nonvolatile memory device 120 releases a buffer memory corresponding to the plurality of first pages in response to the information (e.g., status information) indicating the program operation corresponding to the second program command passes. For example, when a program failure occurs while a program operation associated with the second wordline WL2 is performed in operation S1150, page(s) stored at the second wordline WL2 from among the plurality of first pages may be lost. However, because the memory controller 110 maintains pages corresponding to a previous program operation until the program operation corresponding to the second program command passes, the memory controller 110 is able to recover a previous page.

Figure 15:
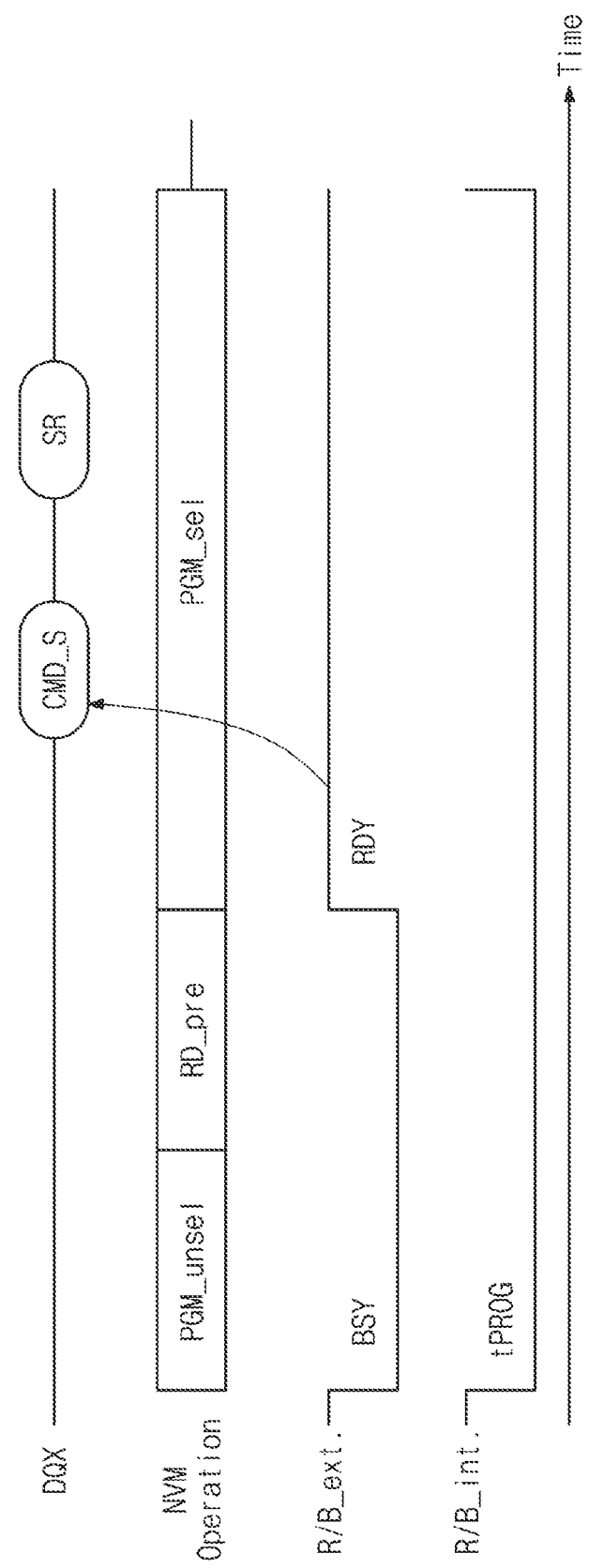
FIG. 15 is a timing diagram illustrating an operation of a storage device of FIG. 1 according to an exemplary embodiment of the inventive concept.

FIG. 15 is a timing diagram illustrating an operation of a storage device of FIG. 1 according to an exemplary embodiment of the inventive concept. Referring to FIGS. 1 and 15, the nonvolatile memory device 120 of the inventive concept performs the unselection program operation PGM_unsel, the previous page read operation RD_pre, and the selection program operation PGM_sel during the program time tPROG. As described above, a previous page may be read from a selected wordline through the previous page read operation RD_pre.

After the previous page read operation RD_pre has completed, the nonvolatile memory device 120 may allow an external busy signal R/B_ext to transition to a ready state RDY. The memory controller 110 may transmit a status read command CMD_S to the nonvolatile memory device 120 in response to the external busy signal R/B_ext of the ready state RDY. The nonvolatile memory device 120 may transmit status information SR including a previous page to the memory controller 110 in response to the status read command CMD_S. The memory controller 110 may maintain the received previous page until the current selection program operation PGM_sel passes. In this case, even though a program failure occurs in the selection program operation PGM_sel, because the memory controller 110 maintains the previous page, the previous page is able to be recovered.

In an exemplary embodiment, even though the external busy signal R/B_ext transitions to the ready state RDY, because an internal busy signal R/B_int is in a busy state (i.e., during tPROG), the memory controller 110 does not perform a separate operation of the nonvolatile memory device 120. Here, an operation corresponding to a certain command such as a status read command may be excluded from the separate operation.

Figure 16:
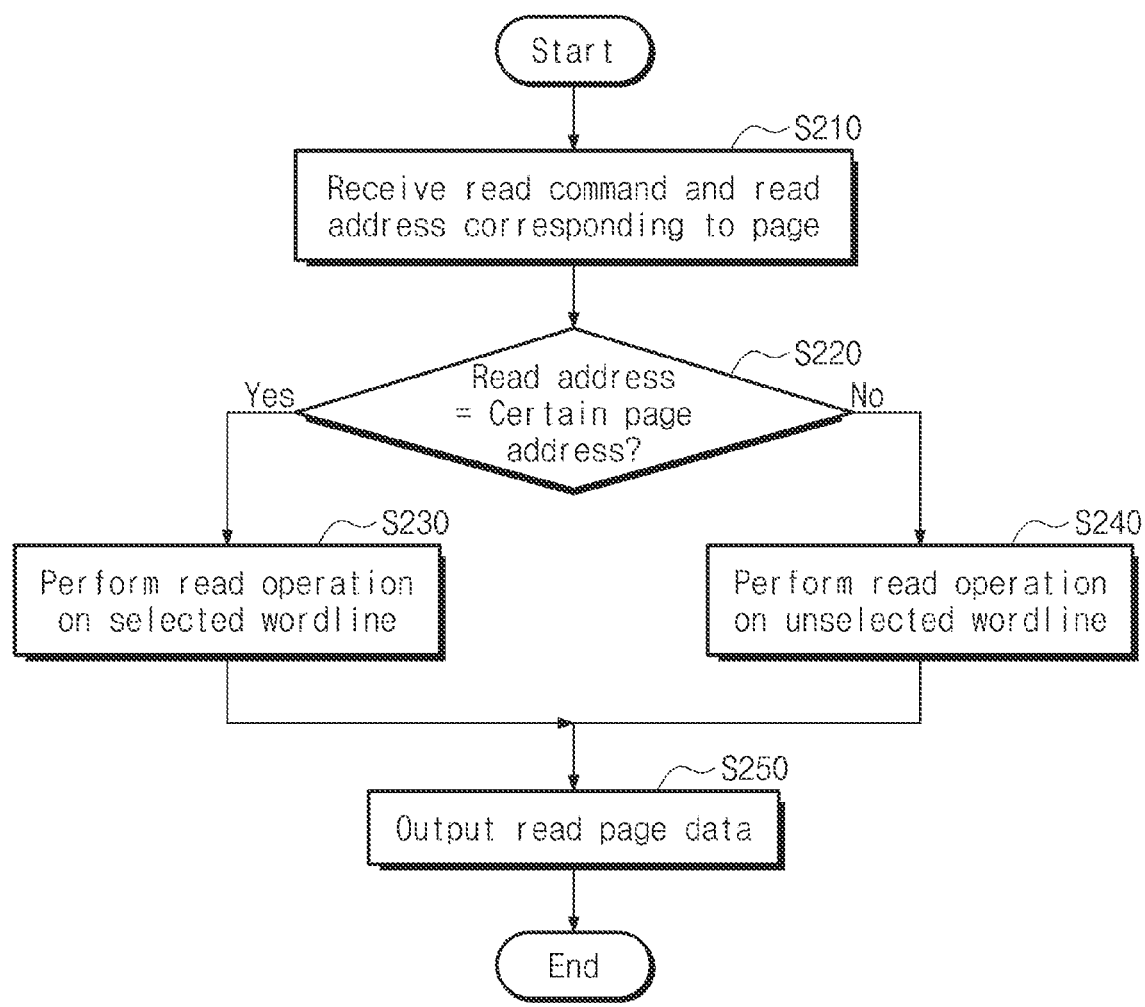
FIG. 16 is a flowchart illustrating a read operation of a nonvolatile memory device of FIG. 1 according to an exemplary embodiment of the inventive concept.

FIG. 16 is a flowchart illustrating a read operation of a nonvolatile memory device of FIG. 1 according to an exemplary embodiment of the inventive concept. Below, for convenience of description, it is assumed that the nonvolatile memory device 120 programs a plurality of pages in compliance with the above-described program scheme. That is, each of a plurality of wordlines of the nonvolatile memory device 120 may store a relevant page and an irrelevant page (or a page corresponding to an irrelevant wordline or a previous page).

Referring to FIGS. 1 and 16, in operation S210, the nonvolatile memory device 120 receives a read command a read address corresponding to a page (i.e., read data) from the memory controller 110. For example, the nonvolatile memory device 120 may read data from a selected wordline in the unit of a page. That is, in the case where three pages are written at one wordline, the nonvolatile memory device 120 may individually read three pages from one wordline.

In operation S220, the nonvolatile memory device 120 determines whether a read address corresponds to a certain page. For example, the read address may include information indicating whether the read address corresponds to any page in the selected wordline. In detail, in the case where three pages are stored at one wordline, the three pages may include an LSB page, a CSB page, and an MSB page. The read address may include a physical address of the selected wordline; and information about whether a read page corresponds to any of the LSB page, the CSB page, and the MSB page.

It is assumed that the MSB page is programmed at an unselected wordline in compliance with the program scheme according to an embodiment of the inventive concept. In this case, the nonvolatile memory device 120 may determine whether the received read address corresponds to an MSB page address. However, the inventive concept is not limited thereto. For example, a certain page address may be determined by a page that is programmed by the unselection program operation PGM_unsel.

When the read address does not correspond to the certain page, in operation S230, the nonvolatile memory device 120 performs a read operation (hereinafter referred to as a "selected read operation") on the selected wordline.

When the read address corresponds to the certain page, in operation S240, the nonvolatile memory device 120 performs a read operation (hereinafter referred to as an "unselected read operation") on the unselected wordline. For example, it is assumed that the selected wordline corresponding to the read address is a first wordline and a page corresponding to the read address is the MSB page (i.e., the certain page). In this case, the page corresponding to the read address (i.e., the MSB page corresponding to the first wordline) may be in the state of being stored at a second wordline (i.e., the unselected wordline), and not the first wordline. As such, the nonvolatile memory device 120 may perform the unselection program operation PGM_unsel on the unselected wordline for the purpose of reading the page corresponding to the read address.

In operation S250, the nonvolatile memory device 120 outputs the page read through the selection program operation PGM_sel or the unselection program operation PGM_unsel.

As described above, the nonvolatile memory device 120 according to an exemplary embodiment of the inventive concept reads the certain page by performing the unselection program operation PGM_unsel on the unselected wordline, not the selected wordline.

Figure 17:
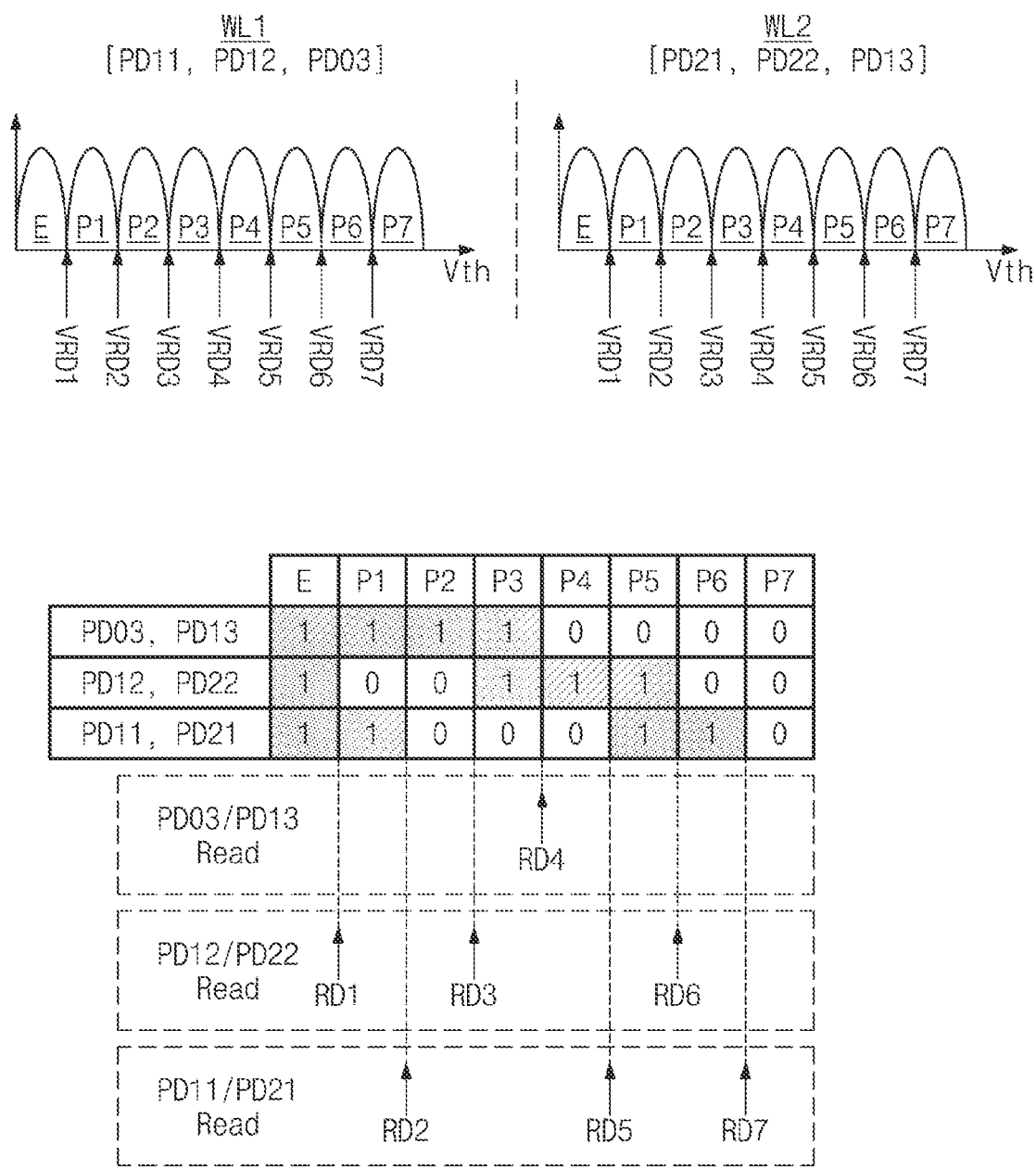
FIG. 17 is a diagram for describing a read operation according to a flowchart of FIG. 16 according to an exemplary embodiment of the inventive concept.

FIG. 17 is a diagram for describing a read operation according to a flowchart of FIG. 16. Referring to FIGS. 1 and 17, the first wordline WL1 stores two pages PD11 and PD12 corresponding to the first wordline WL1 and one page PD03 corresponding to a wordline different from the first wordline WL1. The second wordline WL2 may store two pages PD21 and PD22 corresponding to the second wordline WL2 and one page PD13 corresponding to the first wordline WL1. Pages stored at the first and second wordlines WL1 and WL2 and operations for programming the pages are described above, and thus, additional description will be omitted to avoid redundancy.

Each of memory cells connected with each of the first and second wordlines WL1 and WL2 may have one of the erase state "E" and the first to seventh program states P1 to P7. For example, when values of the pages PD03, PD12, and PD11 corresponding to a first memory cell connected with the first wordline WL1 are [1, 1, 1], the first memory cell is programmed to have the erase state "E". Likewise, when values of the pages PD13, PD22, and PD21 corresponding to a second memory cell connected with the second wordline WL2 are [0, 1, 0], the second memory cell is programmed to have the fourth program state P4. Bit-ordering for remaining program states is illustrated in FIG. 17, and thus, additional description will be omitted to avoid redundancy.

In an exemplary embodiment, the nonvolatile memory device 120 may receive a read command for the first page PD11 corresponding to the first wordline WL1. In this case, the nonvolatile memory device 120 may read the first page PD11 corresponding to the first wordline WL1 by performing the selected read operation on the first wordline WL1 by using second, fifth, and seventh read voltages RD2, RD5, and RD7.

Likewise, when the nonvolatile memory device 120 receives a read command for the second page PD12 corresponding to the first wordline WL1, the nonvolatile memory device 120 may read the second page PD12 corresponding to the first wordline WL1 by performing the selected read operation on the first wordline WL1 by using first, third, and sixth read voltages RD1, RD3, and RD6.

The nonvolatile memory device 120 may receive a read command for the third page PD13 corresponding to the first wordline WL1. As described above, the third page PD13 corresponding to the first wordline WL1 may be in the state of being stored at the second wordline WL2. In this case, the nonvolatile memory device 120 may read the third page PD13 corresponding to the first wordline WL1 by performing the unselected read operation on the second wordline WL2 being an unselected wordline by using a fourth read voltage RD4.

As described above, the nonvolatile memory device 120 according to an embodiment of the inventive concept may read a certain page by performing the unselected read operation on the unselected wordline, and not the selected wordline.

Figure 18:
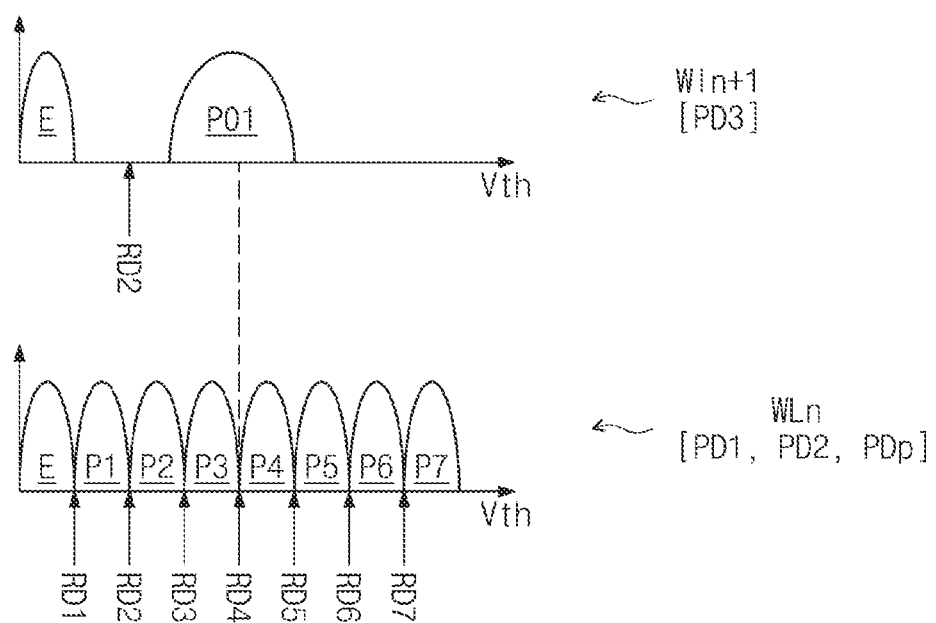
FIG. 18 is a diagram for describing a state of an open wordline or a last wordline of a nonvolatile memory device of FIG. 1 according to an exemplary embodiment of the inventive concept.

FIG. 18 is a diagram for describing a state of an open wordline or the last wordline of a nonvolatile memory device of FIG. 1. In distributions of FIG. 18, a horizontal axis represents a threshold voltage of a memory cell, and a vertical axis represents the number of memory cells.

Referring to FIGS. 1 and 18, three pages PD1, PD2, and PD3 correspond to an n-th wordline WLn. According to the program scheme described with reference to FIGS. 1 to 15, the nonvolatile memory device 120 programs one page PD3 of the three pages PD1, PD2, and PD3 at an (n+1)-th wordline WLn+1 different from the n-th wordline WLn (i.e., may perform the unselection program operation PGM_unsel) and programs the remaining two pages PD1 and PD2 and a previously stored page PDp at the n-th wordline WLn (i.e., may perform the selection program operation PGM_sel).

In an exemplary embodiment, after the memory controller 110 transmits the pages PD1, PD2, and PD3 corresponding to the n-th wordline WLn to the nonvolatile memory device 120, the memory controller 110 does not transmit pages corresponding to another wordline (e.g., WLn+1) to the nonvolatile memory device 120. In other words, the n-th wordline WLn is the last wordline of the memory block BLK including the n-th and (n+1)-th wordlines WLn and WLn+1. In this case, a certain page (i.e., PD3) corresponding to the n-th wordline being the last wordline is stored at the (n+1)-th wordline WLn+1, and memory cells connected with the (n+1)-th wordline WLn+1 have a threshold voltage distribution (i.e., "E" or "P01") as illustrated in FIG. 18. Accordingly, in the case where a certain page corresponding to the last wordline of the memory block BLK is read by using the fourth read voltage RD4 as described above, the certain page cannot be normally read. In this case, a separate read scheme may be required. A method where the nonvolatile memory device 120 according to an embodiment of the inventive concept reads a certain page corresponding to the last wordline will be more fully described with reference to accompanying drawings.

Figure 19:
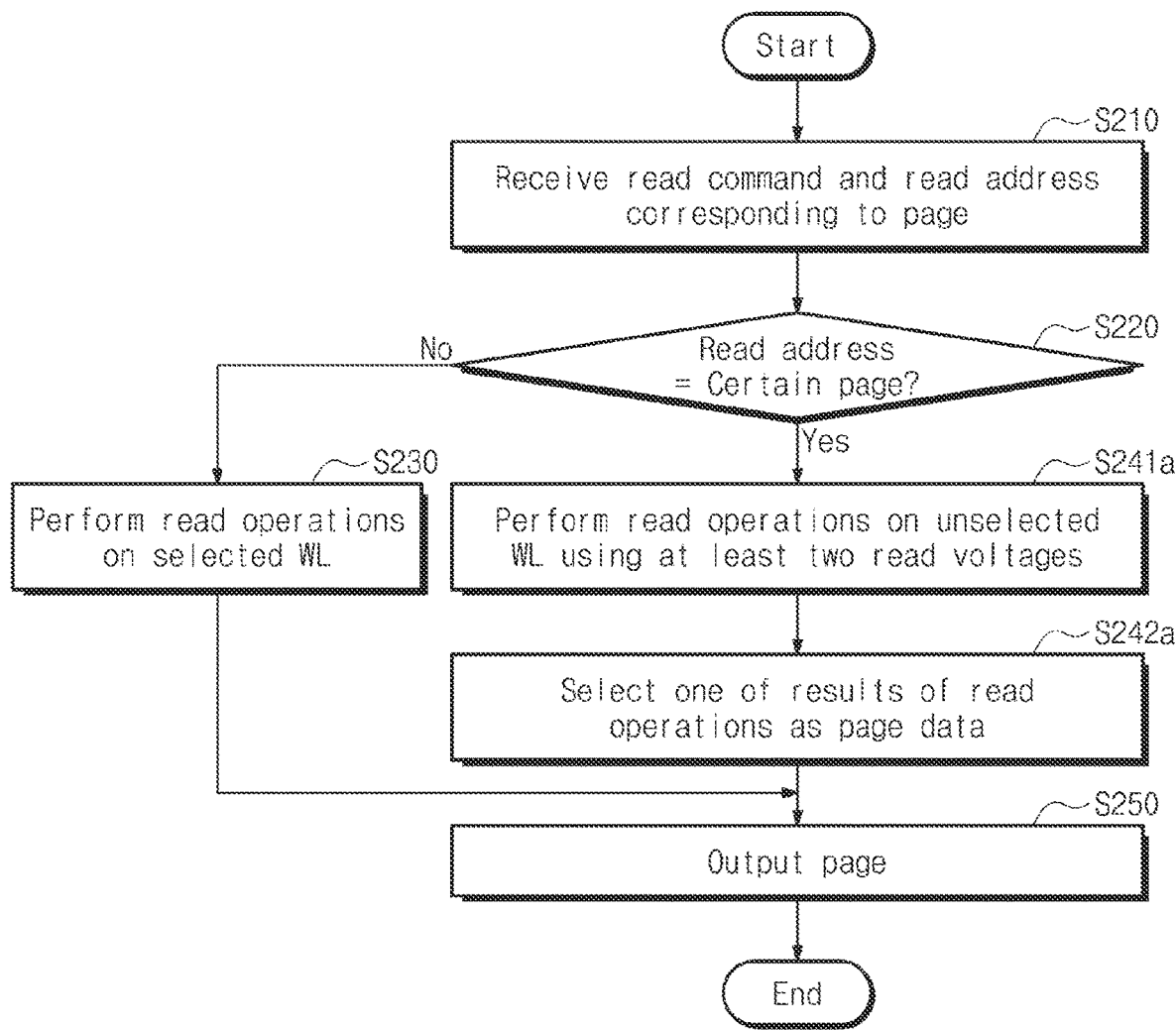
FIG. 19 is a flowchart for describing an unselected read operation of a nonvolatile memory device of FIG. 1 in detail according to an exemplary embodiment of the inventive concept.

FIG. 19 is a flowchart for describing an unselected read operation of a nonvolatile memory device of FIG. 1 in detail according to an exemplary embodiment of the inventive concept. Referring to FIGS. 1, 18, and 19, the nonvolatile memory device 120 may perform operation S210, operation S220, operation S230, and operation S250. Operation S210, operation S220, operation S230, and operation S250 are described with reference to FIG. 16, and thus, additional description will be omitted to avoid redundancy.

When the determination result of operation S220 indicates that the read address corresponds to the certain page, the nonvolatile memory device 120 performs the unselected read operation through operation S241a and operation S242a.

In operation S241a, the nonvolatile memory device 120 performs the unselected read operation on the unselected wordline based on at least two read voltages. For example, as illustrated in FIG. 17, when the unselected wordline is the first wordline WL1, the certain page (i.e., PD13) corresponding to the first wordline WL1 may be in the state of being stored at the second wordline WL2. In this case, the certain page PD13 may be read by performing the unselected read operation on the second wordline WL2 by using the fourth read voltage RD4.

In contrast, as illustrated in FIG. 18, when the selected wordline is the n-th wordline WLn and the n-th wordline WLn is the last wordline of the memory block BLK, the certain page (i.e., PD13) corresponding to the n-th wordline WLn may be in the state of being stored at the (n+1)-th wordline WLn+1. In this case, it may be impossible to read the certain page PD3 by using the fourth read voltage RD4. The nonvolatile memory device 120 may read the certain page PD3 by performing the unselected read operation on the (n+1)-th wordline WLn+1 by using a different read voltage (e.g., RD2).

That is, when the read address corresponds to the certain page, the nonvolatile memory device 120 may perform the unselected read operation on the unselected wordline by using at least two read voltages (RD2 and RD4 in the above embodiments).

In operation S242a, the nonvolatile memory device 120 may select one of the results of the read operations as a page. For example, as described above, data to be stored in the nonvolatile memory device 120 may be randomized by the memory controller 110 (in detail, the data processing circuit 113). That is, a page may be selected by comparing the number of "ON" cells and the number of "OFF" cells in each of the results of the read operations.

In detail, as illustrated in FIG. 18, it is assumed that the unselected read operation is performed on the (n+1)-th wordline WLn+1 by using the second and fourth read voltages RD2 and RD4. With regard to a result of the unselected read operation performed by using the second read voltage RD2, the number of "ON" cells and the number of "OFF" cells may be substantially the same, or a difference between the number of "ON" cells and the number of "OFF" cells may be a reference value or less. In contrast, with regard to a result of the unselected read operation performed by using the fourth read voltage RD4, a difference between the number of "ON" cells and the number of "OFF" cells may be greater than the reference value. In this case, the nonvolatile memory device 120 may select the result of the unselected read operation performed by using the second read voltage RD2 as a read page. In an exemplary embodiment, the reference value may be determined by the error correction capability of the ECC engine 114 of the memory controller 110.

As described above, in a read operation associated with a certain page (i.e., a page programmed at an unselected wordline), the nonvolatile memory device 120 may perform unselected read operations by using at least two read voltages and may select one of the results of the unselected read operations so as to be output as a certain page.

Figure 20:
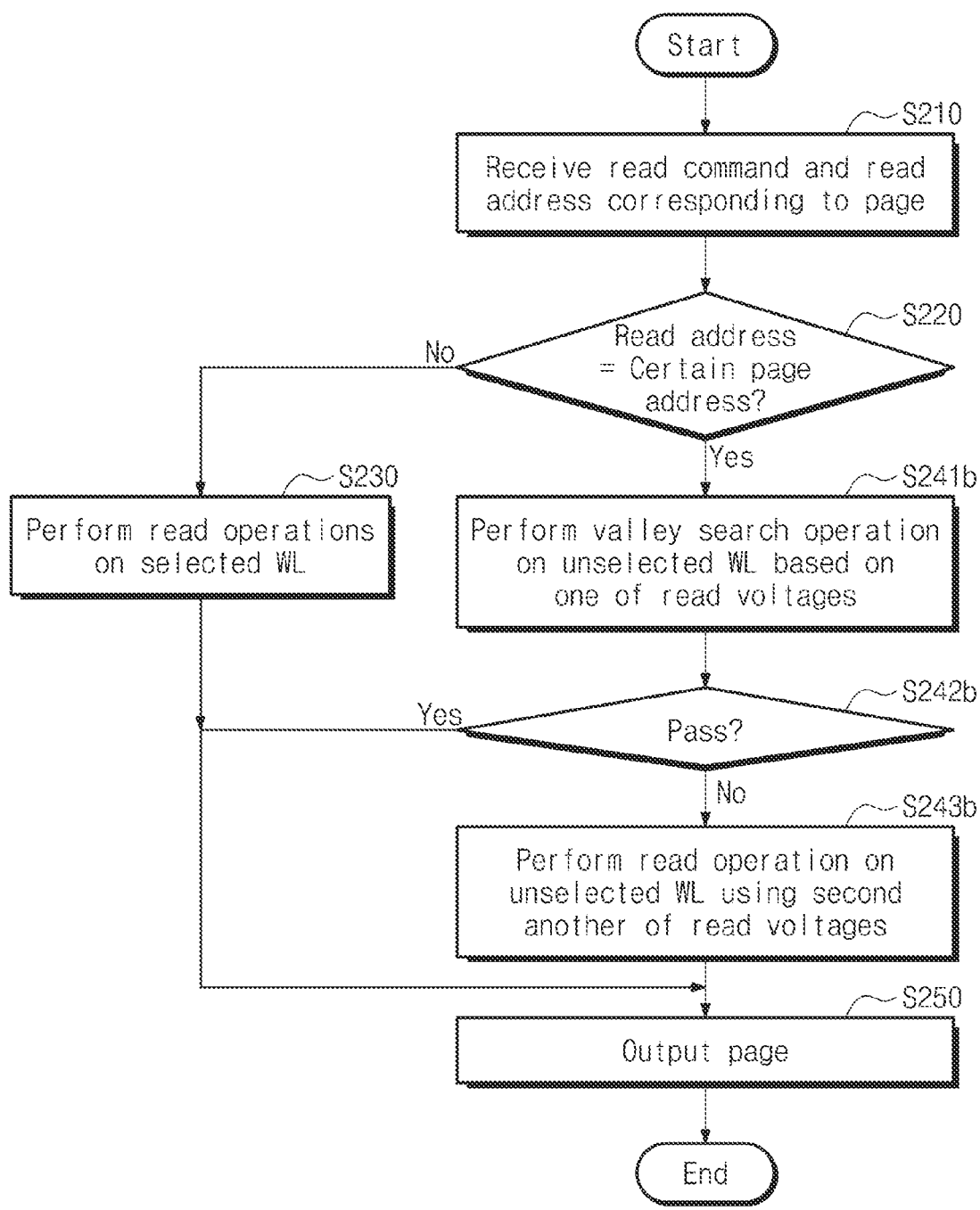
FIG. 20 is a flowchart for describing an unselected read operation of a nonvolatile memory device of FIG. 1 in detail according to an exemplary embodiment of the inventive concept.

FIG. 20 is a flowchart for describing an unselected read operation of a nonvolatile memory device of FIG. 1 in detail according to an exemplary embodiment of the inventive concept. Referring to FIGS. 1, 18, and 20, the nonvolatile memory device 120 may perform operation S210, operation S220, operation S230, and operation S250. Operation S210, operation S220, operation S230, and operation S250 are described with reference to FIG. 16, and thus, additional description will be omitted to avoid redundancy. When the read address corresponds to the certain page, the nonvolatile memory device 120 may perform operations S241b to S243b.

In operation S241b, the nonvolatile memory device 120 performs a valley search operation on the unselected wordline based on at least one of a plurality of read voltages. In an exemplary embodiment, the valley search operation indicates an operation of finding a valley of a threshold voltage distribution formed by the memory cells based on a reference voltage. For example, the nonvolatile memory device 120 may read memory cells connected with the unselected wordline by using one (for convenience of description, it is assumed that one voltage is the fourth read voltage RD4) of the plurality of read voltages. Afterwards, the nonvolatile memory device 120 may read the memory cells connected with the unselected wordline by using a first voltage smaller than the fourth read voltage RD4 as much as a given level and a second voltage greater than the fourth read voltage RD4 as much as the given level. In an exemplary embodiment, the first voltage is smaller than the fourth read voltage RD4 and is greater than the third read voltage RD3. In an embodiment, the second voltage is greater than the fourth read voltage RD4 and is smaller than the fifth read voltage RD5.

Afterwards, the nonvolatile memory device 120 may find a valley of a threshold voltage distribution formed by unselected memory cells by comparing or combining results of the read operations. In an exemplary embodiment, the valley search operation in operation S241b may be automatically performed by the nonvolatile memory device 120 under control of the memory controller 110.

In operation S242b, the nonvolatile memory device 120 determines whether the valley search operation passes. For example, that the valley search operation passes indicates that the valley of the threshold voltage distribution formed by the unselected memory cells is found. In this case, a certain page may be read by performing the unselected read operation by using a voltage corresponding to the found valley. In this case, the nonvolatile memory device 120 may omit operation S243b.

In contrast, when the valley search operation fails, the certain page cannot be read. In this case, in operation S243b, the nonvolatile memory device 120 performs the unselected read operation on the unselected wordline by using another of the plurality of read voltages. For example, as described above, when the valley search operation performed based on the fourth read voltage RD4 fails, the unselected wordline may have a distribution corresponding to the (n+1)-th wordline WLn+1 illustrated in FIG. 18. In this case, the certain page may be read by performing the read operation on the unselected wordline by using the second read voltage RD2 different from the fourth read voltage RD4.

Figure 21:
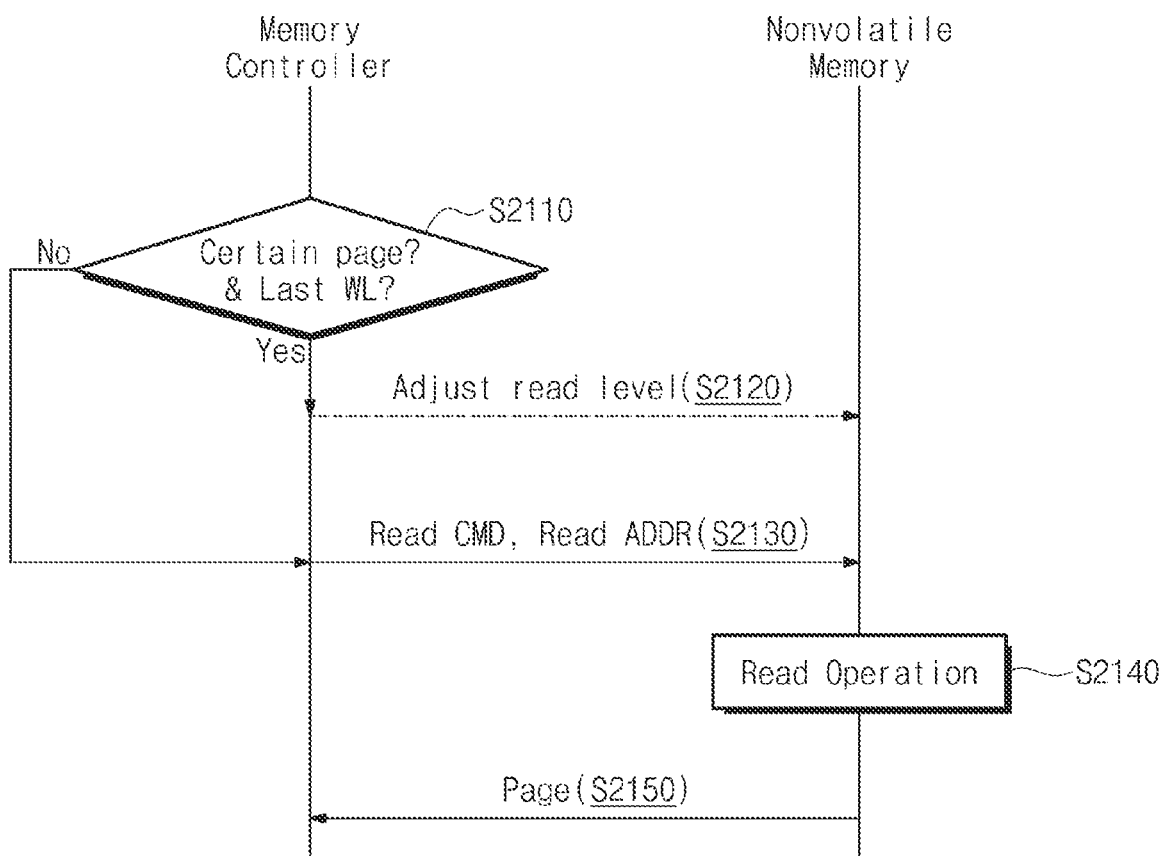
FIG. 21 is a flowchart illustrating an operation method of a storage device of FIG. 1 according to an exemplary embodiment of the inventive concept.

FIG. 21 is a flowchart illustrating an operation method of a storage device of FIG. 1, according to an exemplary embodiment of the inventive concept. Referring to FIGS. 1 and 21, in operation S2110, the memory controller 110 determines whether a page targeted for a read operation corresponds to a certain page or the last wordline. For example, the memory controller 110 may manage physical locations or physical addresses of a plurality of pages stored in the nonvolatile memory device 120. This management operation may be performed by the flash translation layer FTL (refer to FIG. 2) that is executed by the memory controller 110. The flash translation layer FTL of the memory controller 110 may determine a physical location of the page targeted for the read operation (i.e., whether the page targeted for the read operation is the certain page and corresponds to the last wordline).

When the page targeted for the read operation is not the certain page (e.g., is "PD13" corresponding to the first wordline WL1 of FIG. 17) or does not correspond to the last wordline, the memory controller 110 performs operation S2130.

When the page targeted for the read operation is the certain page (e.g., is "PD3" of FIG. 18) or corresponds to the last wordline, in operation S2120, the memory controller 110 adjusts a level of a read voltage of the nonvolatile memory device 120.

In operation S2130, the memory controller 110 transmits a read command and a read address to the nonvolatile memory device 120. In operation S2140, the nonvolatile memory device 120 performs a read operation in response to the read command and the read address. For example, as described with reference to FIG. 16, the nonvolatile memory device 120 may perform the selected read operation on a selected wordline when the read address does not correspond to a certain page and may perform the unselected read operation on an unselected wordline when the read address corresponds to the certain page. In an exemplary embodiment, when the level of the read voltage is adjusted by the memory controller 110 in operation S2120, the nonvolatile memory device 120 performs the unselected read operation on the unselected wordline by using the read voltage of the adjusted level. In operation S2150, the nonvolatile memory device 120 transmits the read page to the memory controller 110.

As described above, the memory controller 110 of the storage device 100 according to an exemplary embodiment of the inventive concept may manage a physical location of a page targeted for a read operation and may selectively adjust a level of a read voltage of the nonvolatile memory device 120 based on the physical location of the page.

Figure 22:
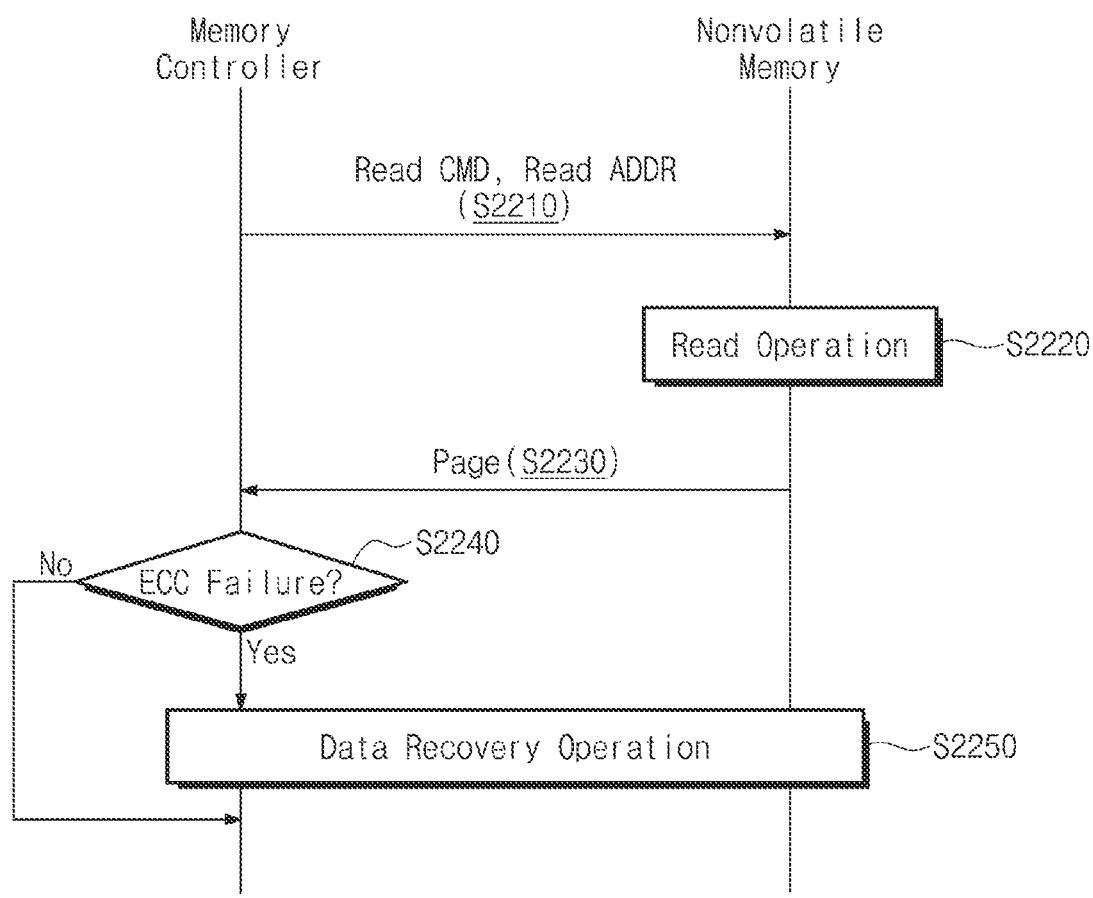
FIG. 22 is a flowchart illustrating an operation method of a storage device of FIG. 1 according to an exemplary embodiment of the inventive concept.

FIG. 22 is a flowchart illustrating an operation method of a storage device of FIG. 1 according to an exemplary embodiment of the inventive concept. Referring to FIGS. 1 and 22, in operation S2210, the memory controller 110 transmits a read command and a read address to the nonvolatile memory device 120.

In operation S2220, the nonvolatile memory device 120 performs a read operation. The read operation in operation S2220 is similar to the read operation described with reference to FIG. 16, and thus, additional description will be omitted to avoid redundancy. In operation S2230, the nonvolatile memory device 120 transmits the read page to the memory controller 110.

In operation S2240, the memory controller 110 performs an error correction operation on the page received from the nonvolatile memory device 120 and determines whether the error correction operation fails. For example, the ECC engine 114 (refer to FIG. 2) of the memory controller 110 may perform the error correction operation on the page received from the nonvolatile memory device 120.

When the page includes an error exceeding the error correction capability of the ECC engine 114, the memory controller 110 may determine that the error correction operation fails. In this case, in operation S2250, the memory controller 110 and the nonvolatile memory device 120 perform a data recovery operation. In an exemplary embodiment, the data recovery operation may include various data recovery operations such as a predefined table (PDT) and least read estimation (LRE). In an exemplary embodiment, when the read address indicates the certain page corresponding to the last wordline, an error of the page that is read by the read operation in operation S2220 may not be corrected by the ECC engine 114. In this case, the certain page corresponding to the read address may be normally read through the data recovery operation in operation S2250.

Figure 23A:
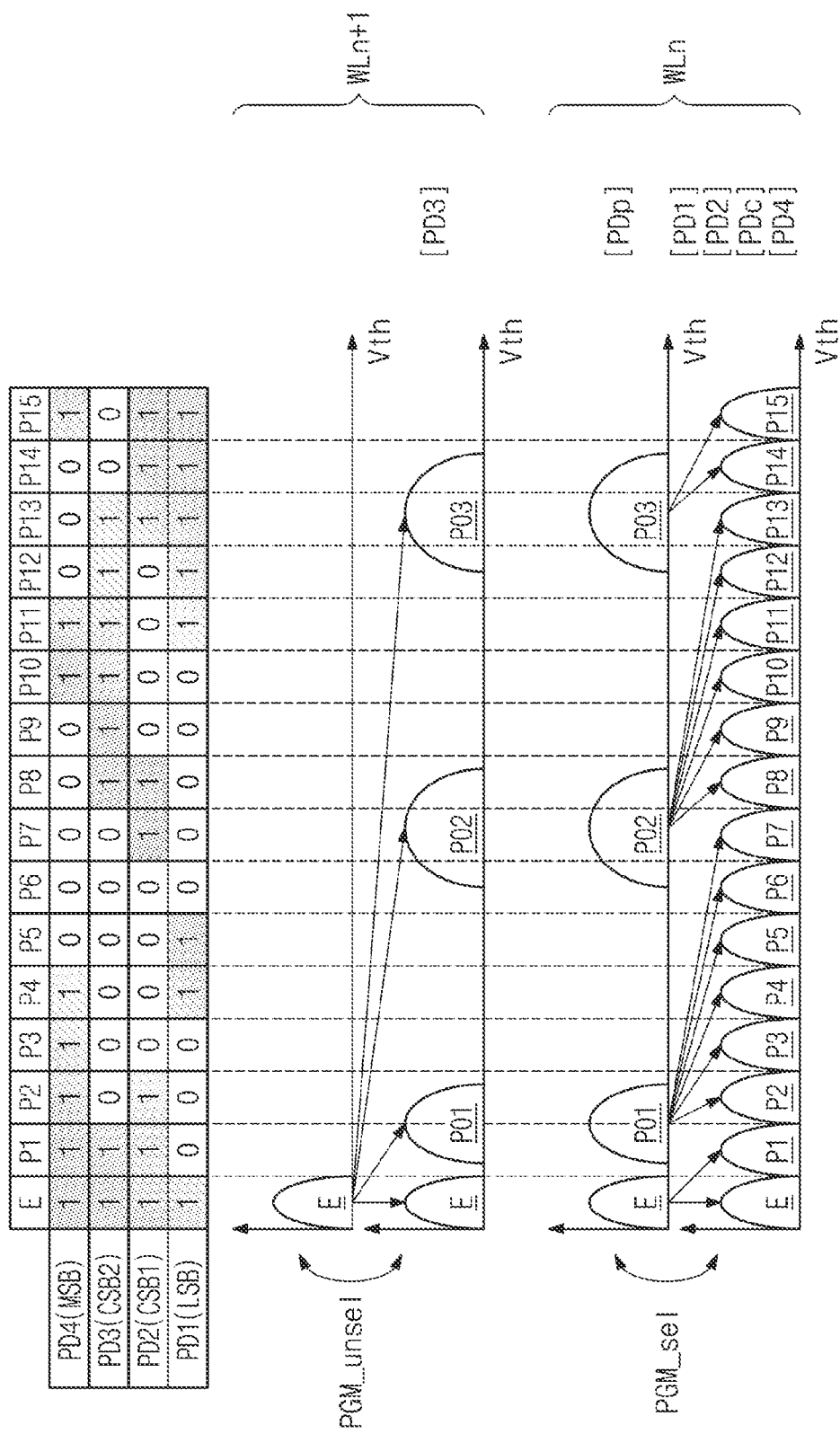
FIGS. 23A and 23B are diagrams for describing an operation of a nonvolatile memory device of FIG. 1 according to an exemplary embodiment of the inventive concept.
Figure 23B:
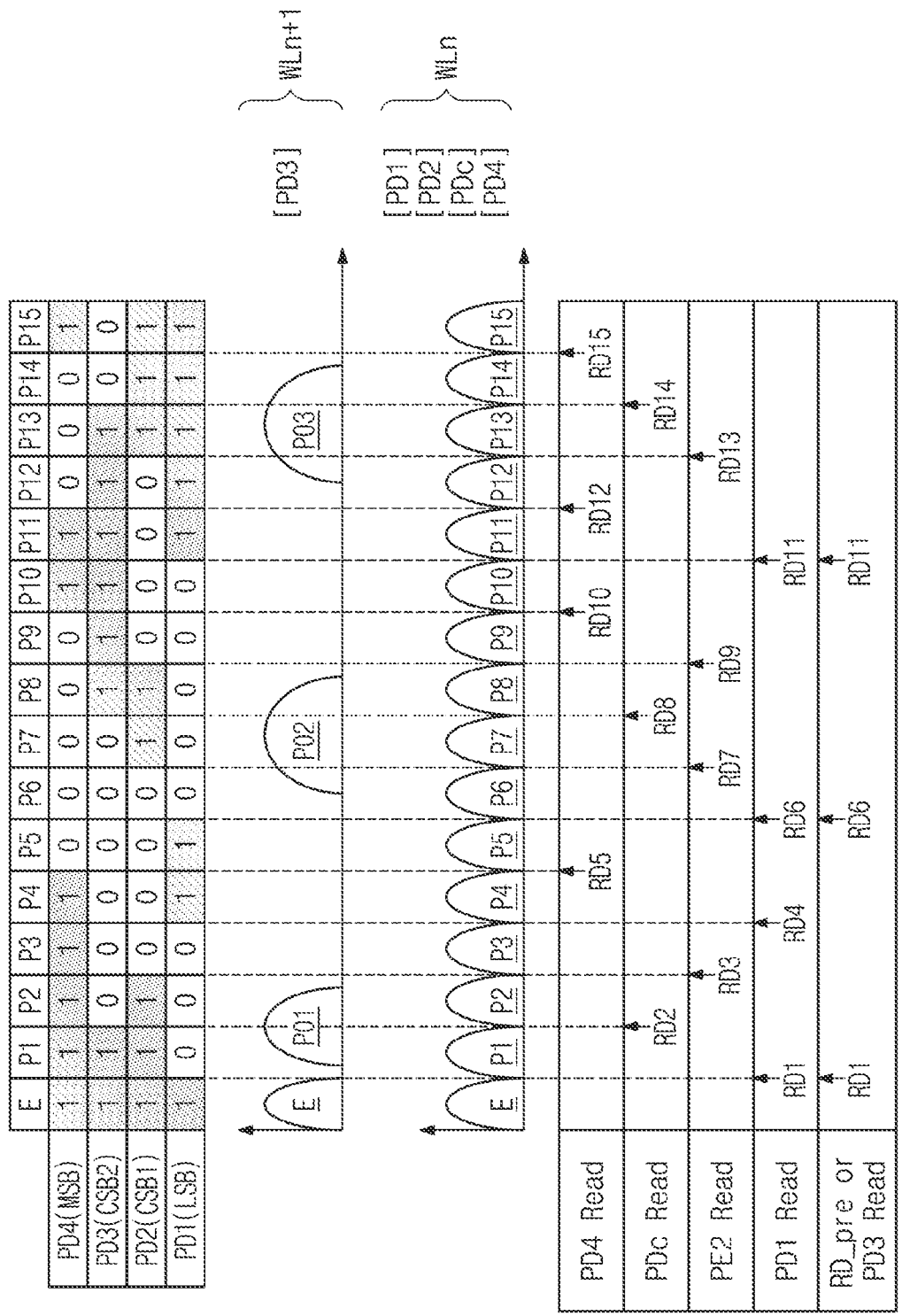

FIGS. 23A and 23B are diagrams for describing an operation of a nonvolatile memory device of FIG. 1 according to an exemplary embodiment of the inventive concept.

Embodiments in which each of a plurality of memory cells included in the nonvolatile memory device 120 is a triple level cell TLC (i.e., in which three pages are stored at one wordline) are described with reference to FIGS. 1 to 22, but the inventive concept is not limited thereto.

For example, each of the memory cells included in the nonvolatile memory device 120 according to an embodiment of the inventive concept may be implemented with a memory cell that stores at least two bits, for example, an MLC, a TLC, or a quad level cell (QLC), and the unselection program operation PGM_unsel may be performed on an unselected wordline based on at least one of a plurality of pages corresponding to a selected wordline.

In detail, referring to FIGS. 1 and 23A, the nonvolatile memory device 120 may be configured to store four pages PD1, PD2, PD3, and PD4 at one wordline. That is, each of the memory cells included in the nonvolatile memory device 120 may be the QLC that stores 4 bits.

In this case, each of memory cells connected with a wordline where a program operation has completed (in other words, where the selection program operation PGM_sel has completed) may be programmed to have one of the erase state "E" and a plurality of program states P1 to P15.

As in the above description, the nonvolatile memory device 120 may perform the unselection program operation PGM_unsel on an unselected wordline based on a part of a plurality of pages corresponding to a selected wordline.

For example, it is assumed that the n-th wordline WLn is the selected wordline and the first to fourth pages PD1 to PD4 correspond to the n-th wordline. The first to fourth pages PD1 to PD4 may include an LSB page, a first CSB page CSB1, a second CSB page CSB2, and an MSB page MSB. As in the above description, in this case, the nonvolatile memory device 120 may perform the unselection program operation PGM_unsel on the (n+1)-th wordline WLn+1 (i.e., the unselected wordline) based on at least one of the first to fourth pages PD1 to PD4.

Each of memory cells connected with the (n+1)-th wordline WLn+1 where the unselection program operation PGM_unsel is performed may have one of the erase state "E" and a plurality of program states P01 to P03. For example, the nonvolatile memory device 120 may program the memory cells connected with the (n+1)-th wordline WLn+1 such that 0-th memory cells have the erase state "E", first memory cells have the program state P01, second memory cells have the program state P02, and third memory cells have the program state P03.

The 0-th memory cells may indicate memory cells corresponding to the erase state "E" or the first program state P1 when programmed based on the first to fourth pages PD1 to PD4. The first memory cells may indicate memory cells corresponding to one of the second to seventh program states P2 to P7 when programmed based on the first to fourth pages PD1 to PD4. The second memory cells may indicate memory cells corresponding to one of the eighth to thirteenth program states P8 to P13 when programmed based on the first to fourth pages PD1 to PD4. The third memory cells may indicate memory cells corresponding to the fourteenth program state P14 or the fifteenth program state P15 when programmed based on the first to fourth pages PD1 to PD4.

In this case, an upper limit of a threshold voltage distribution of the program state P01 may be lower than an upper limit of a threshold voltage distribution of the second program state P2; an upper limit of a threshold voltage distribution of the program state P02 may be lower than an upper limit of a threshold voltage distribution of the eighth program state P8; and, an upper limit of a threshold voltage distribution of the program state P03 may be lower than an upper limit of a threshold voltage distribution of the fourteenth program state P14.

That is, as described above, as the unselection program operation PGM_unsel is performed on the (n+1)-th wordline WLn+1 being an unselected wordline, the third page PD3 of the first to fourth pages PD1 to PD4 may be stored at the (n+1)-th wordline WLn+1.

Afterwards, the nonvolatile memory device 120 may perform the previous page read operation RD_pre on the n-th wordline WLn for the purpose of reading a previous page PDc previously programmed at the n-th wordline WLn. For example, the nonvolatile memory device 120 may read the previous page PDc by determining states (i.e., E, P01, P02, and P03) of memory cells connected with the n-th wordline WLn by using a plurality of reference values. In an exemplary embodiment, according to the bit-ordering illustrated in FIG. 23A, a bit value of the previous page PDc corresponding to a memory cell determined to be the erase state "E" or the program state P02 through the previous page read operation RD_pre may be determined as "1"; a bit value of the previous page PDc corresponding to a memory cell determined to be one of the program states P01 and P03 through the previous page read operation RD_pre may be determined as "0".

Afterwards, the nonvolatile memory device 120 may perform the selection program operation PGM_sel on the n-th wordline WLn based on the remaining pages PD1, PD2, and PD4 and the previous page PDc. For example, the nonvolatile memory device 120 may perform the selection program operation PGM_sel on the n-th wordline WLn based on the remaining pages PD1, PD2, and PD4 and the previous page PDc, such that each of memory cells having the erase state "E" from among memory cells connected with the n-th wordline has one of the erase state "E" and the first program state P1, each of memory cells having the program state P01 has one of the second to seventh program states P2 to P7, each of memory cells having the program state P02 has one of the eighth to thirteenth program states P8 to P13, and each of memory cells having the program state P03 has one of the fourteenth and fifteenth program states P14 and P15.

Referring to FIGS. 1 and 23B, the nonvolatile memory device 120 may read a page by using a plurality of read voltages RD1 to RD15. For example, as described with reference to FIG. 16, when a read address does not correspond to a certain page (e.g., the second CSB page CSB2 in the embodiment of FIGS. 23A and 23B), the nonvolatile memory device 120 may perform the selected read operation on the selected wordline to read a relevant page. When the read address corresponds to the certain page (e.g., the second CSB page CSB2 in the embodiment of FIGS. 23A and 23B), the nonvolatile memory device 120 may perform the unselected read operation on the unselected wordline to read a relevant page.

In detail, when a read address for the first page PD1 corresponding to the n-th wordline WLn is received, the nonvolatile memory device 120 may read the first page PD1 from the n-th wordline WLn by performing the selected read operation on the n-th wordline WLn by using the first, fourth, sixth, and eleventh read voltages RD1, RD4, RD6, and RD11. When a read address for the second page PD2 corresponding to the n-th wordline WLn is received, the nonvolatile memory device 120 may read the second page PD2 from the n-th wordline WLn by performing the selected read operation on the n-th wordline WLn by using the third, seventh, ninth, and thirteenth read voltages RD3, RD7, RD9, and RD13. When a read address for the fourth page PD4 corresponding to the n-th wordline WLn is received, the nonvolatile memory device 120 may read the fourth page PD4 from the n-th wordline WLn by performing the selected read operation on the n-th wordline WLn by using the fifth, tenth, twelfth, and fifteenth read voltages RD5, RD10, RD12, and RD15.

When a read address for a page PDc (i.e., the certain page) corresponding to a wordline (not illustrated) different from the n-th wordline WLn is received, the nonvolatile memory device 120 may read the page PDc from the n-th wordline WLn by performing the unselected read operation on the n-th wordline WLn by using the second, eighth, and fourteenth read voltages RD2, RD8, and RD14.

In an exemplary embodiment, when the n-th wordline WLn is the last wordline of the memory block BLK and a read address for the third page PD3 corresponding to the n-th wordline WLn is received, the nonvolatile memory device 120 may read the third page PD3 from the (n+1)-th wordline WLn+1 by performing the unselected read operation on the (n+1)-th wordline WLn+1 by using the first, sixth, and eleventh read voltages RD1, RD6, and RD11.

In an exemplary embodiment, the previous page read operation RD_pre associated with the n-th wordline WLn may be similar to the unselected read operation performed on the (n+1)-th wordline WLn+1 for the purpose of reading the third page PD3.

In an exemplary embodiment, read voltages that are used in the previous page read operation RD_pre associated with the n-th wordline WLn or in the unselected read operation performed on the (n+1)-th wordline WLn+1 for the purpose of reading the third page PD3 are exemplary, and the inventive concept is not limited thereto. For example, the nonvolatile memory device 120 may perform the above-described operations by using various reference voltages for determining the erase state "E" and the plurality of program states P01 to P03.

In an exemplary embodiment, when the n-th wordline WLn is the last wordline of the memory block BLK and the read address indicates the certain page corresponding to the n-th wordline WLn, the nonvolatile memory device 120 or the memory controller 110 may read the certain page based on the operation described with reference to FIGS. 18 to 22.

Figure 24:
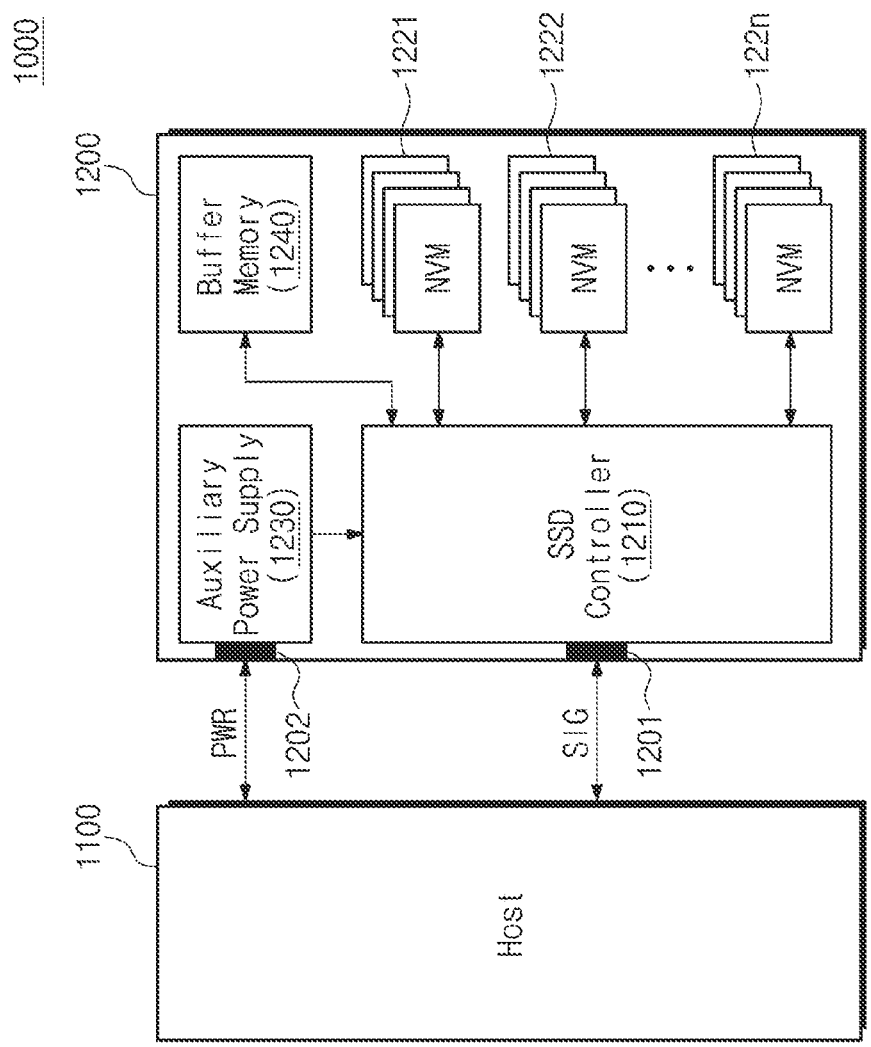
FIG. 24 is a block diagram illustrating a storage system to which a memory controller and a nonvolatile memory device according to an embodiment of the inventive concept are applied.

FIG. 24 is a block diagram illustrating a storage system to which a memory controller and a nonvolatile memory device according to an embodiment of the inventive concept may be applied. Referring to FIG. 24, a storage system 1000 includes a host 1100 and a storage device 1200.

The storage device 1200 exchanges a signal SIG with the host 1100 through a signal connector 1201 and is supplied with power PWR through a power connector 1202. The storage device 1200 includes a solid state drive (SSD) controller 1210, a plurality of nonvolatile memories 1221 to 122n, an auxiliary power supply 1230, and a buffer memory 1240. In an exemplary embodiment, each of the nonvolatile memories 1221 to 122n include the nonvolatile memory device 120 described with reference to FIGS. 1 to 22. That is, the nonvolatile memories 1221 to 122n may operate based on the program method, the data recovery method, and the read method described with reference to FIGS. 1 to 22.

The SSD controller 1210 may control the nonvolatile memories 1221 to 122n in response to the signal SIG received from the host 1100. The nonvolatile memories 1221 to 122n may operate under control of the SSD controller 1210. The auxiliary power supply 1230 is connected with the host 1100 through the power connector 1202. The auxiliary power supply 1230 may be charged by the power PWR supplied from the host 1100. When the power PWR is not smoothly supplied from the host 1100, the auxiliary power supply 1230 may power the storage device 1200. In an exemplary embodiment, the SSD controller 1210 may be the memory controller 110 described with reference to FIGS. 1 to 22.

According to an exemplary embodiment of the inventive concept, a nonvolatile memory device receives a plurality of pages corresponding to a selected wordline from a memory controller, programs at least one of the received pages at an unselected wordline, and programs the remaining page(s) at the selected wordline. In this case, the degradation of memory cells may decrease. Also, when a plurality of pages associated with the selected wordline are programmed through one program sequence, the performance of the nonvolatile memory device is improved. Accordingly, a nonvolatile memory device with improved reliability and improved performance and an operation method thereof are provided.

Figure 25:
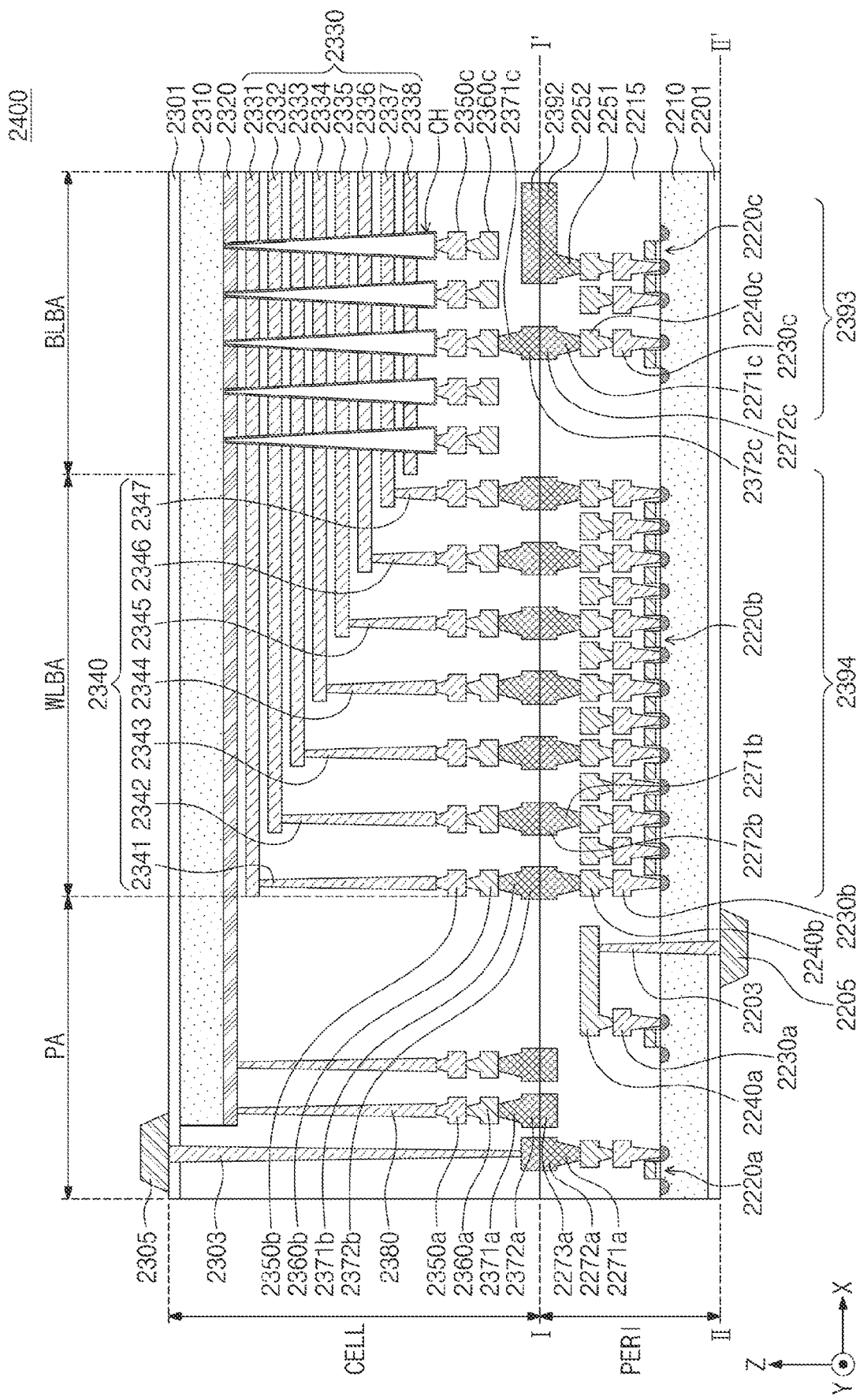
FIG. 25 is a diagram illustrating a nonvolatile memory device according to an exemplary embodiment of the inventive concept.

FIG. 25 is a diagram illustrating an exemplary nonvolatile memory device. Referring to FIG. 25, a memory device 2400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2400 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220a, 2220b, and 2220c formed on the first substrate 2210, first metal layers 2230a, 2230b, and 2230c respectively connected to the plurality of circuit elements 2220a, 2220b, and 2220c, and second metal layers 2240a, 2240b, and 2240c formed on the first metal layers 2230a, 2230b, and 2230c. In an example embodiment, the first metal layers 2230a, 2230b, and 2230c may be formed of tungsten having relatively high resistance, and the second metal layers 2240a, 2240b, and 2240c may be formed of copper having relatively low resistance.

In an example embodiment illustrate in FIG. 25, although the first metal layers 2230a, 2230b, and 2230c and the second metal layers 2240a, 2240b, and 2240c are shown and described, they are not limited thereto, and one or more metal layers may be further formed on the second metal layers 2240a, 2240b, and 2240c. At least a portion of the one or more metal layers formed on the second metal layers 2240a, 2240b, and 2240c may be formed of aluminum or the like having a lower resistance than those of copper forming the second metal layers 2240a, 2240b, and 2240c.

The interlayer insulating layer 2215 may be disposed on the first substrate 2210 and cover the plurality of circuit elements 2220a, 2220b, and 2220c, the first metal layers 2230a, 2230b, and 2230c, and the second metal layers 2240a, 2240b, and 2240c. The interlayer insulating layer 2215 may include an insulating material such as silicon oxide, silicon nitride, or the like.

Lower bonding metals 2271b and 2272b may be formed on the second metal layer 2240b in the word line bonding area WLBA. In the word line bonding area WLBA, the lower bonding metals 2271b and 2272b in the peripheral circuit region PERI may be electrically connected to upper bonding metals 2371b and 2372b in the cell region CELL in a bonding manner, and the lower bonding metals 2271b and 2272b and the upper bonding metals 2371b and 2372b may be formed of aluminum, copper, tungsten, or the like.

Further, the upper bonding metals 2371b and 2372b in the cell region CELL may be referred as first metal pads and the lower bonding metals 2271b and 2272b in the peripheral circuit region PERI may be referred as second metal pads. Further, the first metal pads and the second metal pads may be connected with each other in the bonding manner.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CH may extend in a direction, perpendicular to the upper surface of the second substrate 2310, and pass through the plurality of word lines 2330, the at least one string select line, and the at least one ground select line. The channel structure CH may include a data storage layer, a channel layer, a buried insulating layer, and the like, and the channel layer may be electrically connected to a first metal layer 2350c and a second metal layer 2360c. For example, the first metal layer 2350c may be a bit line contact, and the second metal layer 2360c may be a bit line. In an example embodiment, the bit line 2360c may extend in a first direction (a Y-axis direction), parallel to the upper surface of the second substrate 2310.

In an example embodiment illustrated in FIG. 25, an area in which the channel structure CH, the bit line 2360c, and the like are disposed may be defined as the bit line bonding area BLBA. In the bit line bonding area BLBA, the bit line 2360c may be electrically connected to the circuit elements 2220c providing a page buffer 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A first metal layer 2350b and a second metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

Input-output pads 2205 and 2305 may be disposed in the external pad bonding area PA. Referring to FIG. 25, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 25, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 25, the second input-output contact plug 2303 may be separated from the second substrate 2310 in a direction, parallel to the upper surface of the second substrate 2310, and may pass through the interlayer insulating layer 2315 of the cell region CELL to be connected to the second input-output pad 2305 and the lower bonding metals 2271a and 2272a of the peripheral circuit area PERI.

According to embodiments, the first input-output pad 2205 and the second input-output pad 2305 may be selectively formed. For example, the memory device 2400 may include only the first input-output pad 2205 disposed on the first substrate 2210 or the second input-output pad 2305 disposed on the second substrate 2310. Alternatively, the memory device 2400 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2400 may include a lower metal pattern 2273a, corresponding to an upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371b and 2372b of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In an example embodiment, the memory cell region CELL may include various configurations related with a memory cell such as the memory cell array, the plurality of memory cells, the plurality of cell transistors, the plurality of cell strings, the plurality of memory blocks, the plurality of word lines, etc. as described in above drawings. In an example embodiment, the peripheral circuit region PERI may include various configurations related with driving the memory cells such as the address decoder, the page buffer, the I/O circuit, the control logic circuit, etc. as described in above drawings.

While the inventive concept has been described with reference to exemplary embodiments thereof, it will be apparent to those of ordinary skill in the art that various changes and modifications may be made thereto without departing from the spirit and scope of the inventive concept.

What is claimed is:

1. An operation method of a nonvolatile memory device, the operation method comprising:
   receiving a program command, an address, and a plurality of page data from a memory controller, the address indicating a selected word-line;
   performing a first program operation on an unselected word-line different from the selected word-line, based on one page data of the plurality of page data in response to receiving the program command, the address, and the plurality of page data;
   performing a reading operation to read previous page data from the selected word-line;
   performing a second program operation on the selected word-line, based on the read previous page data and remaining page data of the plurality of page data; and
   performing a recovery operation for recovering the previous page data in response to a failure of the second program operation,
   wherein the first program operation, the second program operation, and the reading operation occur in response to the program command.

2. The operation method of claim 1, wherein the selected word-line and the unselected word-line are adjacent one another.

3. The operation method of claim 1, wherein the selected word-line is a last word-line of a memory block, and the unselected word-line is a first word-line of the memory block.

4. The operation method of claim 1, wherein the second program operation is performed without performing an erase operation on the selected word-line.

5. The operation method of claim 1, wherein selected memory cells connected to the selected word-line have one of an erase state and an unselected program state before performing the second program operation.

6. The operation method of claim 1, wherein the performing of the recovery operation includes:
   performing a cell counting operation on the selected word-line using a reference voltage; and
   recovering the previous page data based on a result of the cell counting operation.

7. The operation method of claim 6, wherein the second program operation is performed using a two step incremental step programming pulse (ISPP) scheme.

8. The operation method of claim 6, wherein the second program operation is performed using a dual pulse incremental step programming pulse (ISPP) scheme.

9. The operation method of claim 1, wherein the previous page data that is read from the selected word-line is stored in data latches.

10. The operation method of claim 9, wherein the performing of the recovery operation includes:
    performing a read operation on the selected word-line using a reference voltage; and
    combining a result of the read operation and data stored in the data latches to recover the previous page data.

11. The operation method of claim 1, the recovered previous page data is transmitted to the memory controller.

12. An operation method of a storage device including a nonvolatile memory device and a memory controller, the operation method comprising:
    transmitting, by the memory controller, a program command, an address, and a plurality of page data to the nonvolatile memory device, the address indicating a selected word-line;

receiving, by the nonvolatile memory device, the program command, the address, and the plurality of page data from the memory controller;

performing, by the nonvolatile memory device, a first program operation on an unselected word-line different from the selected word-line, based on one page data of the plurality of page data in response to receiving the program command, the address, and the plurality of page data;

reading, by the nonvolatile memory device, previous page data from the selected word-line;

transmitting, by the nonvolatile memory device, the read previous page data to the memory controller; and performing, by the nonvolatile memory device, a second program operation on the selected word-line, based on remaining page data of the plurality of page data and the previous page data;

wherein the first program operation, the second program operation, and the reading operation occur in response to the program command.

13. The operation method of claim 12, further comprises:

receiving, by the nonvolatile memory device, a status command from the memory controller after reading the previous page data.

14. The operation method of claim 13, wherein the transmitting of the previous page data is performed in response to the status command.

15. The operation method of claim 12, wherein the previous page data is maintained by the memory controller until the second program operation is completed.

16. The operation method of claim 12, wherein the memory controller releases a buffer memory in which the previous page data and the plurality page data is stored in response to a completion of the second program operation.

17. An operation method of a storage device including a nonvolatile memory device and a memory controller, the operation method comprising:

transmitting, by the memory controller, a first program command, a first address, and a plurality of first page data to the nonvolatile memory device, the first address indicating a first word-line;

performing, by the nonvolatile memory device, a first program operation in response to the first program command;

receiving, by the memory controller, first status information indicating a completion of the first program operation from the nonvolatile memory device;

transmitting, by the memory controller, a second program command, a second address, and a plurality of second page data to the nonvolatile memory device, the second address indicating a second word-line;

performing, by the nonvolatile memory device, a second program operation in response to the second program command;

receiving, by the memory controller, second status information;

maintaining, by the memory controller, the first page data in a buffer memory when the second status information indicates the second program operation failed; and releasing, by the memory controller, the first page data from the buffer memory when the second status information indicates the second program operation succeeded.

18. The operation method of claim 17, wherein the first word-line and the second word-line are adjacent one another.

19. The operation method of claim 17, wherein the performing, by the nonvolatile memory device, of the first program operation comprises:

programming one page data of the plurality of first page data in the second word-line; and programming remaining page of the plurality of second page data in the first word-line.

20. The operation method of claim 19, wherein the performing, by the nonvolatile memory device, of the second program operation comprises:

programming one page data of the plurality of second page data in a third word-line adjacent to the second word-line;

reading the one page data of the plurality of first page data, which is programmed through the first program operation, from the second word-line; and programming remaining page data of the plurality of the second page data and the one page data of the plurality of first page data in the second word-line.

* * * * *